United States Patent
Nakagawa et al.

(10) Patent No.: US 8,422,527 B2
(45) Date of Patent: Apr. 16, 2013

(54) NITRIDE BASED SEMICONDUCTOR DEVICE AND FABRICATION METHOD FOR THE SAME

(75) Inventors: Daisuke Nakagawa, Kyoto (JP);
Yoshinori Tanaka, Kyoto (JP);
Masahiro Murayama, Kyoto (JP);
Takao Fujimori, Kyoto (JP); Shinichi Kohda, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 0 days.

(21) Appl. No.: 13/371,490

(22) Filed: Feb. 13, 2012

(65) Prior Publication Data

US 2012/0140785 A1 Jun. 7, 2012

Related U.S. Application Data

(62) Division of application No. 12/379,945, filed on Mar. 4, 2009, now Pat. No. 8,144,743.

(30) Foreign Application Priority Data

| Mar. 5, 2008 | (JP) | P2008-054830 |
| Apr. 7, 2008 | (JP) | P2008-099150 |
| Apr. 28, 2008 | (JP) | P2008-117178 |
| Apr. 28, 2008 | (JP) | P2008-117182 |
| May 14, 2008 | (JP) | P2008-126955 |
| May 20, 2008 | (JP) | P2008-132396 |
| Sep. 3, 2008 | (JP) | P2008-226007 |

(51) Int. Cl.
*H01S 5/00* (2006.01)

(52) U.S. Cl.
USPC ............................. 372/45.011; 372/43.01

(58) Field of Classification Search ..... 372/43.01–46.01
See application file for complete search history.

(56) References Cited

U.S. PATENT DOCUMENTS

| 6,891,871 B1 | 5/2005 | Nomura et al. |
| 7,397,834 B2 | 7/2008 | Kozaki et al. |

(Continued)

FOREIGN PATENT DOCUMENTS

| JP | 10-284802 | 10/1998 |
| JP | 2000-349397 | 12/2000 |
| JP | 2001-160650 A | 6/2001 |
| JP | 2002-223042 | 8/2002 |
| JP | 2002-335053 | 11/2002 |

(Continued)

OTHER PUBLICATIONS

Foreign Office Action issued on Jul. 31, 2012.

*Primary Examiner* — Jessica Stultz
*Assistant Examiner* — Phillip Nguyen
(74) *Attorney, Agent, or Firm* — Rabin & Berdo, P.C.

(57) ABSTRACT

A nitride based semiconductor device includes: an n-type cladding layer; an n-type GaN based guide layer placed on the n-type cladding layer; an active layer placed on the n-type GaN based guide layer; a p-type GaN based guide layer placed on the active layer; an electron block layer placed on the p-type GaN based guide layer; a stress relaxation layer placed on the electron block layer; and a p-type cladding layer placed on the stress relaxation layer, and the nitride based semiconductor device alleviates the stress occurred under the influence of the electron block layer, does not affect light distribution by the electron block layer, reduces threshold current, can suppress the degradation of reliability, can suppress degradation of the emitting end surface of the laser beam, can improve the far field pattern, and is long lasting, and fabrication method of the device is also provided.

7 Claims, 69 Drawing Sheets

U.S. PATENT DOCUMENTS

| | | |
|---|---|---|
| 2002/0110945 A1 | 8/2002 | Kuramata et al. |
| 2004/0125839 A1 | 7/2004 | Lee et al. |
| 2005/0023541 A1* | 2/2005 | Takeya et al. .................. 257/79 |
| 2005/0170542 A1 | 8/2005 | Matsumura |
| 2008/0081390 A1* | 4/2008 | Gaska et al. .................... 438/37 |
| 2008/0137701 A1 | 6/2008 | Freund |
| 2009/0141765 A1* | 6/2009 | Kohda et al. ............. 372/45.012 |
| 2009/0146160 A1 | 6/2009 | Nakahara |

FOREIGN PATENT DOCUMENTS

| | | |
|---|---|---|
| JP | 2003-124561 | 4/2003 |
| JP | 2004-55719 | 2/2004 |
| JP | 2006-13331 | 1/2006 |
| JP | 2006-128389 | 5/2006 |
| JP | 2006-128622 | 5/2006 |
| WO | WO 2007/063920 A1 | 6/2007 |
| WO | WO-2008/090727 A1 | 7/2008 |

* cited by examiner

| O₂ FLOW (sccm) | WAVELENGTH (nm) | EXTINCTION COEFFICIENT k |
|---|---|---|
| 2 | 405 | 0.114 |
| 3 | 405 | 0.017 |
| 4 | 405 | 0.0026 |
| 5 | 405 | 0.0025 |

| N2 FLOW (sccm) | WAVELENGTH (nm) | EXTINCTION COEFFICIENT k |
|---|---|---|
| 4 | 405 | 0.03 |
| 4.5 | 405 | 0.004 |
| 5 | 405 | 0.009 |
| 5.5 | 405 | 0.011 |
| 6 | 405 | 0.015 |

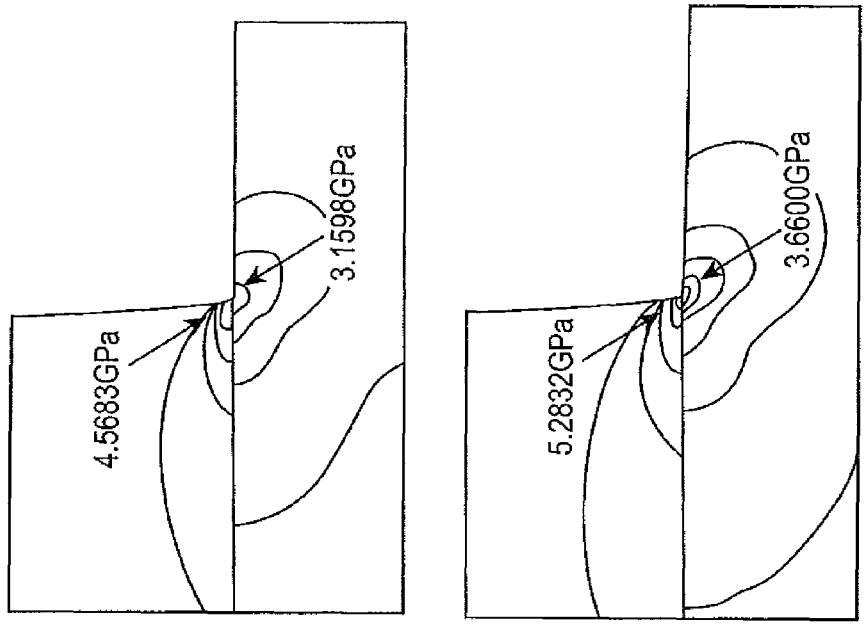
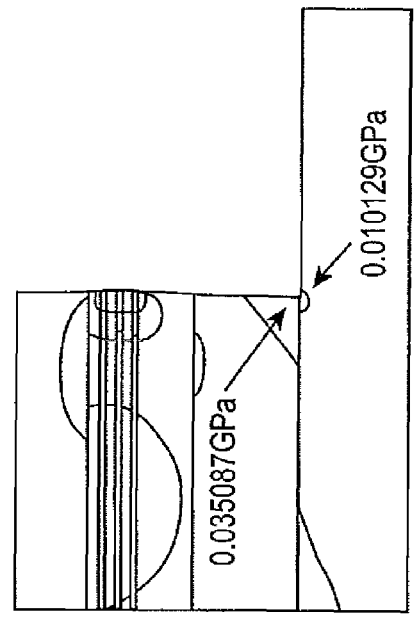
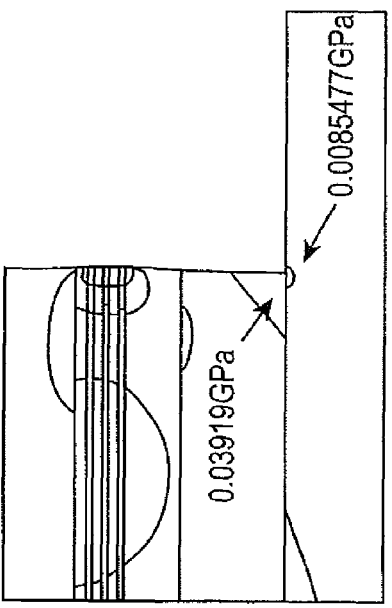

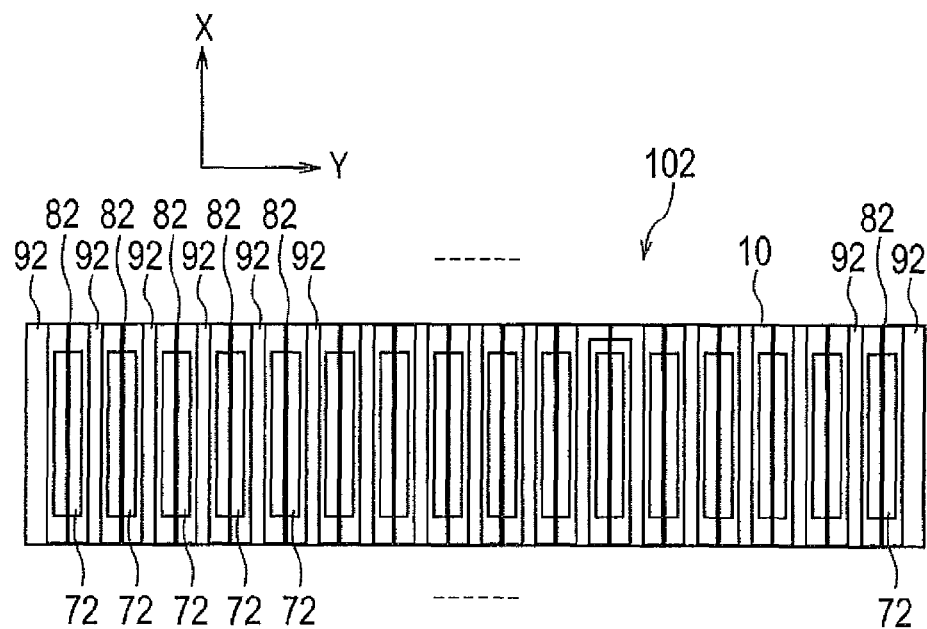
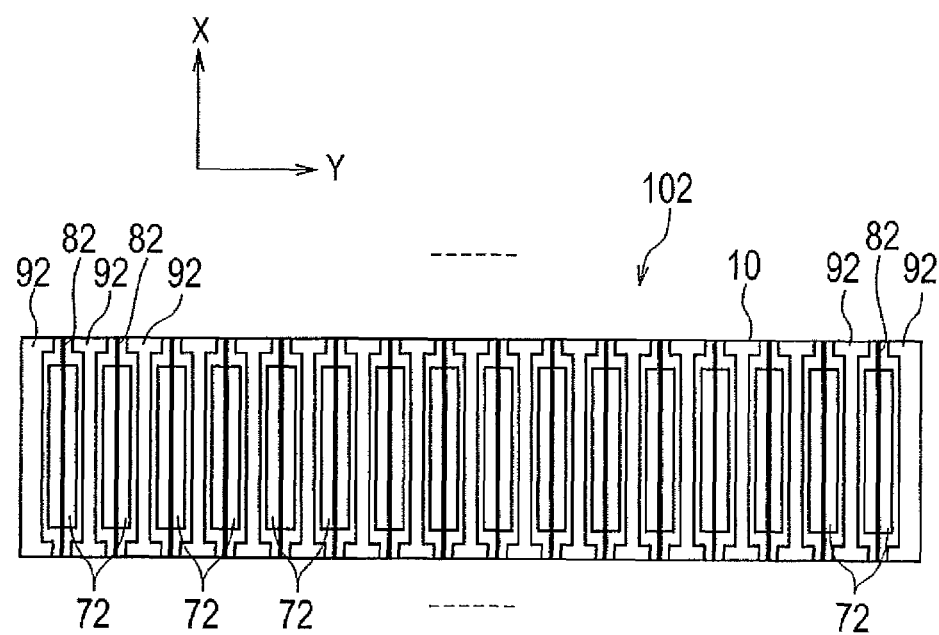

NITRIDE BASED SEMICONDUCTOR DEVICE AND FABRICATION METHOD FOR THE SAME

This is a Divisional of U.S. application Ser. No. 12/379,945, filed on Mar. 4, 2009, now U.S. Pat. No. 8,144,743 and allowed on Nov. 14, 2011, the subject matter of which is incorporated herein by reference.

CROSS REFERENCE TO RELATED APPLICATIONS AND INCORPORATION BY REFERENCE

This application is based upon and claims the benefit of priority from prior Japanese Patent Applications No. P2008-054830 filed on Mar. 5, 2008, No. P2008-099150 filed on Apr. 7, 2008, No. P2008-117178 filed on Apr. 28, 2008, No. P2008-117182 filed on Apr. 28, 2008, No. P2008-126955 filed on May 14, 2008, No. P2008-132396 filed on May 20, 2008, and No. P2008-226007 filed on Sep. 3, 2008, the entire contents of which are incorporated herein by reference.

TECHNICAL FIELD

The present invention relates to a nitride based semiconductor device and a fabrication method for the nitride based semiconductor device. In particular, the present invention relates to a nitride based semiconductor device which alleviates stress, does not affect light distribution, reduces threshold current, can suppress reduction of reliability, can reduce degradation of the emitting end surface of a laser beam, can improve a far field pattern, and is stabilized longer lasting, and a fabrication method for the nitride based semiconductor device.

BACKGROUND ART

A structure of providing an electron block layer in the interface between a p-type GaN based guide layer and a p-type cladding layer, and the structure of providing the electron block layer into the p-type GaN based guide layer on the active layer are disclosed (for example, refer to Patent Literature 1 and Patent Literature 2).

As shown in FIG. 2, a conventional nitride based semiconductor device 260 which has the structure of providing the electron block layer 225 in the interface between a p-type GaN based guide layer and a p-type cladding layer includes: a GaN based semiconductor substrate 210; an n-type cladding layer 214 placed on the GaN based semiconductor substrate 210; an n-type GaN based guide layer 216 placed on the n-type cladding layer 214; an active layer 218 which is placed on the n-type GaN based guide layer 216, and has MQW (Multi-Quantum Well) structure; an electron block layer 225 placed on the active layer 218; a p-type GaN based guide layer 222 placed on the electron block layer 225; a p-type cladding layer 226 placed on the p-type GaN based guide layer 222; and a p-type GaN based contact layer 228 placed on the p-type cladding layer 226.

Moreover, as shown in FIG. 1, a conventional nitride based semiconductor device 260 which has a structure of providing the electron block layer 225 into the p-type GaN based guide layer on an active layer includes: a GaN based semiconductor substrate 210; an n-type cladding layer 214 placed on the GaN based semiconductor substrate 210; an n-type GaN based guide layer 216 placed on the n-type cladding layer 214; an active layer 218 which is placed on the n-type GaN based guide layer 216, and has MQW structure; a p-type GaN based guide layer 222 placed on the active layer 218; an electron block layer 225 placed on the p-type GaN based guide layer 222; a p-type cladding layer 226 placed on the electron block layer 225; and a p-type GaN based contact layer 228 placed on the p-type cladding layer 226.

In the case of the conventional nitride based semiconductor device shown in FIG. 1, the pattern in which the light from the active layer 218 spreads becomes a shape remarkably pushed out to the n-type GaN based guide layer 216 and the n-type cladding layer 214 side under the influence of the electron block layer 225, and becomes a tendency which also increases threshold current. On the other hand, in the case of the conventional nitride based semiconductor device shown in FIG. 2, the influence by which the pattern in which light spreads is remarkably pushed out to the n-type GaN based guide layer 216 and the n-type cladding layer 214 side can be reduced, and the threshold current is also reduced. However, under the influence of the electron block layer 225 with high aluminum (Al) composition, great compressive stress is applied to the p-type GaN based guide layer 222, and the reliability degrades. In the conventional nitride based semiconductor device shown in FIG. 1, since the electron block layer 225 becomes appearance inserted into the p-type GaN based guide layer 222, the stress occurred under the influence of the electron block layer 225 is alleviated.

As shown in FIG. 3, another conventional nitride based semiconductor device 260 which has a structure of providing an electron block layer 225 in the interface between a p-type GaN based guide layer 222 and a p-type cladding layer 226 includes: a GaN based semiconductor substrate 210; an n-type GaN based buffer layer 212 placed on the GaN based semiconductor substrate 210; an n-type cladding layer 214 placed on the n-type GaN based buffer layer 212; an n-type GaN based guide layer 216 placed on the n-type cladding layer 214; an active layer 218 which is placed on the n-type GaN based guide layer 216, and has MQW structure; the p-type GaN based guide layer 222 placed on the active layer 218; the electron block layer 225 placed on the p-type GaN based guide layer 222; the p-type cladding layer 226 placed on the electron block layer 225; and the p-type GaN based contact layer 228 placed on the p-type cladding layer 226.

In the conventional nitride based semiconductor device 260 shown in FIG. 3, under the influence of the electron block layer 225 with high aluminum (Al) composition, as shown in FIG. 4, the band gap of the electron block layer 225 which has the width L4 becomes large, great compressive stress is added to the p-type GaN based guide layer 222 which has the width L1, and the reliability degrades.

The stress by lattice mismatching is occurred in the interface T1 between the electron block layer 225 and the p-type GaN based guide layer 222 which are composed of this p-type AlGaN layer, and the interface T2 between the electron block layer 225 and the p-type cladding layer 226. At the time of this stress as a trigger, there was a problem that the defect occurred in the drive of the nitride based semiconductor device 260, and the reliability of the nitride based semiconductor device 260 is degraded.

On the other hand, in the nitride based semiconductor device, when the laser oscillation state is continued, oxidation of the emitting end surface of a laser beam advances, and the emitting end surface of the laser beam deteriorates. When the oxidation of the emitting end surface of the laser beam progresses, an element characteristic deteriorates like the rise of laser driving current, or the decline in slope efficiency.

An example of the optical film applicable to the nitride based semiconductor device etc. which does not deteriorate easily and also does not exfoliate easily is already disclosed (for example, refer to Patent Literature 3). In a GaN based semiconductor element of Patent Literature 3, it has an optical film formed in a resonator surface by sputtering of the Al target on the sputtering conditions of a quick deposition rate in atmosphere including Ar gas and oxygen gas using an ECR plasma method.

About a technology of preventing exfoliation of an ohmic electrode formed in a ridge structure of a compound semiconductor laser structure of having the ridge structure, it is already disclosed (for example, refer to Patent Literatures 4 to 6). In Patent Literatures 1 to 3, in the structure composed of an insulating layer formed in the sidewall part of the ridge structure, and an ohmic electrode formed on the insulating layer, in order to prevent exfoliation of the ohmic electrode, the exfoliation prevention layer composed of metal layers is provided between the insulating layer and the ohmic electrode, respectively.

In the compound semiconductor laser structure, a optical confinement effect is obtained by forming the insulating film on the compound semiconductor layer of ridge shape, and providing refractive index difference for a compound semiconductor layer.

However, when forming the insulating film on the ridge shape and the film deposition apparatus having film formation characteristics with directivity is used, there was a fault that covering to the ridge sidewall is insufficient and then the insulating film exfoliates. As an example of a film deposition apparatus having the film formation characteristics with directivity, an ECR (Electron Cyclotron Resonance) sputter device is mentioned.

Conventionally, since the reactive plasma film deposition apparatus having the directivity is used and therefore the reactivity is scarce in the sidewall part of the ridge, the membranous quality of the insulating film formed is wrong (for example, in $ZrO_2$, the quantity of Zr and O shifts from stoichiometric composition), and the exfoliation of the insulating film of the sidewall part occurs because of this.

If the insulating film exfoliates, it will be linked to the defect of the laser initial characteristic that the balance which optical confinement collapses and the shape of beam collapses.

For example, as shown in FIG. 5, a schematic section structure of the ridge part of the nitride based semiconductor device according to a conventional example includes: a p-type GaN guide layer 222; a p-type superlattice cladding layer 226 placed on the p-type GaN guide layer 222; a p-type GaN contact layer 228 placed on the p-type superlattice cladding layer 226; an insulating film 224 formed on the p-type GaN guide layer 222 and on the sidewall of the p-type superlattice cladding layer 226 and the p-type GaN contact layer 228; and a p-side ohmic electrode 230 formed on the insulating film 224 and the p-type GaN contact layer 228. As the SEM photograph of the ridge part of the nitride based semiconductor device according to the conventional example is shown in FIG. 6, for example, covering to the ridge sidewall is insufficient, and the thing in which the insulating film 224 is exfoliated is observed. The relation between the beam intensity of the nitride based semiconductor device according to the conventional example and the horizontal and vertical beam spreading angle is expressed, for example, as shown in FIG. 7. In particular, the symmetry of a horizontal FFP (Far Field Pattern) is wrong.

Furthermore, a group III nitride semiconductor is a semiconductor using nitrogen as a group V element in a group III-V semiconductor, and aluminum nitride (AlN), gallium nitride (GaN), and indium nitride (InN) are representative cases. Generally, it can express $Al_xIn_yGa_{1-x-y}N$ (where $0<=x<=1$, $0<=y<=1$, $0<=x+y<=1$), and is called an indium nitride based semiconductor or a GaN based semiconductor.

A fabrication method of the nitride based semiconductor for growing up the group III nitride semiconductor on the GaN based semiconductor substrate which applies c plane the principal surface by MOCVD (Metal-Organic Chemical Vapor Deposition) is known. By applying this method, the GaN based semiconductor laminated structure, which has an n-type layer and a p-type layer can be formed, and the light-emitting device using this layered structure can be fabricated.

The laser light source of a purple-blue wavelength of being blue and green are increasingly utilized in the field, such the high density recording to the optical disc represented by DVD, image processing, a medical device, measurement hardware, etc. Such a short wavelength laser light source is composed of a laser diode, which used the GaN based semiconductor, for example.

The GaN based semiconductor element grows up the group III nitride semiconductor on the GaN based semiconductor substrate, which applies c plane the principal surface by the MOCVD method, and is fabricated. More specifically, as for the conventional nitride based semiconductor device, for example, an n-type cladding layer composed of an AlGaN single film or an AlGaN/GaN superlattice structure, an n-type guide layer composed of InGaN (or GaN), an active layer composed of InGaN (luminous layer), a p type guide layer composed of InGaN (or GaN), an electron block layer composed of AlGaN, an AlGaN single film or a p-type cladding layer composed of superlattice structure of AlGaN/GaN, a p-type contact layer composed of an AlInGaN layer etc. grow sequentially by the MOCVD method on the nitride semiconductor substrate, and the semiconductor laminated structure composed of these semiconductor layers is formed. In the active layer, light-emitting occurs by the recombination of the electron injected from the n-type layer and the hole injected from the p-type layer. The light is confined between the n-type AlGaN cladding layer and the p-type AlGaN cladding layer, and is spread in the direction vertical to the laminating direction of laminated semiconductor structure. A resonator edge face is formed in the both terminals of the propagating direction, resonance amplification of the light is performed repeating stimulated emission between the resonator edge faces of this pair, and a part of this is emitted from the resonator edge face as a laser beam (for example, refer to Patent Literature 7, Non Patent Literature 1, and Non Patent Literature 2).

As an active layer, the MQW structure which inserted a plurality of layers into the shape of sandwiches for the well layer by the barrier layer with a greater band gap than the well layer is adoptable (for example, refer to Patent Literature 8).

Generally, since InGaN, GaN, and AlGaN differ in a lattice constant, stress occurs by laminating each layer.

In the nitride based semiconductor device, AlGaN is used as a cladding layer, and also the p-type AlGaN layer of high Al composition is used in order to block the electron from the n-layer. The stress by lattice mismatching occurs on the interface between this AlGaN layer and the GaN layer. As a result, the stress concentrated on the step corner of the stripe for current concentration and optical confinement of the nitride based semiconductor device occurs.

In particular, it is considered that great stress occurs in the region to which the stripe side and the etched bottom crosses (step corner of the stripe) since the stripe region has convex structure for the other region. At the time of this stress as a trigger, a defect occurs in an element drive and the reliability of the element is degraded.

Generally, since InGaN, GaN, and AlGaN differ in a lattice constant, stress occurs by laminating each layer. As a result, curvature occurs in the nitride based semiconductor device. The more the thickness of the nitride semiconductor substrate becomes thin, the more this curvature appears remarkably. If the curvature is large, a crack becomes easy to occur and becomes a cause of yield rate reduction.

When fabricating the nitride based semiconductor device, by applying element size small, a number of getting per wafer can be increased and the cost can be reduced. Since a cleaved surface is used as a resonator mirror when fabricating the nitride based semiconductor device, it is necessary to form a clear cleaved surface. When fabricating the nitride based semiconductor device with a small chip size, in order to obtain a clear cleaved surface, it is necessary to apply substrate thickness thin. However, if substrate thickness is applied thin, the curvature of the substrate appears remarkably as mentioned above.

CITATION LIST

Patent Literature 1: Japanese Patent Application Laying-Open Publication No. 2002-223042
Patent Literature 2: Japanese Patent Application Laying-Open Publication No. 2000-349397
Patent Literature 3: Japanese Patent Application Laying-Open Publication No. 2003-124561
Patent Literature 4: Japanese Patent Application Laying-Open Publication No. 2006-13331
Patent Literature 5: Japanese Patent Application Laying-Open Publication No. 2006-128389
Patent Literature 6: Japanese Patent Application Laying-Open Publication No. 2006-128622
Patent Literature 7: Japanese Patent Application Laying-Open Publication No. H10-284802
Patent Literature 8: Japanese Patent Application Laying-Open Publication No. 2004-55719
Non Patent Literature 1: T. Takeuchi et. al. Japanese. Journal of Applied Physics Vol. 39, 2000, p. 413-416
Non Patent Literature 2: A. Chakraborty et. al. Japanese. Journal of Applied Physics Vol. 44, 2005, L173

SUMMARY OF THE INVENTION

Technical Problem

In the structure composed of the n-type cladding layer 214, the n-type GaN based guide layer 216, the active layer 218, the p-type GaN based guide layer 222, the electron block layer 225, and the p-type cladding layer 226 placed on the electron block layer 225, the present inventors traced that it is the cause by which that the stress concentrates on the interface T1 degrades the reliability when having laminated in sequence of the electron block layer 225 and the p-type cladding layer 226, since the interface T1 becomes GaN/AlGaN among the interface T1 between the electron block layer 225 and the p-type guide layer 222, and the interface T2 between the electron block layer 225 and the p-type cladding layer 226.

Moreover, one person of the present inventors found out that it can capture the oxygen which contributes to end face oxidation, and can suppress the end face oxidation, and life-span can be extended by placing the scarce film of a membranous quality which had absorption (metallic film with many element deficits) in the laser end face. That is, the aforementioned inventor found out that it can suppress the degradation of the emitting end surface of the laser beam and the life-span can be extended by measuring the relation between the oxygen ($O_2$) flow rate at the time of film formation of the optical film placed to the emitting end surface of a laser beam and an extinction coefficient, and placing the oxygen absorption layer which has a predetermined extinction coefficient value to the emitting end surface of the laser beam. Furthermore, the aforementioned inventor found out that it can suppress the degradation of the emitting end surface of the laser beam and that life-span can be extended by measuring the relation between the nitrogen ($N_2$) flow rate at the time of film formation of the optical film placed to the emitting end surface of the laser beam and an extinction coefficient, and placing the oxygen absorption layer which has a predetermined extinction coefficient value to the emitting end surface of the laser beam.

Moreover, one person of the present inventors found out that it is effective to provide an step of the stripe shape of the width wider than a height of stripe shape including this region other than the height of stripe shape, as an object of alleviating the stress concentrated on step corner of the stripe for current concentration and optical confinement. That is, the aforementioned inventor found out that the stress concentrated on the step corner of the stripe of the nitride based semiconductor device can be alleviated by fabricating in parallel the part which removes the GaN based semiconductor layer including Al for a resonator on the chip.

Moreover, one person of the present inventors found out that the stress of the nitride based semiconductor device can be alleviated and the curvature can be alleviated by fabricating in parallel the part which removes the GaN based semiconductor layer including Al for the resonator on the chip.

An object of the present invention is to provide a nitride based semiconductor device which alleviates the stress occurred under the influence of the electron block layer, does not affect light distribution by the electron block layer, reduces threshold current, can suppress the degradation of reliability, can suppress degradation of the emitting end surface of the laser beam, and is long lasting.

An object of the present invention is to provide a nitride based semiconductor device, which alleviated the stress concentrated on the step corner of the laser stripe for current concentration and optical confinement and whose reliability of the element improves.

An object of the present invention is to provide a nitride based semiconductor device, which alleviates the curvature by the stress of the nitride based semiconductor device and whose yield improves.

An object of the present invention is to provide a nitride based semiconductor device which prevented the exfoliation of the insulating film of the ridge sidewall part, and improves the far field pattern, and a fabrication method for the nitride based semiconductor device.

Solution to Problem

According to an aspect of the present invention, in order to achieve the above objects, a nitride based semiconductor device comprises: an n-type cladding layer; an n-type GaN based guide layer placed on the n-type cladding layer; an active layer placed on the n-type GaN based guide layer; a p-type GaN based guide layer placed on the active layer; an electron block layer placed on the p-type GaN based guide layer; a stress relaxation layer placed on the electron block layer; and a p-type cladding layer placed on the stress relaxation layer.

According to another aspect of the present invention, a nitride based semiconductor device comprises: an n-type cladding layer; an n-type $Al_xIn_yGa_{1-X-Y}N$ (where $0<=X$, $0<=Y$, $X+Y<=1$) guide layer placed on the n-type cladding layer; an active layer placed on the n-type $Al_XIn_YGa_{1-X-Y}N$ (where $0<=X$, $0<=Y$, $X+Y<=1$) guide layer; a p-type guide layer placed on the active layer; a first p-type cladding layer placed on the p-type guide layer; an electron block layer placed on the first p-type cladding layer; and a second p-type cladding layer placed on the electron block layer.

According to another aspect of the present invention, a nitride based semiconductor device comprises: a GaN based semiconductor substrate; an n-type semiconductor layer and a p-type semiconductor layer which are placed on the GaN based semiconductor substrate; an active layer which is placed between the n-type semiconductor layer and the p-type semiconductor layer, and includes In; and an oxygen absorption layer which is placed on the emitting end surface of a laser beam, and adjusts an extinction coefficient in a wavelength of 405 nm to 0.2 to 0.002.

According to another aspect of the present invention, a nitride based semiconductor device comprises: a GaN based semiconductor substrate; an n-type semiconductor layer and a p-type semiconductor layer which are placed on the GaN based semiconductor substrate; an active layer which is placed between the n-type semiconductor layer and the p-type semiconductor layer, and includes In; an oxygen absorption layer which is placed on the emitting end surface of a laser beam, and adjusts an extinction coefficient in a wavelength of 405 nm to 0.2 to 0.0004; and a coating film without consideration for optical absorption placed on the oxygen absorption layer.

According to another aspect of the present invention, a nitride based semiconductor device comprises: a GaN based semiconductor substrate; an n-type semiconductor layer placed on the GaN based semiconductor substrate; an active layer including In placed on the n-type semiconductor layer; a p-type semiconductor layer placed on the active layer; a compound semiconductor layer which is placed on the p-type semiconductor layer, and includes ridge shape; an adhesion layer placed on a sidewall of the ridge shape of the compound semiconductor layer; and an insulating film placed on the adhesion layer.

According to another aspect of the present invention, a nitride based semiconductor device comprises: a GaN based semiconductor substrate; an n-type GaN based cladding layer which is placed on the GaN based semiconductor substrate, and by which an n-type impurity is doped; an n-type GaN based guide layer which is placed on the GaN based cladding layer, and by which an n-type impurity is doped, and in which a band gap is smaller than the n-type GaN based cladding layer; an active layer placed on the n-type GaN based guide layer; a p-type GaN based guide layer which is placed on the active layer and by which a p-type impurity is doped; an electron block layer placed on the p-type GaN based guide layer; a p-type GaN based cladding layer which is placed on the electron block layer, and by which a p-type impurity is doped; a first step region which removes all or a part of the p-type GaN based cladding layer, and forms a laser stripe on the p-type GaN based guide layer; and a second step region which is formed by removing the n-type GaN based guide layer in an extension direction and parallel direction of the laser stripe, wherein a current concentration structure is formed by the first step region, and a laser cavity is formed by mostly centering on the active layer by a part of the second step region.

According to another aspect of the present invention, a nitride based semiconductor device comprises: a GaN based semiconductor substrate; an n-type GaN based cladding layer which is placed on the GaN based semiconductor substrate, and by which a n-type impurity is doped, and which includes Al; an n-type GaN based guide layer which is placed on the GaN based cladding layer, and by which a n-type impurity is doped, and in which a band gap is smaller than the n-type GaN based cladding layer; an active layer placed on the n-type GaN based guide layer; a p-type GaN based guide layer which is placed on the active layer and by which a p-type impurity is doped; an electron block layer placed on the p-type GaN based guide layer; a stress relaxation layer placed on the electron block layer; and a p-type GaN based cladding layer which is placed on the stress relaxation layer, and by which a p-type impurity is doped, wherein all or a part of the p-type GaN based cladding layer composes a laser cavity by mostly centering on the active layer by being placed on the p-type guide layer at stripe shape and becoming current concentration structure, and a region which removes the n-type GaN based cladding layer exists in an extension direction and parallel direction of the laser cavity.

Advantageous Effects of Invention

According to the present invention, the nitride based semiconductor device which alleviates the stress occurred under the influence of the electron block layer, does not affect the light distribution by the electron block layer, degrades the threshold current, and can suppress the degradation of reliability can be provided.

According to the present invention, the nitride based semiconductor device which suppresses the end face oxidation by placing the film of oxygen uptake nature to the emitting end surface of the laser beam, can reduce the degradation of the laser characteristic, and is stabilized long lasting can be provided.

According to the present invention, the nitride based semiconductor device which captures the oxygen which contributes to the end face oxidation, and suppresses the end face oxidation can be provided by placing the scarce film of the membranous quality having absorption (metallic film with many oxygen deficiencies) in the laser end surface.

According to the present invention, the nitride based semiconductor device which alleviates the stress concentrated on the step corner of the laser stripe for current concentration and optical confinement and whose reliability of the element improves can be provided by applying the step of stripe shape into two steps.

According to the present invention, the nitride based semiconductor device, which alleviates the curvature by the stress of the nitride based semiconductor device and whose yield improves can be provided.

According to the present invention, the nitride based semiconductor device, which prevents the exfoliation of the insulating film of the ridge sidewall part, and improves the far field pattern, and the fabrication method for the nitride based semiconductor device can be provided.

BRIEF DESCRIPTION OF DRAWINGS

FIG. 50A shows an analysis result of the stress concentrated on the step corner of the second step region of the stripe for current concentration and optical confinement (in the case of corresponding to FIG. 44), in the nitride based semiconductor device according to the sixth embodiment of the present invention.

FIG. 50B shows an analysis result of the stress concentrated on the step corner of the second step region of the stripe for current concentration and optical confinement (in the case of corresponding to FIG. 45), in the nitride based semiconductor device according to the sixth embodiment of the present invention.

FIG. 50C shows an analysis result of the stress concentrated on the step corner of the second step region of the stripe for current concentration and optical confinement (in the case of corresponding to FIG. 46), in the nitride based semiconductor device according to the sixth embodiment of the present invention.

FIG. 50D shows an analysis result of the stress concentrated on the step corner of the second step region of the stripe for current concentration and optical confinement (in the case of corresponding to FIG. 47), in the nitride based semiconductor device according to the sixth embodiment of the present invention.

FIG. 78A shows a plane pattern configuration example of an LD bar of the nitride based semiconductor device according to the seventh embodiment of the present invention.

FIG. 78B shows a plane pattern configuration example of another LD bar of the nitride based semiconductor device according to the seventh embodiment of the present invention.

DESCRIPTION OF EMBODIMENTS

Figure 1:
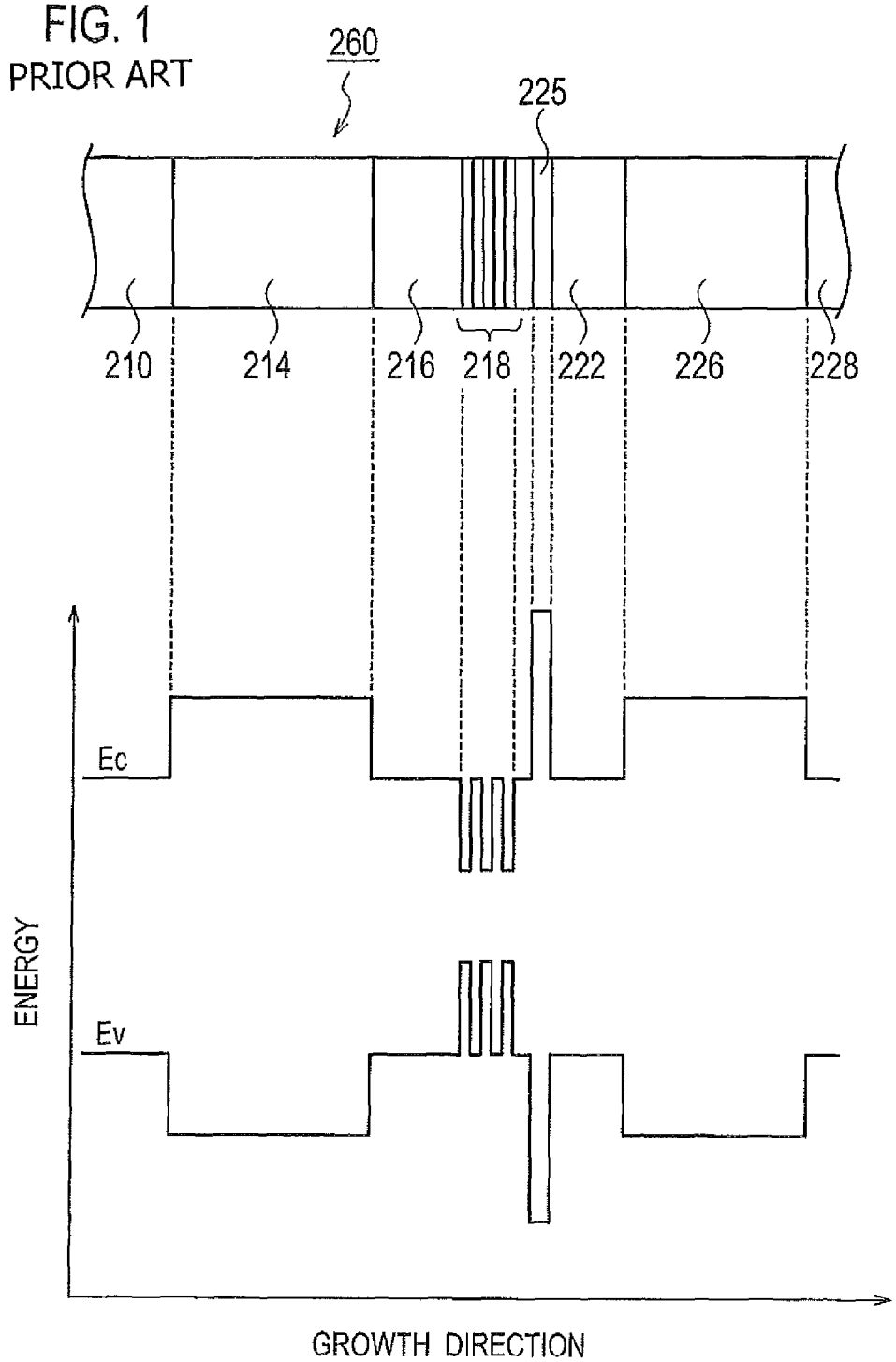
FIG. 1 is an energy band structure chart corresponding to a conventional nitride based semiconductor device.

Various embodiments of the present invention will be described with reference to the accompanying drawings. There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment

Figure 8:
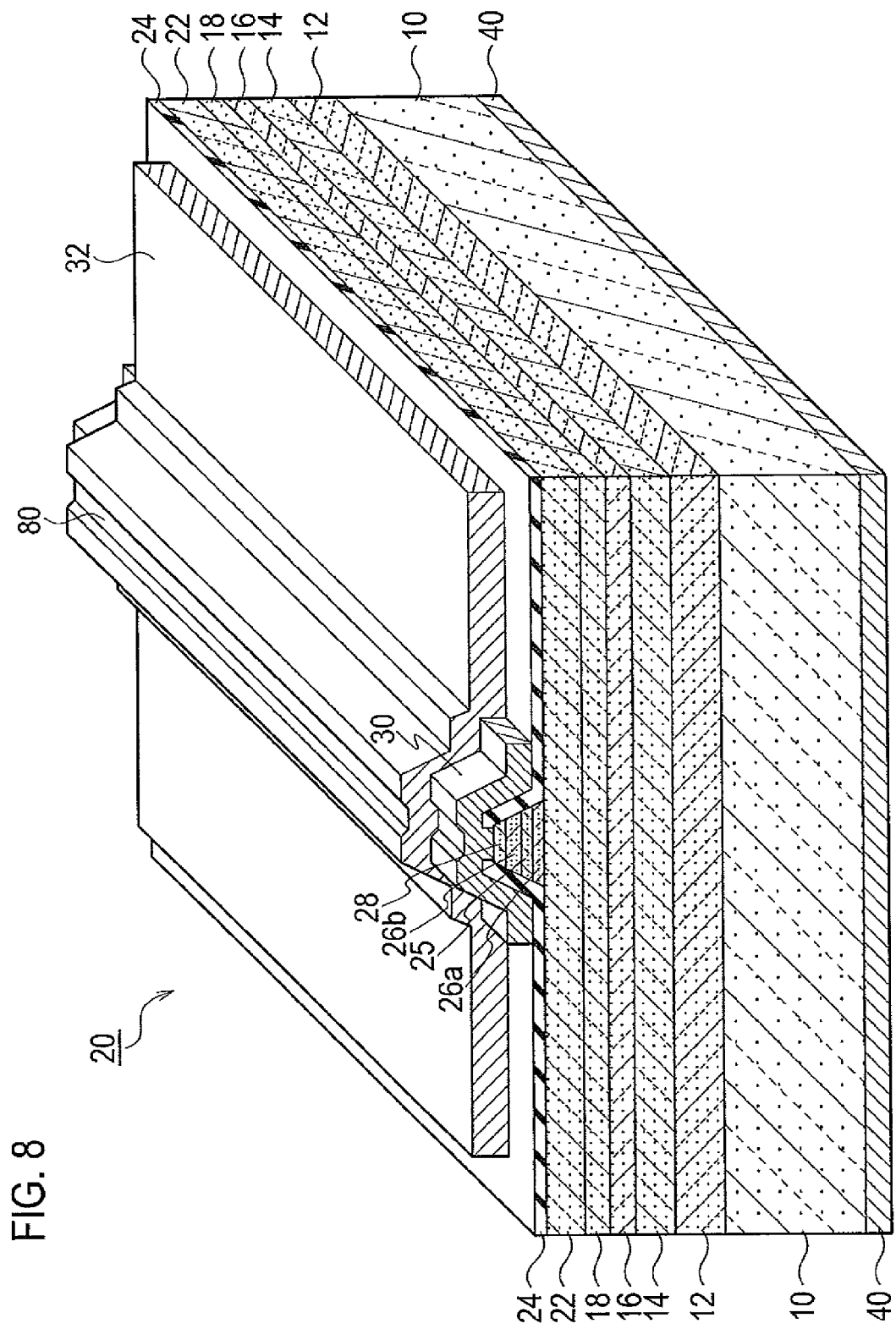
FIG. 8 is a schematic bird's-eye view of a nitride based semiconductor device according to a first embodiment of the present invention.

As schematically shown in the bird's-eye view of FIG. 8, a nitride based semiconductor device 20 according to a first embodiment of the present invention includes: a GaN based semiconductor substrate 10; an n-type GaN based buffer layer 12 placed on the GaN based semiconductor substrate 10; an n-type cladding layer 14 placed on the n-type GaN based buffer layer 12; an n-type GaN based guide layer 16 placed on the n-type cladding layer 14; an active layer 18 placed on the n-type GaN based guide layer 16; and a p-type GaN based guide layer 22 placed on the active layer 18. The n-type GaN based guide layer 16 is expressed by an n-type $Al_XIn_YGa_{1-X-Y}N$ (where $0<=X$, $0<=Y$, and $X+Y<=1$) layer.

Furthermore, the nitride based semiconductor device 20 according to the first embodiment includes: a first p-type cladding layer 26a placed at stripe shape on the p-type GaN based guide layer 22; an electron block layer 25 placed on the first p-type cladding layer 26a; a second p-type cladding layer 26b placed on the electron block layer 25; and a p-type GaN based contact layer 28 placed on the second p-type cladding layer 26b.

The nitride based semiconductor device 20 according to the first embodiment includes an insulating film 24 placed on the p type GaN based guide layer 22, and placed on the sidewall of the first p-type cladding layer 26a, the electron block layer 25, the second p-type cladding layer 26b, and the p-type GaN based contact layer 28. On the top surface of the p-type GaN based contact layer 28 placed at stripe shape, window opening of the insulating film 24 is performed. In this apertural area by which the window opening is performed, the p-type GaN based contact layer 28 contacts a p-side ohmic electrode 30.

Furthermore, in the nitride based semiconductor device 20 according to the first embodiment, the p-side ohmic electrode 30 covers the sidewall part of the p-type cladding layer 26a placed at stripe shape, the electron block layer 25, the p-type cladding layer 26b, and the p-type GaN based contact layer 28 via the insulating film 24, and is placed along with a laser stripe 80 at stripe shape.

Furthermore, in the nitride based semiconductor device 20 according to the first embodiment, a p-side electrode 32 is placed on the p-side ohmic electrode 30 placed at stripe shape on the insulating film 24 and along with the laser stripe 80, and an n-side electrode 40 is placed on the GaN based semiconductor substrate 10 at the side of the back side which opposes the surface where the p-side electrode 32 is placed.

The active layer 18 is composed of MQW structure of an $In_XGa_{1-X}N$ layer as a barrier layer, and an $In_YGa_{1-Y}N$ layer (where $0<=X<=1$, $0<=Y<=1$, and $X \neq Y$) as a well layer. When raising the confinement effect of a carrier, it is effective that the number of pairs of the MQW structure, which composes the active layer 18 is not more than three.

All or a part of the second p-type cladding layer 26b may be placed on the p-type GaN based guide layer 22 at stripe shape.

The first p-type cladding layer 26a and the second p-type cladding layer 26b may compose $Al_XGa_{1-X}N$ and $Al_YGa_{1-Y}N$ (where $0<=X<=1$, and $0<=Y<=1$), respectively. In this case, it may be $X=Y$.

The insulating film 24 is formed by $ZrO_2$, for example. Moreover, the p-side ohmic electrode is formed by Pd/Au, for example. The n-side electrode 40 is formed by Al/Ti/Au, for example.

Moreover, the first p-type cladding layer 26a and the second p-type cladding layer 26b may be provided with superlattice structure.

Figure 9:
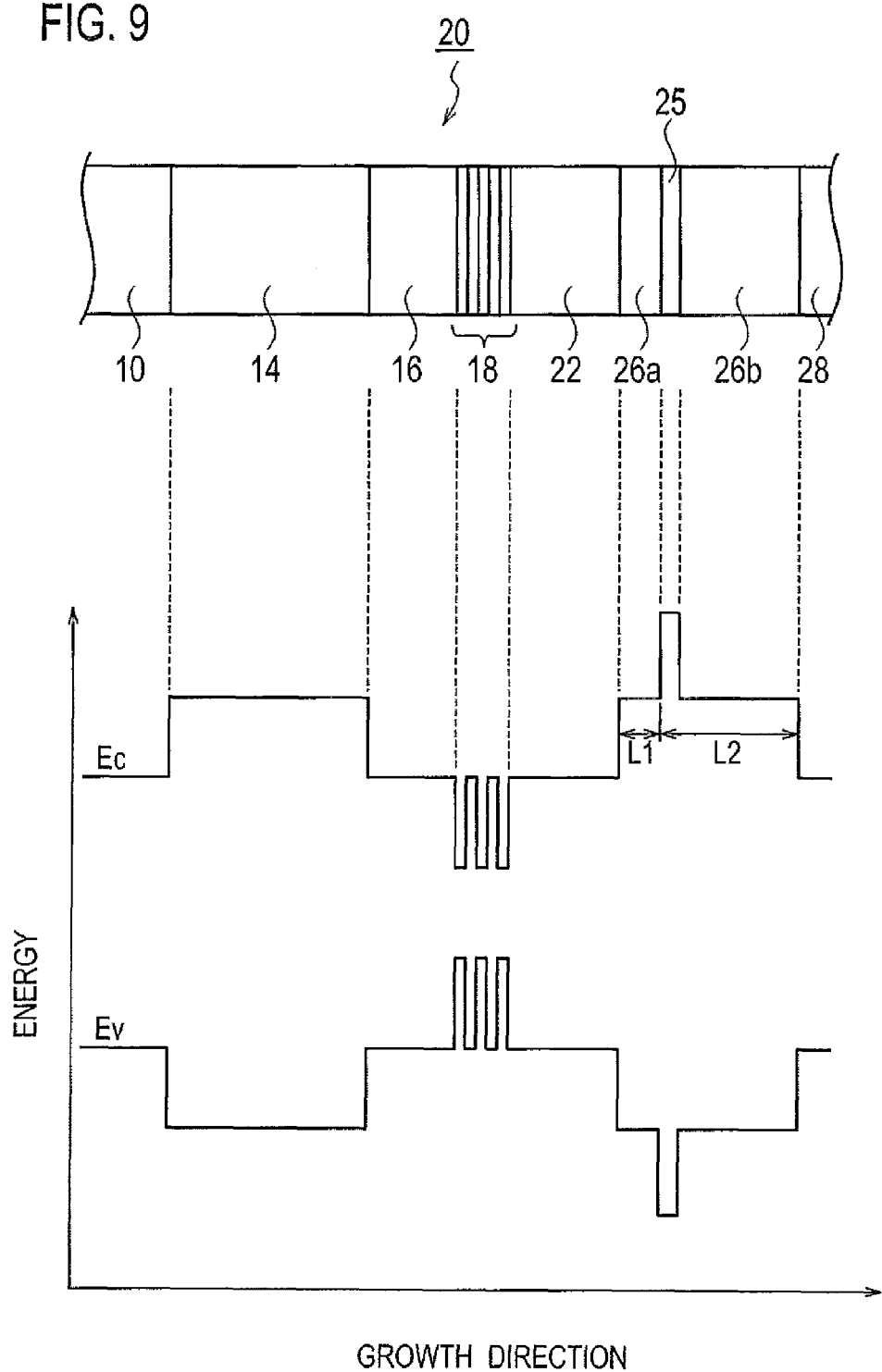
FIG. 9 is an energy band structure chart corresponding to the nitride based semiconductor device shown in FIG. 8.

The energy band structure corresponding to the structure of the nitride based semiconductor device 20 including the n-type GaN based semiconductor substrate 10, the n-type cladding layer 14 placed on the n-type GaN based semiconductor substrate 10, the n-type GaN based guide layer 16 placed on the n-type cladding layer 14, the active layer 18 placed at the n-type GaN based guide layer 16, the p-type GaN based guide layer 22 placed on the active layer 18, the first p-type cladding layer 26a placed on the p-type GaN based guide layer 22, the electron block layer 25 placed on the first p-type cladding layer 26a, and the second p-type cladding layer 26b placed on the electron block layer 25 is expressed as shown in FIG. 9.

In FIG. 9, the width L1 of the first p-type cladding layer 26a is about 50 nm, and the width L2 of the second p-type cladding layer 26b is about 400 nm. The width of the electron block layer 25 is about 10 nm. When raising the electron confinement efficiency, it is effective that the relation between the width L1 of the first p-type cladding layer 26a and the width L2 of the second p-type cladding layer 26b is L1<L2.

As for the composition ratio Z of $Ga_{1-Z}Al_ZN$ ($0<z<1$) which composes the electron block layer 25, the relationship of X, Y<Z is satisfied compared with the composition ratios X and Y of $Al_XGa_{1-X}N$ and $Al_YGa_{1-Y}N$ (where $0<=X<=1$, and $0<=Y<=1$) which compose the first p-type cladding layer 26a and the second p-type cladding layer 26b. Accordingly, the band gap energy of the electron block layer 25 can be set up more greatly than the band gap energy of the first p-type cladding layer 26a and the second p-type cladding layer 26b.

The compressive stress by the electron block layer 25 which is composed of $Ga_{1-Z}Al_ZN$ (where $0<z<1$) can be distributed to the first p-type cladding layer 26a and the second p-type cladding layer 26b which are placed at the upper and lower sides of the electron block layer 25, and the compressive stress can be alleviated, by forming the electron block layer 25 between the first p-type cladding layer 26a and the second p-type cladding layer 26b which are placed at the outside of the p-type GaN based guide layer 22.

The pattern of a laser beam occurred in the active layer 18 is not affected by forming the electron block layer 25 between the first p-type cladding layer 26a and the second p-type cladding layer 26b which are placed at the outside of the p-type GaN based guide layer 22.

Figure 10:
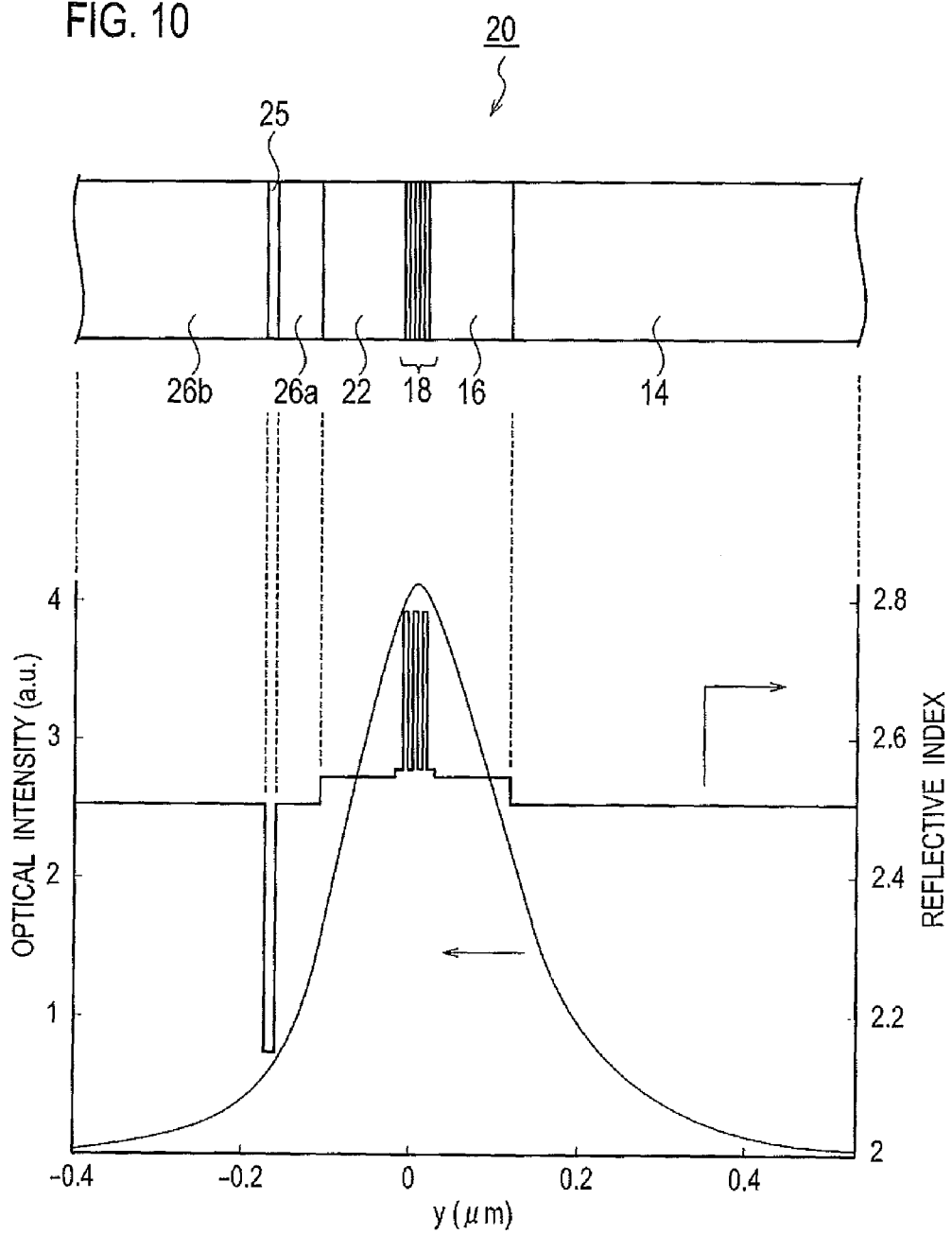
FIG. 10 shows a refractive index profile and a light intensity profile corresponding to the nitride based semiconductor device corresponding to FIG. 8.

The refractive index profile and the light intensity profile corresponding to structure of the nitride based semiconductor device 20 including the n-type cladding layer 14, the n-type GaN based guide layer 16 placed on the n-type cladding layer 14, the active layer 18 placed on the n-type GaN based guide layer 16, the p-type GaN based guide layer 22 placed on the active layer 18, the first p-type cladding layer 26a placed on the p-type GaN based guide layer 22, the electron block layer 25 placed on the first p-type cladding layer 26a, and the second p-type cladding layer 26b placed on the electron block layer 25 are expressed as shown in FIG. 10.

By forming the electron block layer 25 between the first p-type cladding layer 26a and the second p-type cladding layer 26b which are placed at the outside of the p-type GaN based guide layer 22, it proves not affecting the pattern of a laser beam generated in the active layer 18.

Figure 2:
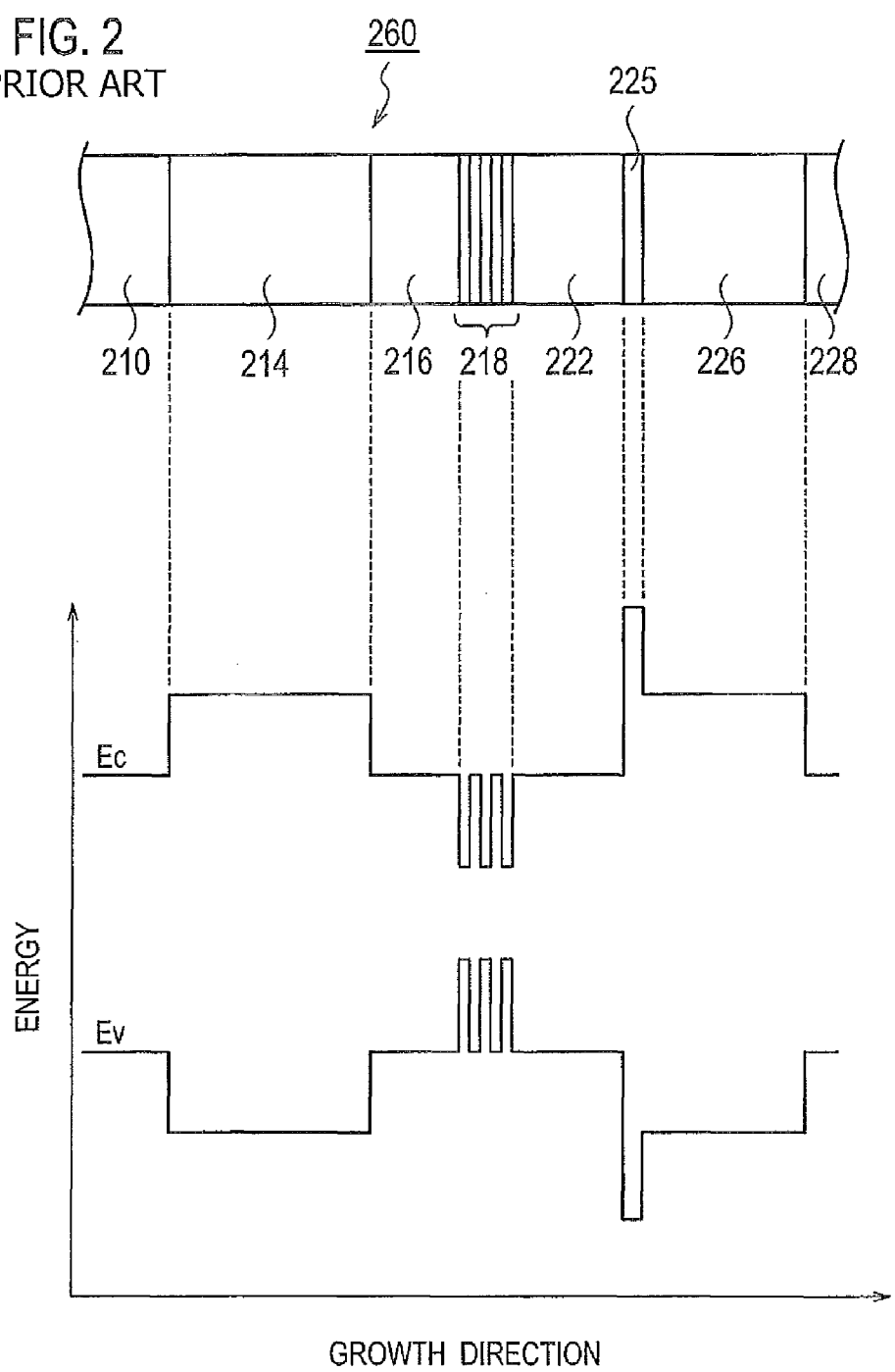
FIG. 2 is an energy band structure chart corresponding to another conventional nitride based semiconductor device.
Figure 11:
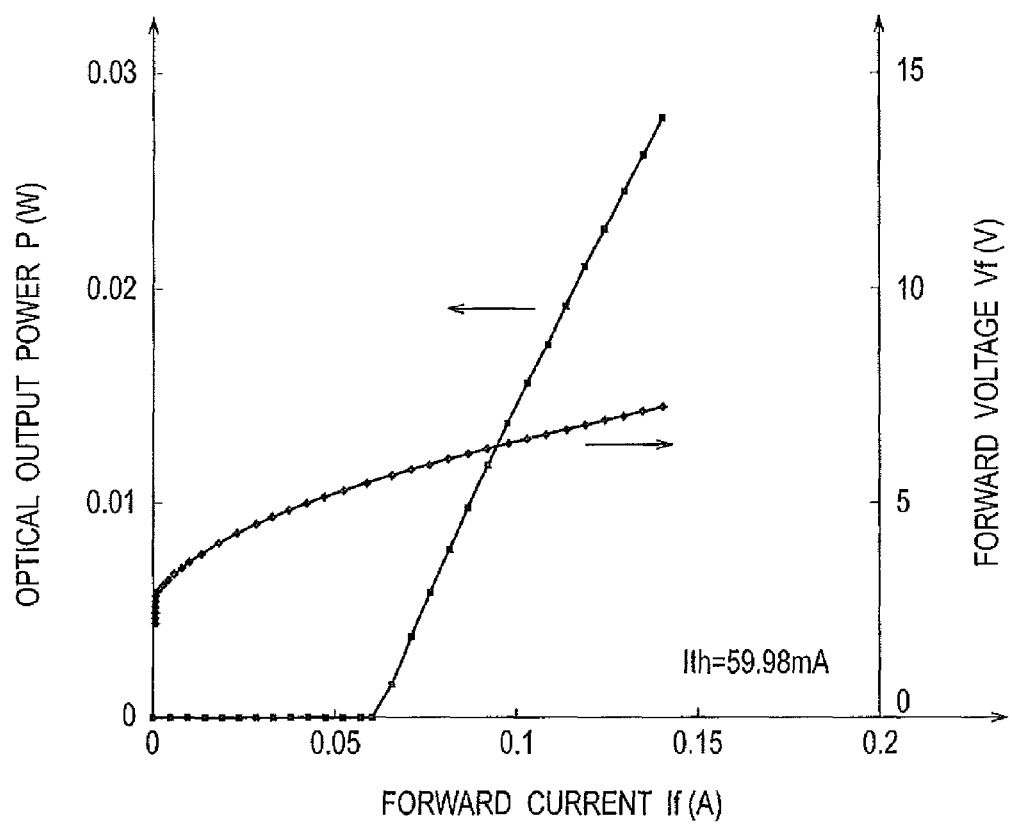
FIG. 11 shows a simulation result of the relation between optical power P (W), forward voltage Vf (V) and a forward current If (A) of the nitride based semiconductor device according to the first embodiment of the present invention.

A simulation result of the relation between the optical power P (W) of the nitride based semiconductor device 20 and the forward voltage Vf (V) and the forward current If (A) according to the first embodiment is expressed as shown in FIG. 11. As for the value of the threshold value current based on the result of FIG. 11, about 59.98 mA is obtained, and in the case of the conventional nitride based semiconductor device shown in FIG. 1 and FIG. 2, the value of the threshold value current is about 65.19 mA and about 60.01 mA, for example, and is reduced compared with conventional structure.

According to the nitride based semiconductor device according to the first embodiment, the stress occurred under the influence of the electron block layer can be alleviated, and the light distribution is not affected by the electron block layer, the threshold current can be degraded, and the degrade of reliability can be suppressed.

Second Embodiment

Figure 12:
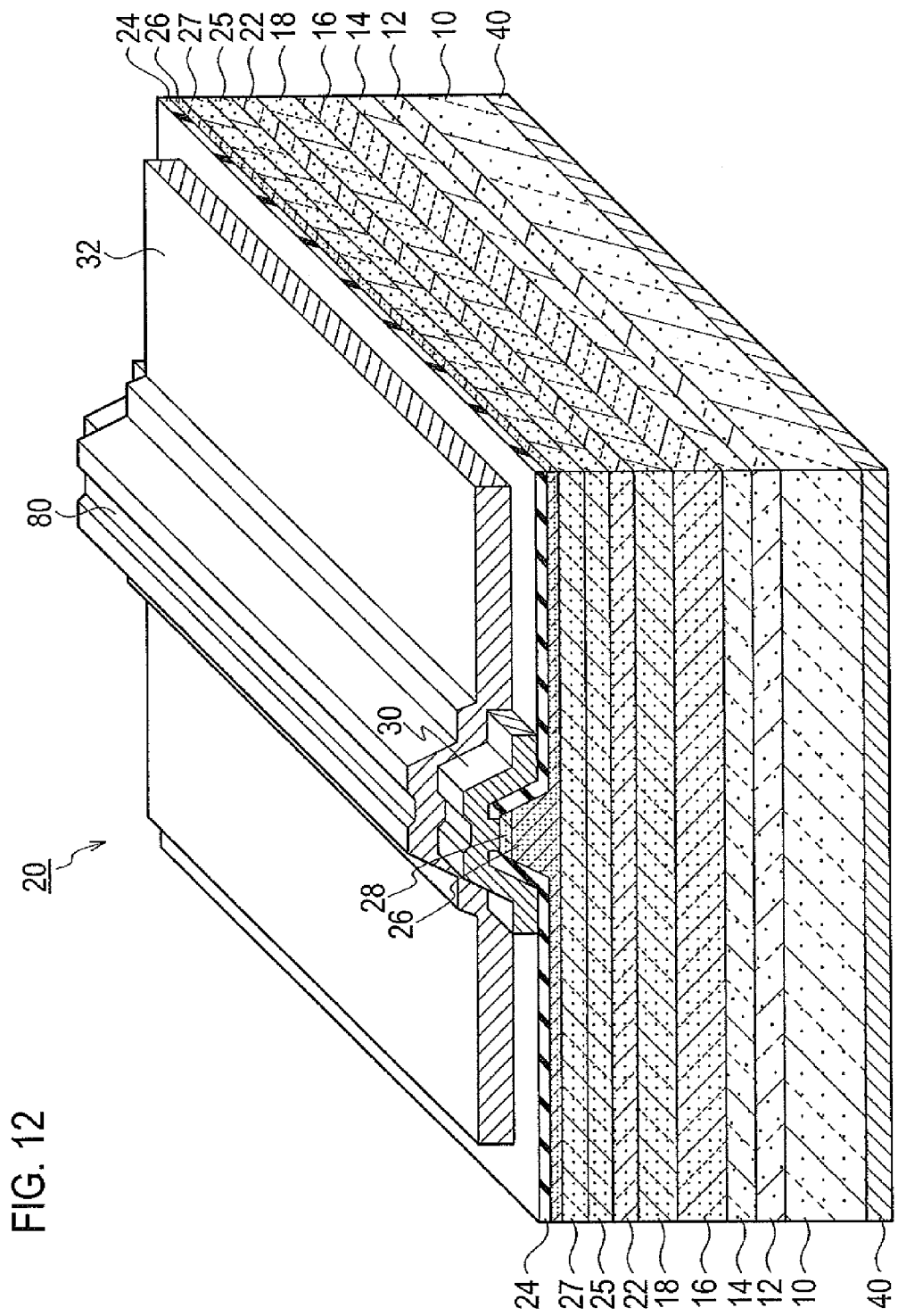
FIG. 12 is a schematic bird's-eye view of a nitride based semiconductor device according to a second embodiment of the present invention.

As schematically shown in the bird's-eye view of FIG. 12, a nitride based semiconductor device 20 according to a second embodiment of the present invention includes: a GaN based semiconductor substrate 10; an n-type GaN based buffer layer 12 placed on the GaN based semiconductor substrate 10; an n-type cladding layer 14 placed on the n-type GaN based buffer layer 12; an n-type GaN based guide layer 16 placed on the n-type cladding layer 14; an active layer 18 placed on the n-type GaN based guide layer 16; and a p-type GaN based guide layer 22 placed on the active layer 18.

Furthermore, the nitride based semiconductor device 20 according to the second embodiment includes an electron block layer 25 placed on the p-type GaN based guide layer 22, a stress relaxation layer 27 placed on the electron block layer 25, and a p-type cladding layer 26 placed on the stress relaxation layer 27.

The p-type cladding layer 26 is patterned and is removed by etching, and as shown in FIG. 12, a part of the patterned p-type cladding layer 26 is placed along with a laser stripe 80 at stripe shape. Furthermore, a p-type GaN based contact layer 28 is placed along with the laser stripe 80 on the p-type cladding layer 26.

Furthermore, the nitride based semiconductor device 20 according to the second embodiment includes an insulating film 24 placed on the flat part and the sidewall part of the p-type GaN based guide layer 22, and the sidewall part of the p-type GaN based contact layer 28. On the top surface of the p-type GaN based contact layer 28 placed at stripe shape, window opening of the insulating film 24 is performed. In this apertural area by which the window opening is performed, the p-type GaN based contact layer 28 contacts a p-side ohmic electrode 30.

Furthermore, in the nitride based semiconductor device 20 according to the second embodiment, the p-side ohmic electrode 30 covers the sidewall part of the p-type cladding layer 26a placed at stripe shape and the p-type GaN based contact layer 28 via the insulating film 24, and is placed along with the laser stripe 80 at stripe shape.

Furthermore, in the nitride based semiconductor device 20 according to the second embodiment, a p-side electrode 32 is placed on the p-side ohmic electrode 30 placed at stripe shape on the insulating film 24 and along with the laser stripe 80, and an n-side electrode 40 is placed on the GaN based semiconductor substrate 10 at the side of the back side which opposes the surface where the p-side electrode 32 is placed.

The energy band structure corresponding to the structure of the nitride based semiconductor device 20 including the n-type GaN based semiconductor substrate 10, the n-type GaN based buffer layer 12 placed on the n-type GaN based semiconductor substrate 10, the n-type cladding layer 14 placed on the n-type GaN based buffer layer 12, the n-type GaN based guide layer 16 placed on the n-type cladding layer 14, the active layer 18 placed on the n-type GaN based guide layer 16, the p-type GaN based guide layer 22 placed on the active layer 18, the electron block layer 25 placed on the p-type GaN based guide layer 22, the stress relaxation layer 27 placed on the electron block layer 25, and the p-type cladding layer 26 placed on the stress relaxation layer 27 is expressed as shown in FIG. 9.

(N-Type GaN Based Buffer Layer)

The n-type GaN based buffer layer 12 is formed by the GaN layer by which silicon (Si) is doped, for example as an n-type impurity, and the thickness is not more than about 2000 nm, for example.

(N-Type Cladding Layer)

The n-type cladding layer 14 is formed by the $Al_wGa_{1-w}N$ layer (where $0<=w<=1$), by which Si is doped, for example as an n-type impurity. The composition ratio w of Al is about 0.05, and the thickness is about 1300 nm, for example. In addition, the n-type cladding layer 14 may be provided with superlattice structure.

(N-Type GaN Based Guide Layer)

The n-type GaN based guide layer 16 is formed by the GaN layer, by which Si is doped, for example as an n-type impurity, and the thickness L0 is about 60 nm, for example.

(Active Layer)

The active layer 18 is composed of MQW structure which has an $In_zGa_{1-z}N$ layer (where $0<=z<1$) as a barrier layer, and has an $In_uGa_{1-u}N$ layer (where $0<=z<u\leqq=1$) as a well layer. The composition ratio z of the In of the $In_zGa_{1-z}N$ layer (where $0<=z<1$) which forms the barrier layer is about 0.01, for example, and the thickness is about 7 nm to about 18 nm (preferable about 16.5 nm), for example. On the other hand, the composition ratio u of the In of the $In_uGa_{1-u}N$ layer (where $0<=z<u<=1$) which forms the well layer is about 0.07, for example, and the thickness is about 2 nm to about 3 nm (preferable about 2.8 nm), for example. When rising the confinement effect of a carrier, it is effective that the number of pairs of the MQW structure, which composes the p-type active layer 18 is not more than three. As the p-type impurity, magnesium (Mg) is doped, for example.

(P-Type GaN Based Guide Layer)

The p-type GaN based guide layer 22 is formed by the GaN layer, by which magnesium (Mg) is doped, for example as a p-type impurity, and the thickness L1 is about 30 nm to about 90 nm, for example. In addition, the p-type GaN based guide layer 22 should just be provided with the effect as a light guide layer, and may be formed as undoped $In_\beta Ga_{1-\beta}N$ layer (where $0<=\beta<1$) instead of the p-type GaN layer, for example. In this case, the composition ratio β of In is about 0.02, for example, and the thickness L1 is about 30 nm to about 90 nm similarly, for example. In addition, the thickness L1 of the p-type GaN based guide layer 22 and the thickness L0 of the n-type GaN based guide layer 16 are usually equal. By setting up in this way, FFP of the laser beam outputted from an output end face can be applied satisfactory.

(Electron Block Layer)

The electron block layer 25 can be formed by the $Al_v Ga_{1-v}N$ layer (where $0<v<=1$), by which Mg is doped, for example as a p-type impurity. The thickness L3 is about 3 nm to about 20 nm, and is about 7 nm to about 10 nm preferable, for example. The composition ratio v of Al is constant value, for example, about 0.2.

(Stress Relaxation Layer)

The stress relaxation layer 27 can be formed by the $In_v Ga_{1-v}N$ layer (where $0<=v<=1$), by which Mg is doped as a p-type impurity, for example. The thickness L2 is about 30 nm to about 50 nm, for example. The preferable composition ratio v of In is about 0.02, for example. In addition, the stress relaxation layer 27 may be the p-type GaN layer which corresponds in the case of v=0.

In addition, as described later, as for the nitride based semiconductor device 20 according to this embodiment, when the thickness L0 of the n-type GaN based guide layer 16 and the thickness L1 of the p-type GaN based guide layer 22 are equal and sufficient as thick as 90 nm even if it changes the thickness L2 of the stress relaxation layer 27, the variation is not occurred in the half width at half maximum of vertical divergence angle θv of FFP of the laser beam outputted from the output end face. Accordingly, it is verified that the stress relaxation layer 27 is not a part of the p-type GaN based guide layer 22.

In the nitride based semiconductor device 20 according to this embodiment, the stress accompanying the lattice constant mismatching of GaAlN/GaN occurred in the interface T1 between the electron block layer 25 and the p-type GaN based guide layer 22 can be distributed to both sides of the p-type GaN based guide layer 22 and the stress relaxation layer 27 by forming the stress relaxation layer 27. Moreover, since the FFP is not affected by influence by existence of the electron block layer 25 and the stress relaxation layer 27, the nitride based semiconductor device 20 according to this embodiment reduces threshold current, and can suppress the degrade of reliability.

(P-type Cladding Layer)

The p-type cladding layer 26 is composed of superlattice structure for which Mg is doped as a p-type impurity, and which has the $Al_w Ga_{1-w}N$ layer (where $0<=w<=1$) as a barrier layer and the GaN layer as a well layer, for example. The composition ratio w of Al of the $Al_w Ga_{1-w}N$ layer (where $0<=w<=1$), which forms the barrier layer, is about 0.1, for example. It is preferable that the number of pairs of the superlattice structure, which composes the p-type cladding layer 26 is about 90 in respect of improvement in crystal quality.

(P-Type GaN Based Contact Layer)

The p-type GaN based contact layer 28 is formed by the GaN layer, by which Mg is doped as a p-type impurity, for example, and the thickness is about 60 nm, for example.

The insulating film 24 is formed by $ZrO_2$, for example, and the thickness is about 200 nm, for example.

As the insulating film 24, $Al_2O_3$, $SiO_2$, $TiO_2$, $Ta_2O_5$, $Nb_2O_5$, AlN, SiN, AlON, SiON, AlN, (where $0<\alpha<1$), or these cascade films are applicable, to others.

(Electrode Structure)

The p-side ohmic electrode 30 is formed by Pd/Au, for example. The thickness of Pd/Au is about 10 nm/50 nm, for example.

Moreover, the p-side electrode 32 is formed by Ti/Au, for example. The thickness of Ti/Au is about 50 nm/500 nm, for example.

Moreover, the n-side electrode 40 is formed by Al/Pt/Au or Al/Ti/Au, for example. The thickness of Al/Pt (Ti)/Au is about 100 nm/10 nm/200 nm, for example.

As for the nitride based semiconductor device 20 according to the second embodiment, the stress accompanying the lattice constant mismatching of GaAlN/GaN occurred in the interface T1 between the electron block layer 25 and the p-type GaN based guide layer 22 can be distributed to both sides of the p-type GaN based guide layer 22 and the stress relaxation layer 27 by forming the stress relaxation layer 27. Moreover, since it is also rare for the FFP to be affected by influence by existence of the electron block layer 25 and the stress relaxation layer 27, the nitride based semiconductor device 20 according to the second embodiment can reduce the threshold current, and can suppress the degrade of reliability.

Modified Example 1 of the Second Embodiment

Figure 14:
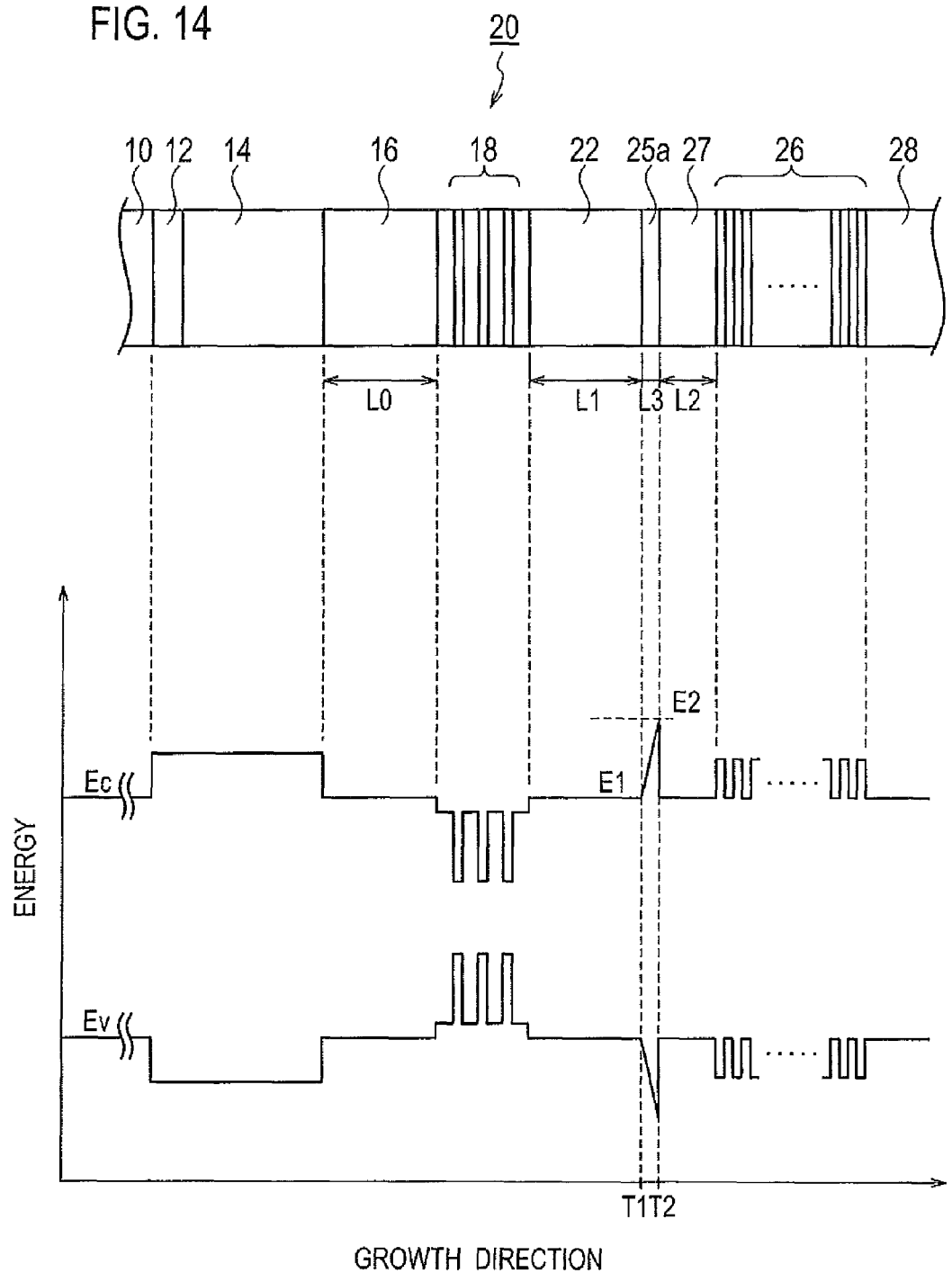
FIG. 14 is an energy band structure chart of a nitride based semiconductor device according to a modified example 1 of the second embodiment of the present invention.

As shown in FIG. 14, as for an energy band structure of a nitride based semiconductor device according to a modified example 1 of the second embodiment, the electron block layer 25a has an energy potential structure of triangular shape. Since other structures are the same as that of the second embodiment, the explanation related to the structure of overlapping part is omitted.

(Electron Block Layer)

In FIG. 14, the electron block layer 25a can be formed by the $Al_y Ga_{1-y}N$ layer (where $0<y<=1$), by which Mg is doped, for example as a p-type impurity. The thickness L3 is about 3 nm to about 20 nm, and is about 7 nm to about 10 nm preferable, for example. The Al composition ratio y is continuously changed as it shifts to the interface T2, which contacts the stress relaxation layer 27 from the interface T1 which contacts the p-type GaN based guide layer 22. The composition inclination of Al composition is about 1.64 (%/nm), for example. If the thickness of the electron block layer 25 shall be about 14 nm, for example, the variation of Al composition rises linearly substantially from 0% to about 23%. The composition inclination of such the Al composition can be formed by changing material provisioning gas, such as trimethyl aluminum (TMA) which forms Al composition, to linearity for carrier gas.

As for the nitride based semiconductor device 20 according to the modified example 1 of the second embodiment, the stress accompanying the lattice constant mismatching of GaAlN/GaN occurred in the interface T1 between the electron block layer 25a and the p-type GaN based guide layer 22 can be distributed to the inside of the electron block layer 25a and both sides of the p-type GaN based guide layer 22 and the stress relaxation layer 27 by changing continuously the Al composition ratio y of the electron block layer 25a and forming the stress relaxation layer 27. Moreover, since it is also rare for the FFP to be affected by influence by existence of the electron block layer 25 and the stress relaxation layer 27, the nitride based semiconductor device 20 according to the modified example 1 of the second embodiment can reduce the threshold current, and can suppress the degrade of reliability.

Modified Example 2 Of the Second Embodiment)

Figure 15:
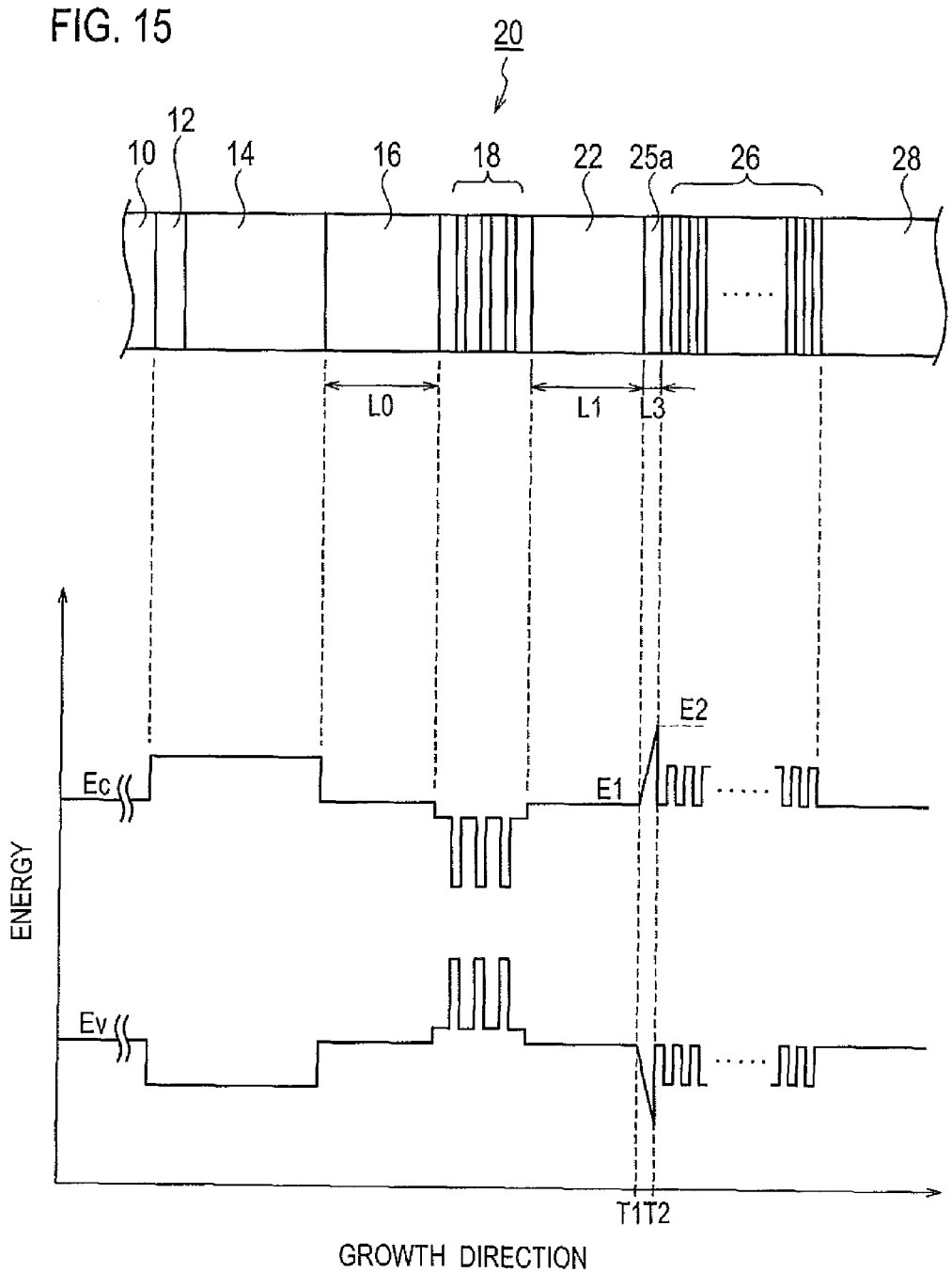
FIG. 15 is an energy band structure chart of a nitride based semiconductor device according to a modified example 2 of the second embodiment of the present invention.

As shown in FIG. 15, the electron block layer 25a has the energy potential structure of triangular shape, and the energy band structure of a nitride based semiconductor device according to a modified example 2 of the second embodiment has the structure of omitting L2=0, i.e., the stress relaxation layer 27, in the modified example 1 shown in FIG. 14. Since other structures are the same as that of a 2nd embodiment, the explanation related to the structure of the overlapping part is omitted.

(Electron Block Layer)

In FIG. 15, the electron block layer 25a can be formed by the $Al_yGa_{1-y}N$ layer (where 0<y<=1), by which Mg is doped, for example as a p-type impurity. The thickness L3 is about 3 nm to about 20 nm, and is about 7 nm to about 10 nm preferable, for example. The Al composition ratio y is continuously changed as it shifts to the interface T2 which contacts the p-type cladding layer 26 from the interface T1 which contacts the p-type GaN based guide layer 22. The composition inclination of Al composition is about 1.64 (%/nm), for example. If the thickness of the electron block layer 25 shall be about 14 nm, for example, the variation of Al composition rises linearly substantially from 0% to about 23%.

Thus, by changing the Al composition ratio y continuously as it shifts to the interface T2 which contacts the p-type cladding layer 26 from the interface T1 which contacts the p-type GaN based guide layer 22, the stress release effect can be occurred by the continuous variation of Al composition ratio y in the electron block layer 25a.

As for the nitride based semiconductor device 20 according to the modified example 2 of the second embodiment, the stress accompanying the lattice constant mismatching of GaAlN/GaN occurred in the interface T1 between the electron block layer 25a and the p-type GaN based guide layer 22 is absorbable inside the electron block layer 25a by changing continuously the Al composition ratio y of the electron block layer 25a. Moreover, since it is also rare for the FFP to be affected by influence by existence of the electron block layer 25, the nitride based semiconductor device 20 according to the modified example 2 of the second embodiment can reduce the threshold current, and can suppress the degrade of reliability.

(Energy Potential Profile of Electron Block Layer 25a)

Figure 16:
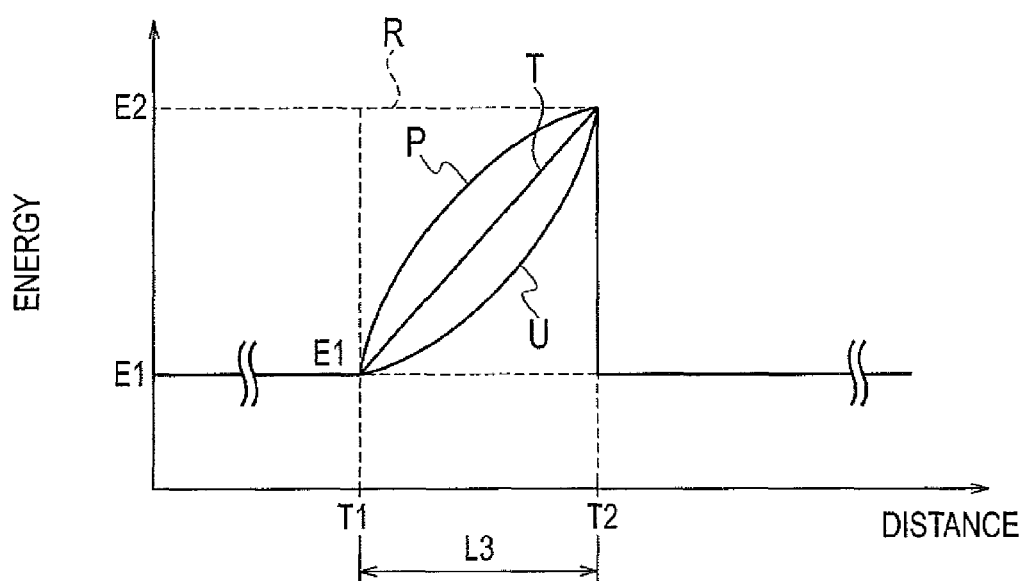
FIG. 16 shows an example of an energy potential profile of an electron block layer applicable to the nitride based semiconductor device according to the second embodiment of the present invention.

As shown in FIG. 16, an energy potential profile of the electron block layer 25a applicable to the nitride based semiconductor device 20 according to the modified example 1 or modified example 2 of the second embodiment has: an example which rises linearly substantially as shown in the line T from the energy level E1 of the interface T1 between the electron block layer 25a and the p-type GaN based guide layer 22 which have the width L3 to the energy level E2 of the interface T2 which contacts the electron block layer 25a, and the stress relaxation layer 27, or the p-type cladding layer 26; an example which rises exponentially as shown in the line U; or an example which rises in parabola as shown in the line P, etc. In addition, it is not limited to this example.

(Aging Time)

Figure 3:
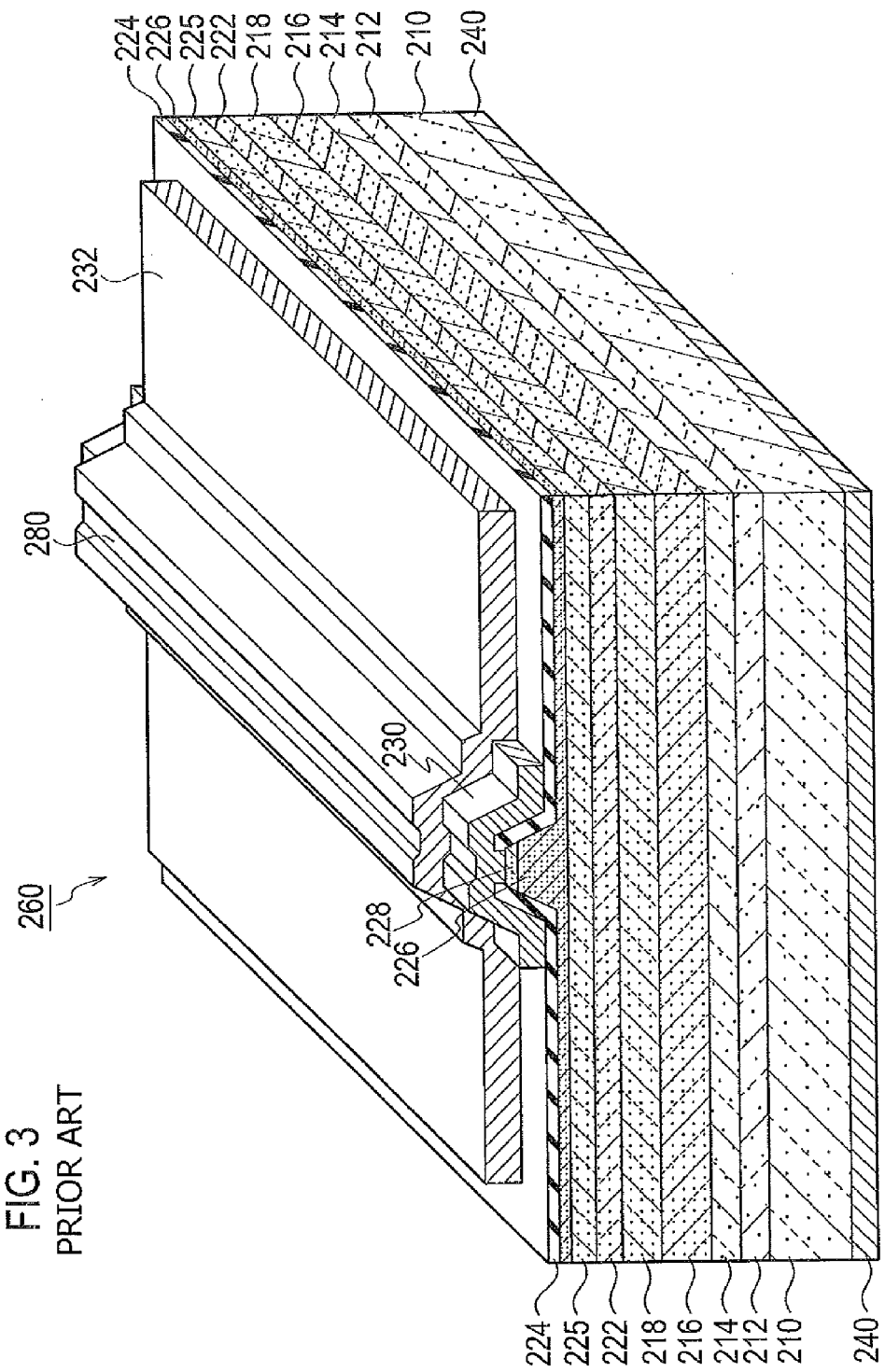
FIG. 3 is a schematic bird's-eye view of a nitride based semiconductor device according to a conventional example.
Figure 4:
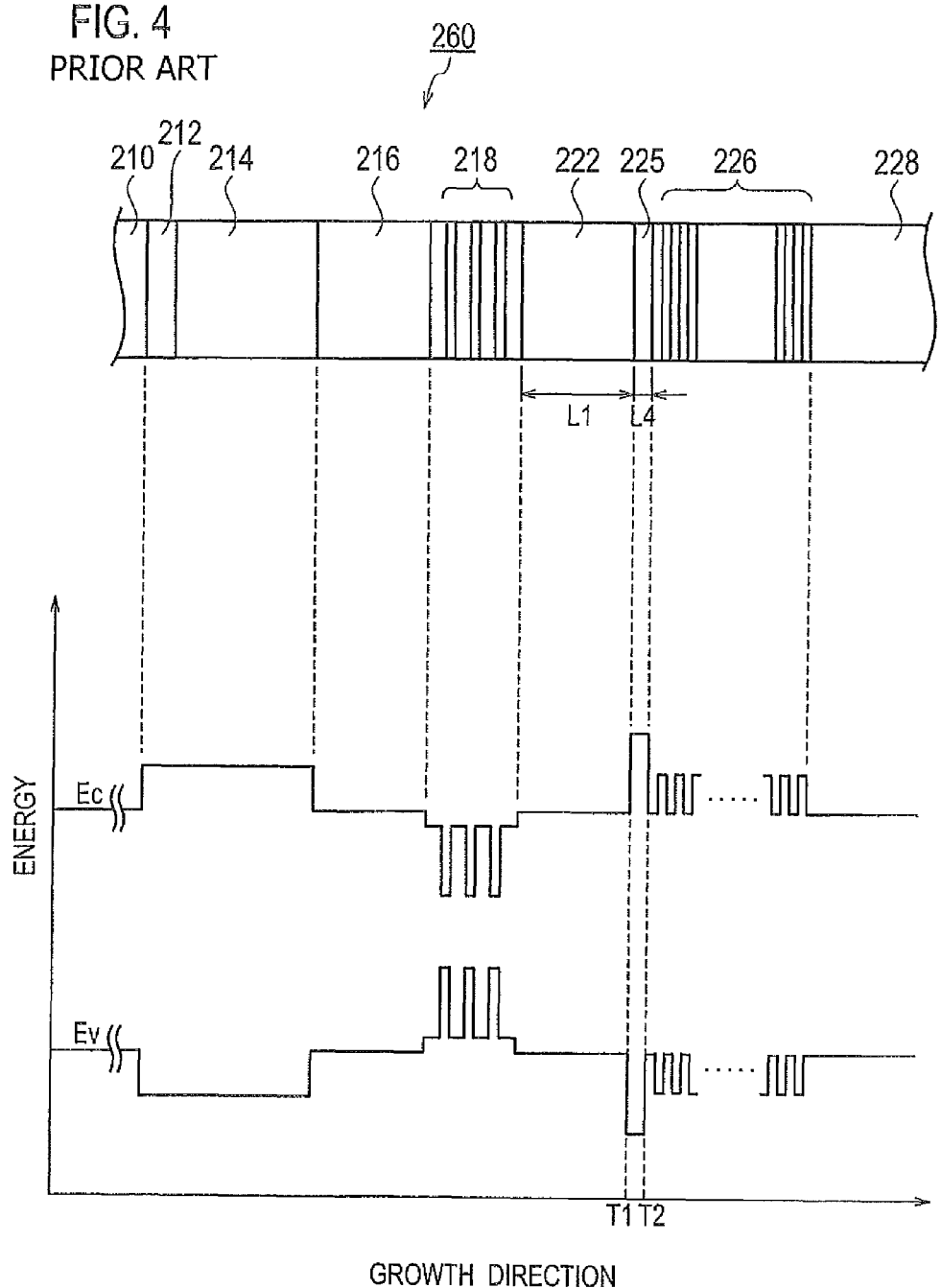
FIG. 4 is an energy band structure chart corresponding to the nitride based semiconductor device shown in FIG. 3.
Figure 5:
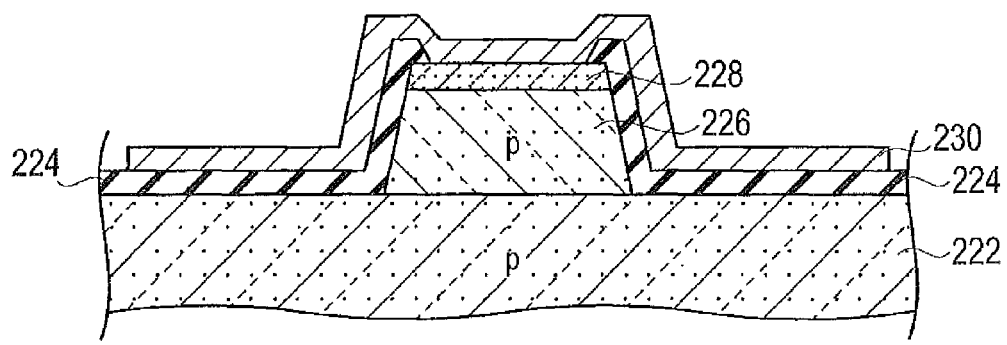
FIG. 5 is a schematic cross-sectional configuration chart of a ridge part of the nitride based semiconductor device according to the conventional example.
Figure 6:
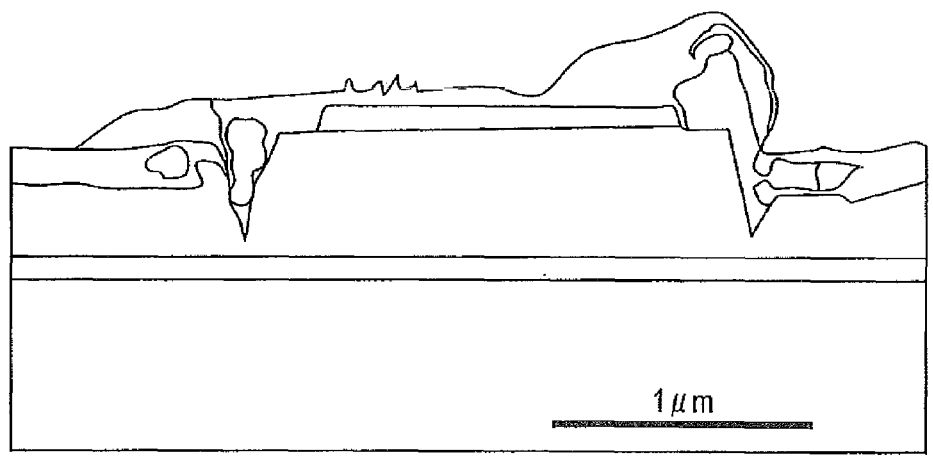
FIG. 6 shows an SEM photograph of the ridge part of the nitride based semiconductor device according to the conventional example.
Figure 13:
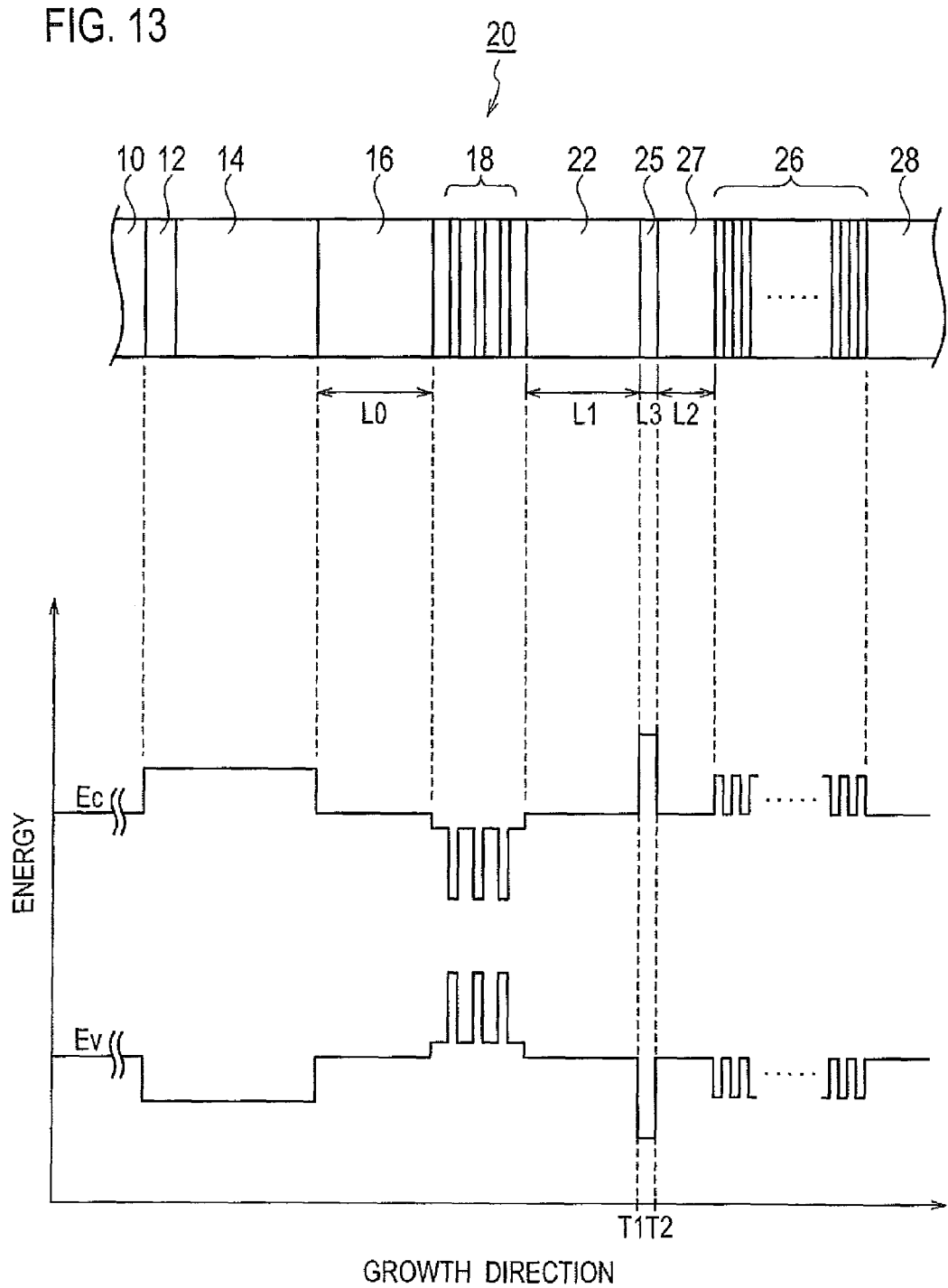
FIG. 13 is an energy band structure chart corresponding to the nitride based semiconductor device shown in FIG. 12.
Figure 17:
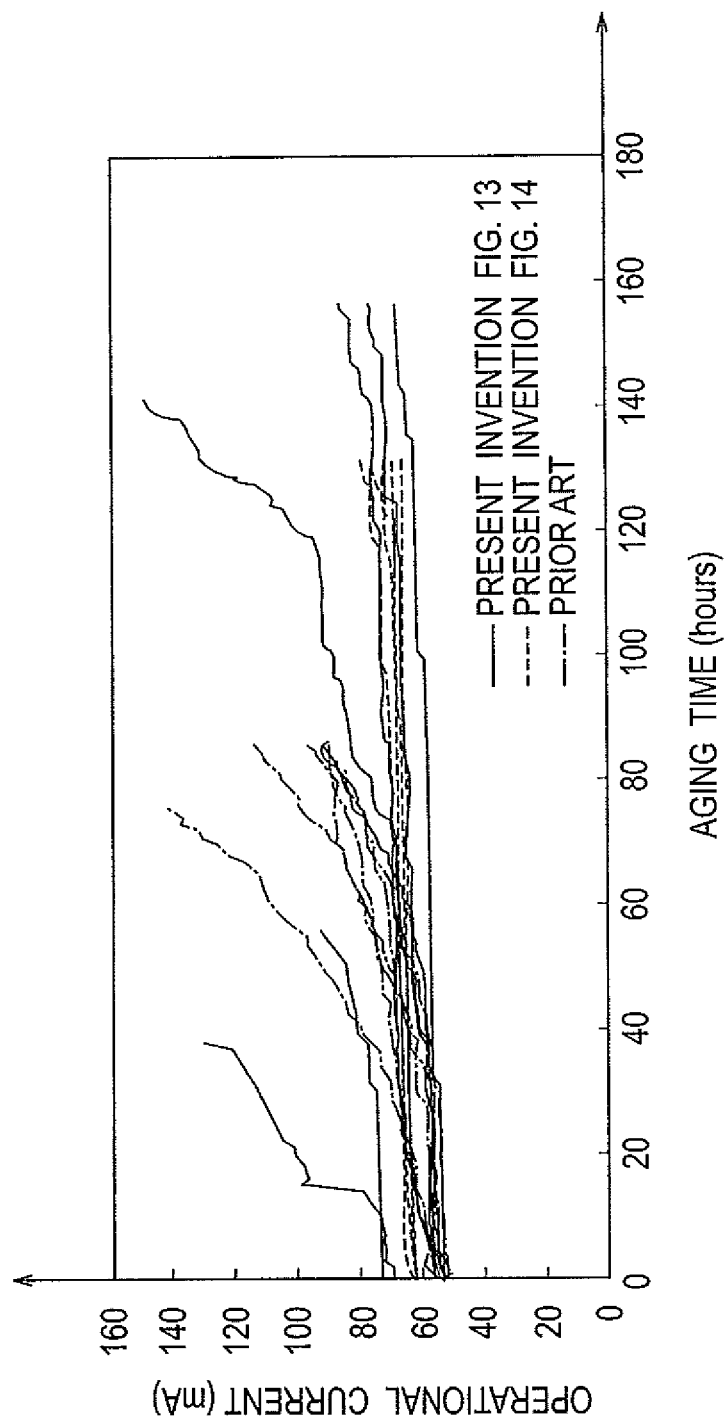
FIG. 17 shows the relationship of an operating current and aging time of the nitride based semiconductor device according to the second embodiment of the present invention.

The relationship of the operating current and aging time of the nitride based semiconductor device according to the second embodiment and its modified example 1 is expressed as shown in FIG. 17. In FIG. 17, the conventional example shown with a dashed dotted line is conventionally equivalent to the structure shown in FIG. 3 to FIG. 4, and the present invention shown with a full line is equivalent to the structure of the second embodiment shown in FIG. 12 to FIG. 13. The thick film of the stress relaxation layer 27 is about 10 nm, for example, and other structures are the same as the conventional structure.

The present invention shown with a dashed line is equivalent to the structure of the modified example 1 of the second embodiment shown in FIG. 14. The composition inclination of Al composition is about 1.64 (%/nm). The thickness of the electron block layer 25 shall be about 14 nm, and the variation of Al composition is rising linearly substantially from 0% to about 23%. As clearly from FIG. 17, the case of being equivalent to the structure of the modified example 1 of the second embodiment shown with a dashed line is most excellent in the aging effect.

(FFP)

Figure 18:
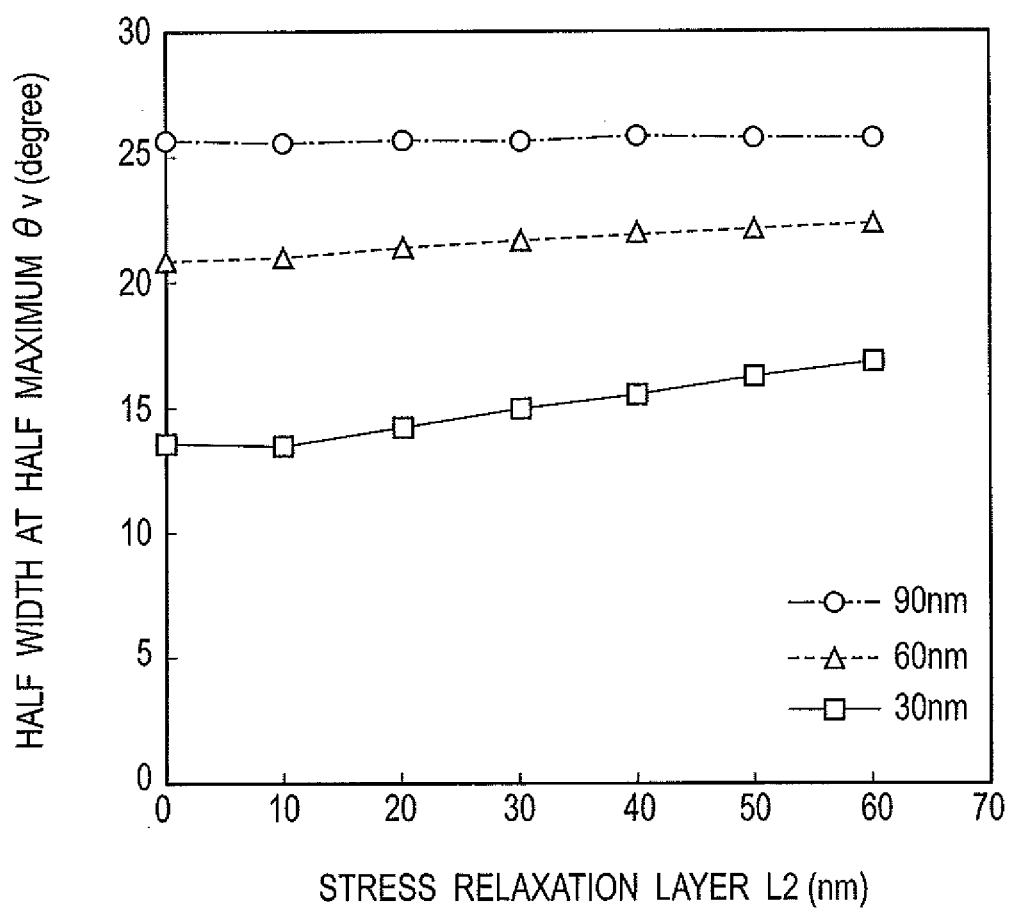
FIG. 18 shows the relation between a half width at half maximum of vertical divergence angle $\theta v$ of FFP and the thickness L2 of a stress relaxation layer of the nitride based semiconductor device according to the second embodiment of the present invention.
Figure 19:
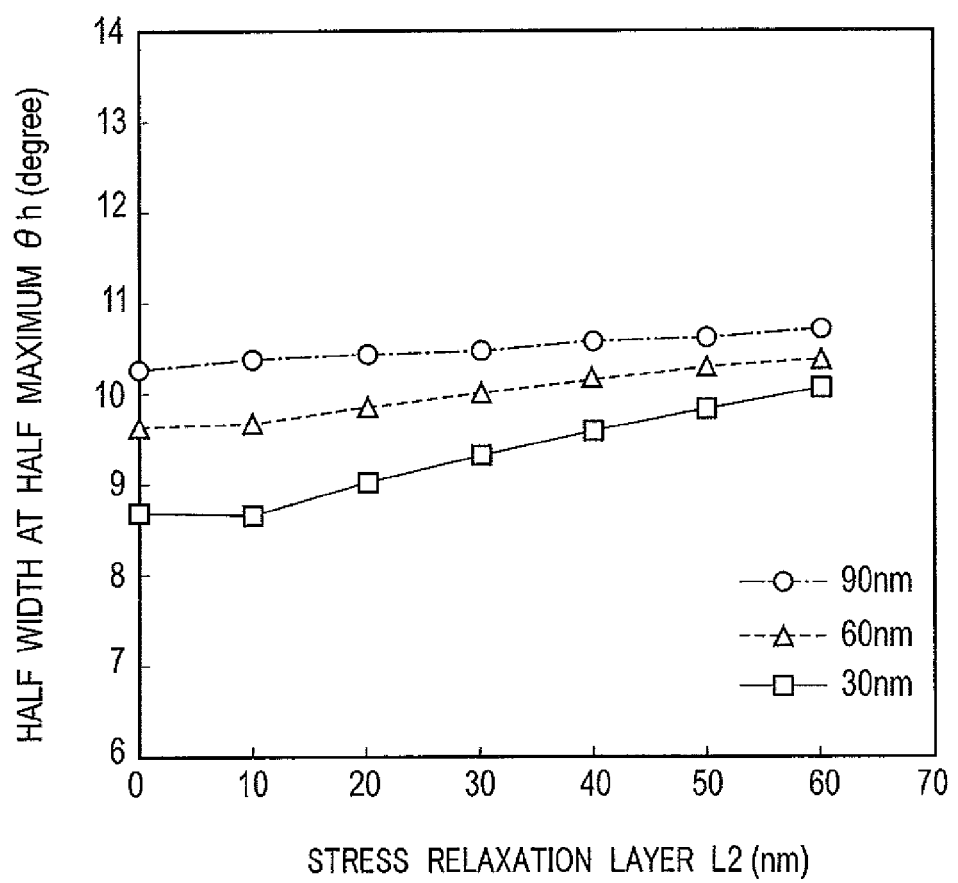
FIG. 19 shows the relation between a half width at half maximum of horizontal spreading angle $\theta h$ of FFP and the thickness L2 of a stress relaxation layer of the nitride based semiconductor device according to the second embodiment of the present invention.

The relation between the half width at half maximum of vertical divergence angle θv of FFP and the thickness L2 of the stress relaxation layer 27 of the nitride based semiconductor device 20 according to the second embodiment is expressed as shown in FIG. 18, and the relation between the half width at half maximum of horizontal spreading angle θh and the thickness L2 of the stress relaxation layer 27 of the nitride based semiconductor device 20 according to the second embodiment is expressed as shown in FIG. 19.

In FIG. 18 and FIG. 19, the thickness L0 of the n-type GaN based guide layer 16 and the thickness L1 of the p-type GaN based guide layer 22 are equal, and an example changed like 30 nm, 60 nm, and 90 nm, respectively is shown.

As shown in FIG. 18, when sufficient thick like L0=L1=90 nm, even if it thickens the thickness L2 of the stress relaxation layer 27 inserted between the electron block layer 25 and the p-type cladding layer 26 to 60 nm, the half width at half maximum of vertical divergence angle θv of FFP is about 25.6 to 25.7 degrees, and is hardly changing.

On the other hand, when thin like L0=L1=30 nm, if the thickness L2 of the stress relaxation layer 27 becomes thick to 60 nm, the half width at half maximum of vertical divergence angle θv of FFP becomes large to 13.5 to 17.0 degrees. Moreover, since the "light penetration ooze out" to the n-type cladding layer 14 and the p-type cladding layer 26 becomes large if the thickness L0 of the n-type GaN based guide layer 16 and the thickness L1 of the p-type GaN based guide layer 22 become thin, NFP (Near-field Pattern) becomes large and the FFP becomes small.

As mentioned above, if the stress relaxation layer 27 is functioning as the light guide layer, the half width at half maximum of vertical divergence angle θv of FFP should become large with the increase in the thickness L2 of the stress relaxation layer 27. However, as clearly from the result of FIG. 18, since it is hardly changing, when sufficient thick like L0=L1=90 nm, the stress relaxation layer 27 is not functioning as the p-type GaN based guide layer 22 substantially.

(Threshold Value Current)

Figure 20:
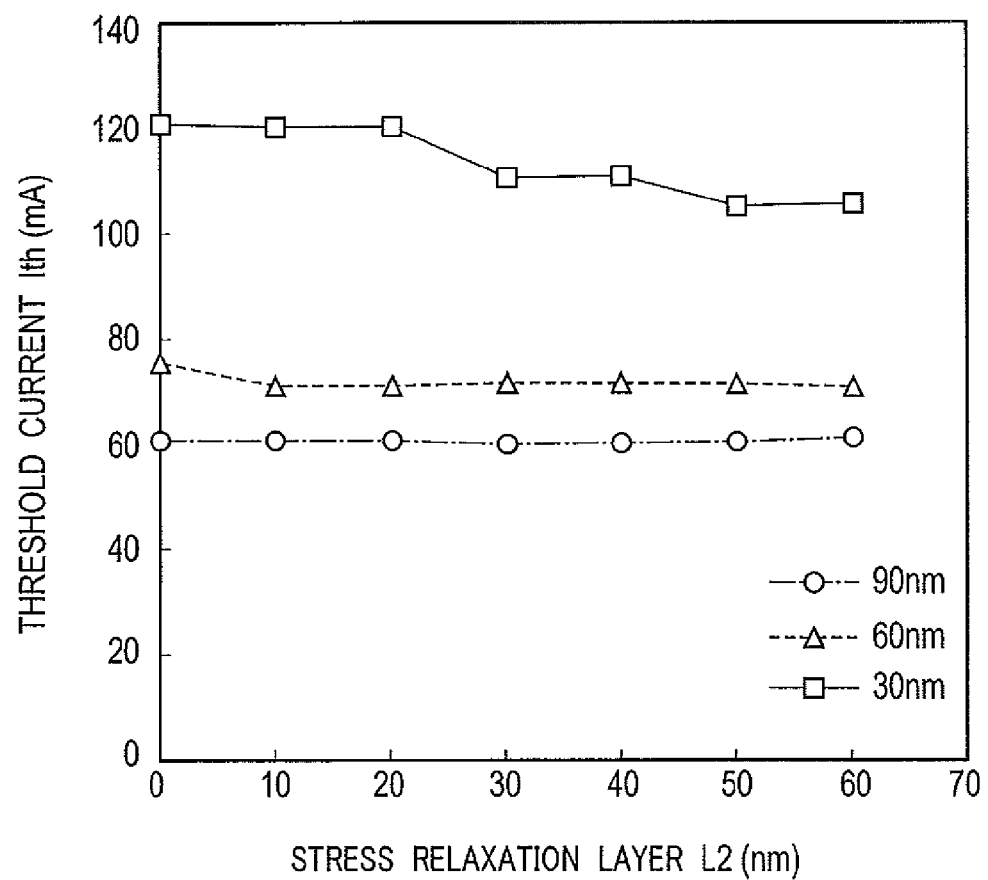
FIG. 20 shows the relation between a threshold value current Ith and the thickness L2 of a stress relaxation layer of the nitride based semiconductor device according to the second embodiment of the present invention.

The relation between the threshold value current Ith and the thickness L2 of the stress relaxation layer 27 of the nitride based semiconductor device 20 according to the second embodiment is expressed as shown in FIG. 20.

In the case of L0=L1=90 nm, since the threshold current Ith is a substantially constant for the variation of the thickness L2 of the stress relaxation layer 27, it proves that a vertical optical confinement effect is a substantially constant. On the other hand, in the case of L0=L1=30 nm, since the threshold current Ith is reducing along with the increase in the thickness L2 of the stress relaxation layer 27, it proves that the optical confinement factor to a vertical core layer (active layer 18+substantial guide layer) becomes high along with the increase in the thickness L2 of the stress relaxation layer 27.

When thick like L0=L1=90 nm, since the lights are gathering for the core layer to some extent, the threshold current Ith is a substantially constant also for the thickness change of the layer which originally functions as the guide layer such as the stress relaxation layer 27. Moreover, since the stress relaxation layer 27 is located in the outside of the electron block layer 25 with a small refractive index very much (=Al composition ratio is high), the lights are already confined to some extent in the electron block layer 25, and the threshold current Ith becomes a substantially constant also from the light intensity in the stress relaxation layer 27 being low originally.

According to the nitride based semiconductor device according to the second embodiment, the stress occurred under the influence of the electron block layer can be alleviated, and the light distribution cannot be affected by the electron block layer, the threshold current can be reduced, and the degrade of reliability can be suppressed.

Third Embodiment

Figure 21:
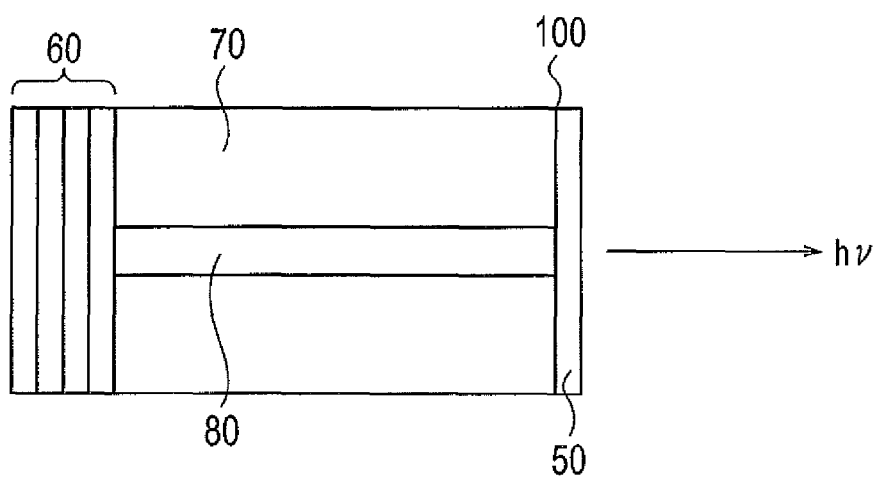
FIG. 21 is a schematic top view of a nitride based semiconductor device according to the third embodiment of the present invention.

As schematically shown in the top view of FIG. 21, a nitride based semiconductor device according to a third embodiment includes: a nitride based semiconductor laser main unit 70; a laser stripe 80 placed on the nitride based semiconductor laser main unit 70; an oxygen absorption layer 50 placed on the nitride based semiconductor laser main unit 70 and an emitting end surface 100 of the laser beam of the laser stripe 80; and a rear end face protection film 60 placed on the opposite side which opposes the emitting end surface 100 of the laser beam of the nitride based semiconductor laser main unit 70 and the laser stripe 80.

The oxygen absorption layer 50 includes one of $ZrO_2$, $Al_2O_3$, $SiO_2$, $TiO_2$, $Ta_2O_5$, $Nb_2O_5$, AlN, SiN, AlON, SiON, and $AlN_x$ (where 0<x<1).

The rear end face protection film 60 is formed with a multilayer film including one of $ZrO_2$, $Al_2O_3$, $SiO_2$, $TiO_2$, $Ta_2O_5$, $Nb_2O_5$, AlN, SiN, AlON, SiON, and $AlN_x$ (where 0<x<1). In this case, $AlN_x$ (where 0<x<1) indicates the case of the composition ratio which shifts from stoichiometry control of AlN.

Figure 22:
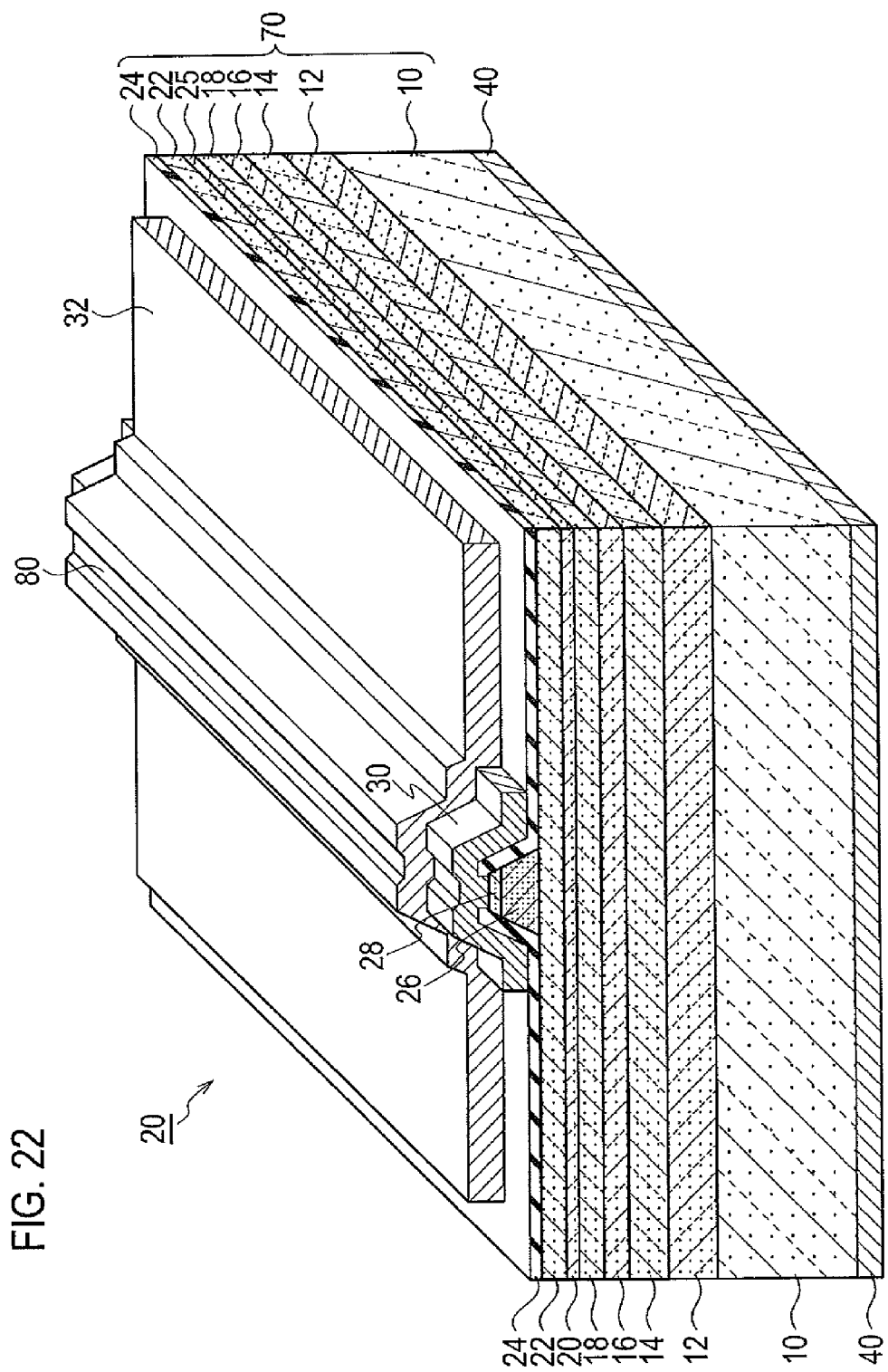
FIG. 22 is a schematic bird's-eye view of an element part of the nitride based semiconductor device according to the third embodiment of the present invention.

As schematically shown in the bird's-eye view of FIG. 22, a nitride based semiconductor device part except for the oxygen absorption layer 50 and the rear end face protection film 60 of the nitride based semiconductor device according to the third embodiment includes: a GaN based semiconductor substrate 10; an n-type GaN buffer layer 12 placed on the GaN based semiconductor substrate 10; an n-type superlattice cladding layer 14 placed on n-type GaN buffer layer 12; an n-type GaN based guide layer 16 placed on the n-type superlattice cladding layer 14; an InGaN active layer 18 placed on the n-type GaN based guide layer 16; an electron block layer 25 placed on the InGaN active layer 18; and a p-type GaN based guide layer 22 placed on the electron block layer 25.

The nitride based semiconductor device according to the third embodiment further includes a p-type superlattice cladding layer 26 placed on the p-type GaN based guide layer 22 at stripe shape, and a p-type GaN based contact layer 28 placed on the p-type superlattice cladding layer 26.

The nitride based semiconductor device according to the third embodiment further includes an insulating film 24 placed on the p-type GaN based guide layer 22, and placed on the sidewall of the p-type superlattice cladding layer 26 and the p-type GaN based contact layer 28. On the top surface of the p-type GaN based contact layer 28 placed at stripe shape, window opening of the insulating film 24 is performed. In this apertural area by which the window opening is performed, the p-type GaN based contact layer 28 contacts a p-side ohmic electrode 30.

Furthermore, in the nitride based semiconductor device according to the third embodiment, the p-side ohmic electrode 30 covers the sidewall part of the p-type superlattice cladding layer 26 and the p type GaN based contact layer 28 placed at stripe shape via the insulating film 24, and is placed along with the laser stripe 80 at stripe shape.

Furthermore, in the nitride based semiconductor device according to the third embodiment, a p-side electrode 32 is placed along with the insulating film 24 which covers the nitride based semiconductor laser main unit 70, and the laser stripe 80 on the p-side ohmic electrode 30 placed at stripe shape, and an n-side electrode 40 is placed on the GaN based semiconductor substrate 10 at the side of the back side which opposes the surface where the p-side electrode 32 is placed.

The insulating film 24 is formed by $ZrO_2$, for example. Moreover, the p-side ohmic electrode is formed by Pd/Au, for example. The n-side electrode 40 is formed by Al/Ti/Au, for example.

Figure 23:
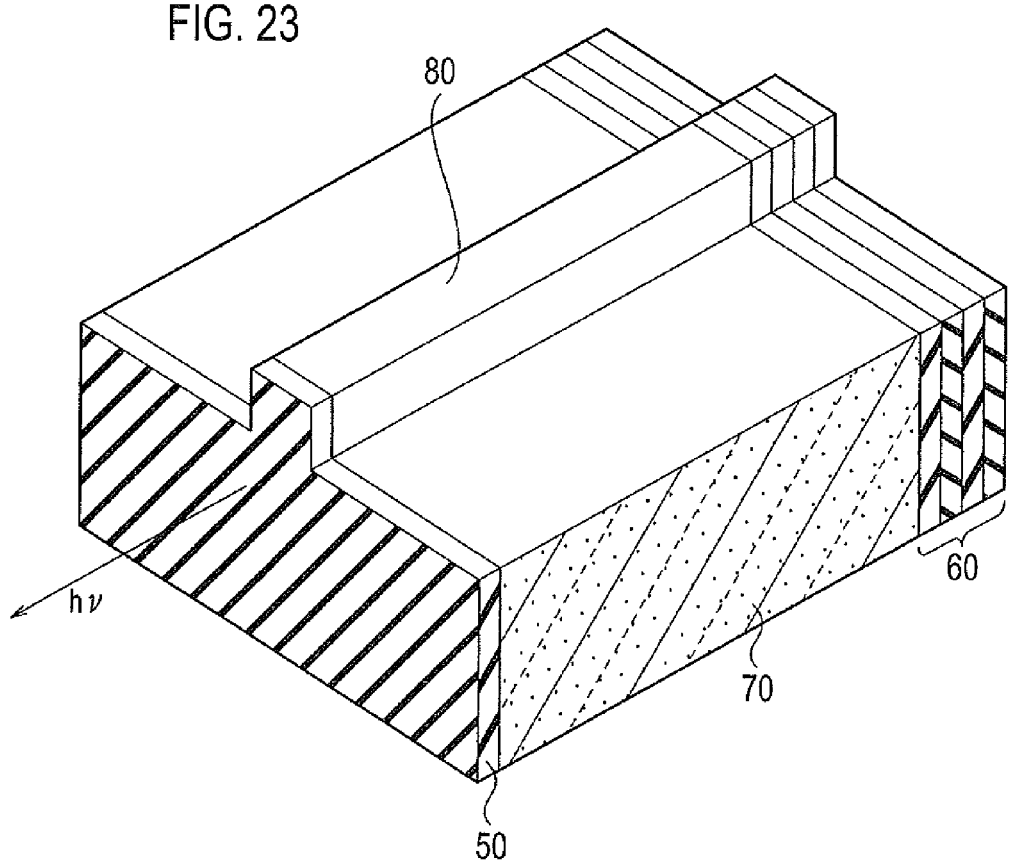
FIG. 23 is a bird's-eye view corresponding to FIG. 21 of the nitride based semiconductor device according to the third embodiment of the present invention.

In the nitride based semiconductor device according to the third embodiment, as shown in the bird's-eye view of FIG. 23 corresponding to FIG. 21, the oxygen absorption layer 50 and the rear end face protection film 60 are placed so that the end face of both the nitride based semiconductor laser main unit 70 and the laser stripe 80 may be covered in common.

Therefore, as shown in FIG. 21 to FIG. 23, the nitride based semiconductor device according to the third embodiment includes: a GaN based semiconductor substrate 10; n-type semiconductor layers (12, 14, 16) and p-type semiconductor layers (25, 22, 26, 28) which are placed on the GaN based semiconductor substrate 10; an active layer (18) which is placed between the n-type semiconductor layers (12, 14, 16) and the p-type semiconductor layers (25, 22, 26, 28), and includes In; an oxygen absorption layer 50 which is placed on the emitting end surface 100 of the laser beam, and adjusted the extinction coefficient in the wavelength of 405 nm to about 0.2 to about 0.002.

(Extinction Coefficient k)

Figure 24:
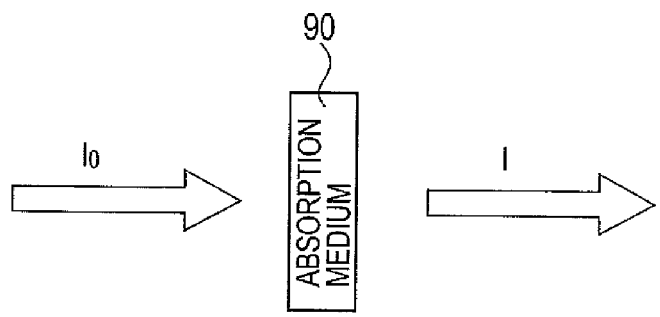
FIG. 24 is an explanatory diagram of an extinction coefficient k.

The extinction coefficient k will be explained using FIG. 24.

If the transmitted light intensity is set to I for the incident light intensity $I_0$ for the absorption medium 90, the optical transmittance is expressed by following formula:

$$I/I_0 = \exp(-\alpha d),$$

where $\alpha$ is an absorption coefficient, $\alpha$ is expressed with $\alpha = 4\pi k/\lambda$, and d expresses the thickness of the absorption medium 90, k expresses the extinction coefficient, and $\lambda$ expresses the wavelength.

The optical transmittance decreases exponentially according to the value of the absorption coefficient $\alpha$. The result which multiplied this absorption coefficient $\alpha$ by $(\lambda/4\pi)$ is defined as the extinction coefficient k. In addition, the above-mentioned equation is equivalent to the simple example computation, which cannot go into consideration in reflection of the surface of the absorption medium 90.

Figure 25:
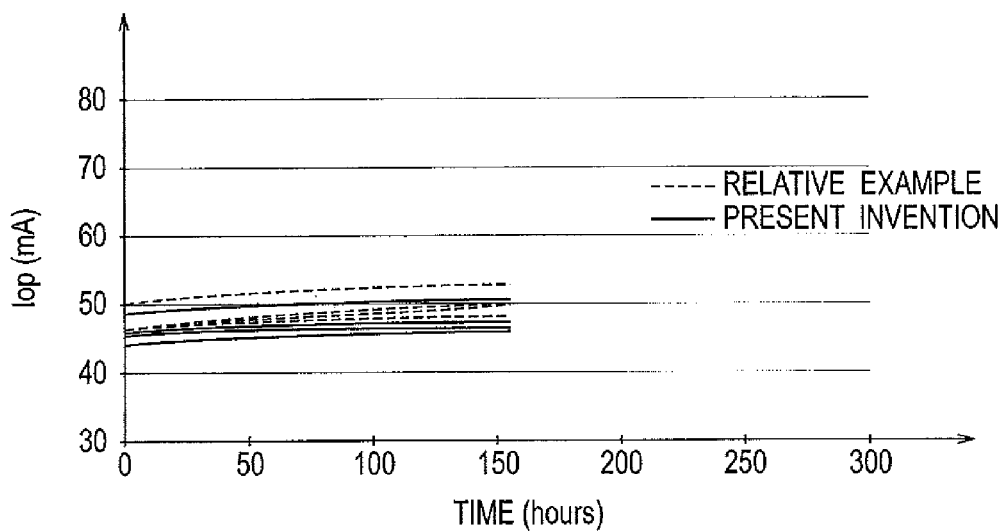
FIG. 25 shows comparison aging data showing the relation between an operating current Iop (mA) and time (hr).

FIG. 25 expresses the relationship of the operating current Iop (mA) and time (hr) of the nitride based semiconductor device according to the third embodiment. In the example of FIG. 25, the values of the oxygen ($O_2$) flow rate (sccm) and the extinction coefficient k at the time of the film formation described later is equivalent to the case which is 4 sccm and is 0.0026, respectively in the comparative example, and is equivalent to the case which is 3 sccm and is 0.017, respectively in the example of the present invention.

Figure 26:
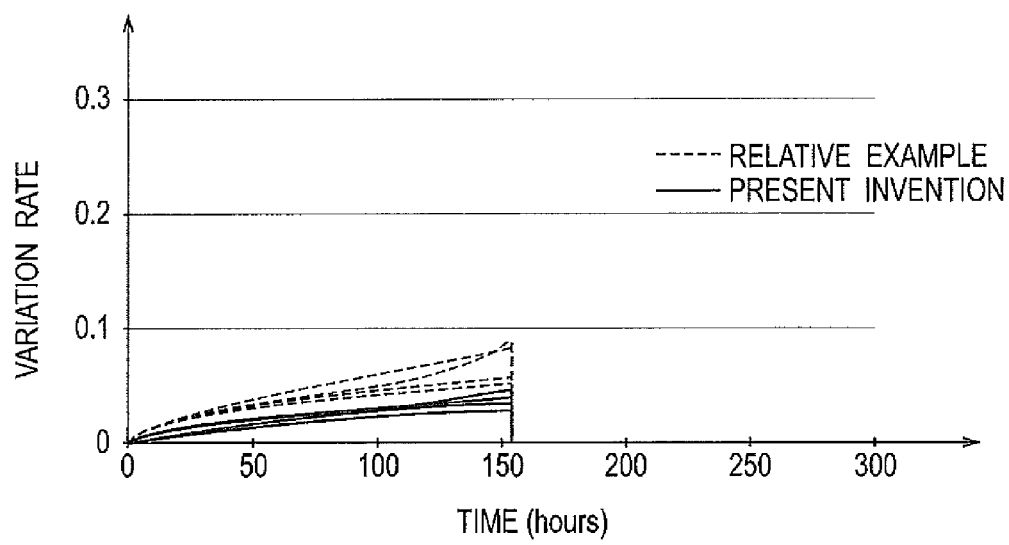
FIG. 26 shows comparison aging data showing the relationship between the rate of change of operating current and time (hr).

Moreover, FIG. 26 expresses the relationship of the rate of change and time (hr) of the operating current based on FIG. 25. In the case of the comparative example equivalent to the constructional example which does not place the oxygen absorption layer 50 on the emitting end surface 100 of a laser beam, when long duration operation is performed, the rise of the operating current Iop (mA) appears, and the rate of the rise of the rate of change of operating current is also large. On the other hand, in the case of the nitride based semiconductor device according to this embodiment, the rise of the passage operating current Iop (mA) does not appear in long duration, and there are also few rates of the rise of the rate of change of operating current compared with the comparative example which does not place the oxygen absorption layer 50 on the emitting end surface 100 of the laser beam, from the aging data showing the relation between the operating current Iop (mA) and time (hr).

Figures 27, 28:
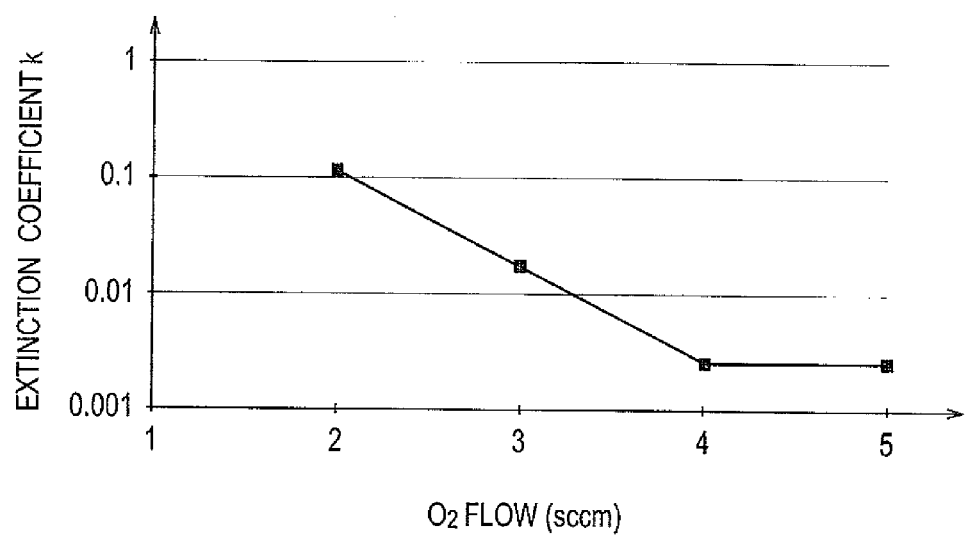
FIG. 27 shows a result of a measurement of an oxygen ($O_2$) flow rate (sccm) at the time of film formation of $ZrO_2$ film, and the value of an extinction coefficient k of $ZrO_2$ film.
FIG. 28 is a chart showing the relationship of the oxygen ($O_2$) flow rate (sccm) at the time of film formation of $ZrO_2$ film, and the value of the extinction coefficient k of $ZrO_2$ film.

FIG. 27 shows the value of the oxygen ($O_2$) flow rate (sccm) at the time of film formation of $ZrO_2$ film, and the extinction coefficient k of $ZrO_2$ film. Moreover, FIG. 28 corresponds to FIG. 27, and shows the relationship of the value of the oxygen ($O_2$) flow rate (sccm) at the time of film formation of $ZrO_2$ film, and the extinction coefficient k of $ZrO_2$ film.

In the nitride based semiconductor device related to a 3rd embodiment, it is clear that the oxygen absorption layer 50 placed on the emitting end surface 100 of the laser beam is preferable to adjust the extinction coefficient in the wavelength of 405 nm to about 0.2 to about 0.002, for example. For example, the oxygen absorption layer 50 may be $ZrO_2$ in which the refractive index is about 2.3 to about 2.6, which are adjusted the extinction coefficient in the wavelength of 405 nm to about 0.2 to about 0.002.

Alternatively, the oxygen absorption layer 50 may be $Al_2O_3$ in which the refractive index is about 1.7 to about 1.9, which are adjusted the extinction coefficient in the wavelength of 405 nm to about 0.2 to about 0.002.

According to the third embodiment, the nitride based semiconductor device which suppressed the end face oxidation, can reduce the degradation of the laser characteristic, and is stabilized long lasting can be provided by placing the film of oxygen absorbability to the emitting end surface of the laser beam.

According to the third embodiment, the nitride based semiconductor device which captures the oxygen which contributes to the end face oxidation, and suppresses the end face oxidation can be provided by placing the scarce film of the membranous quality having absorption (metallic film with many element deficits) on the laser end surface.

Fourth Embodiment

Figure 29:
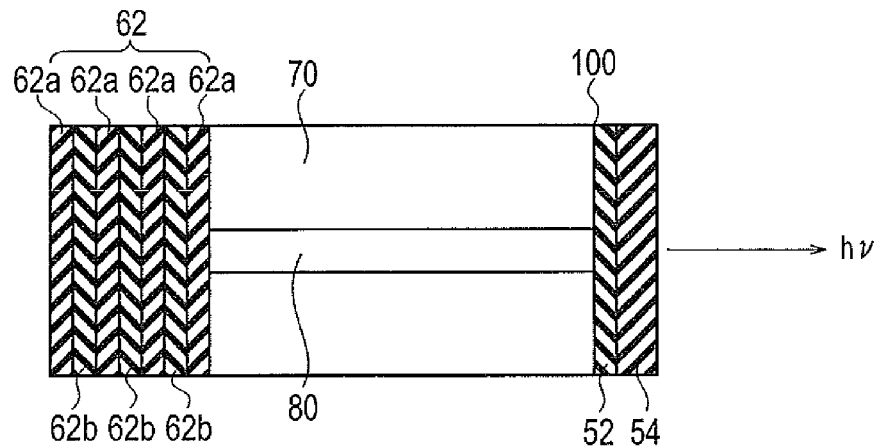
FIG. 29 is a schematic top view of a nitride based semiconductor device according to a fourth embodiment of the present invention.

As schematically shown in the top view of FIG. 29, a nitride based semiconductor device according to a fourth embodiment includes: a nitride based semiconductor laser main unit 70; a laser stripe 80 placed on the nitride based semiconductor laser main unit 70; an oxygen absorption layer 52 placed on the nitride based semiconductor laser main unit 70 and an emitting end surface 100 of the laser beam of a laser stripe 80; and a coating film without consideration for optical absorption 54 placed on the oxygen absorption layer 52.

In this case, in the coating film without consideration for optical absorption 54, "without consideration for optical absorption" is equivalent to the meaning that "does not keep absorption intentionally." In practice, the wrong film of the membranous quality with many element deficits is intentionally formed in the oxygen absorption layer 52, and as compared with this, "the film without consideration for optical absorption" denotes forming the good film by the optimal film formation condition. Therefore, "the coating film without consideration for optical absorption 54" denotes "the good coating film 54 in the aptitude film formation condition which is not keeping optical absorption intentionally."

Furthermore, a DBR (Distributed Bragg Reflector) film 62 placed on the opposite side which opposes the nitride based semiconductor laser main unit 70 and the emitting end surface 100 of the laser beam of the laser stripe 80 may be provided.

The DBR film 62 may be formed with the multilayer film including one of $ZrO_2$, $Al_2O_3$, $SiO_2$, $TiO_2$, $Ta_2O_5$, $Nb_2O_5$, AlN, SiN, AlON, SiON, and $AlN_x$ (where 0<x<1). In this case, the $AlN_x$ (where 0<x<1) indicates the case of the composition ratio, which shifts from the stoichiometry control of AlN.

Moreover, the DBR film 62 has high light reflex characteristics, and may be provided with the layered structure composed of the $ZrO_2$ film 62a and the $SiO_2$ film 62b, for example, as shown in FIG. 29. The thickness d1 of the $ZrO_2$ film 62a and the thickness d2 of the $SiO_2$ film 62b are formed so that $d1=\lambda/4n_1$ and $d2=\lambda/4n_2$ is satisfied (where $n_1$ is the refractive index 2.18 of the $ZrO_2$ film 62a, and $n_2$ is the refractive index 1.46 of the $SiO_2$ film 62b). For example, d1 is about 48 nm and d2 is about 69 nm for $\lambda$=405 nm.

The oxygen absorption layer 52 can apply the layer including one of $ZrO_2$, $Al_2O_3$, $SiO_2$, $TiO_2$, $Ta_2O_5$, $Nb_2O_5$, AlN, SiN, AlON, SiON, and $AlN_x$ (where 0<x<1).

As an example of combination with the oxygen absorption layer 52/the coating film without consideration for optical absorption 54, $ZrO_2/ZrO_2$, $ZrO_2/Al_2O_3$, $AlN/ZrO_2$, etc. are applicable.

The oxygen absorption layer 52 may be $ZrO_2$ in which the refractive index is about 2.3 to about 2.6 adjusted the extinction coefficient in the wavelength of 405 nm to about 0.2 to about 0.002.

Moreover, the oxygen absorption layer 52 may be $Al_2O_3$ in which the refractive index is about 1.7 to about 1.9 adjusted the extinction coefficient in the wavelength of 405 nm to about 0.2 to about 0.002.

As well as the bird's-eye view of FIG. 22 shown in the third embodiment, a nitride based semiconductor device part except for the oxygen absorption layer 52, the coating film without consideration for optical absorption 54, and the DBR film 62 of the nitride based semiconductor device according to the fourth embodiment includes: a GaN based semiconductor substrate 10; an n-type GaN buffer layer 12 placed at the GaN based semiconductor substrate 10; an n-type superlattice cladding layer 14 placed on n-type GaN buffer layer 12; an n-type GaN based guide layer 16 placed on the n-type superlattice cladding layer 14; an InGaN active layer 18 placed on the n-type GaN based guide layer 16; an electron block layer 25 placed on the InGaN active layer 18; and a p-type GaN based guide layer 22 placed on the electron block layer 25.

The nitride based semiconductor device according to the fourth embodiment further includes a p-type superlattice cladding layer 26 placed on the p-type GaN based guide layer 22 at stripe shape, and a p-type GaN based contact layer 28 placed on the p-type superlattice cladding layer 26.

The nitride based semiconductor device according to the fourth embodiment further includes an insulating film 24 placed on the p type GaN based guide layer 22, and placed on the sidewall of the p-type superlattice cladding layer 26 and the p-type GaN based contact layer 28. On the top surface of the p-type GaN based contact layer 28 placed at stripe shape, window opening of the insulating film 24 is performed. In this apertural area by which the window opening is performed, the p-type GaN based contact layer 28 contacts the p-side ohmic electrode 30.

Furthermore, in the nitride based semiconductor device according to the fourth embodiment, the p-side ohmic electrode 30 covers the sidewall part of the p-type superlattice cladding layer 26, and the p type GaN based contact layer 28 which are placed at stripe shape via the insulating film 24, and is placed along with the laser stripe 80 at stripe shape.

Furthermore, in the nitride based semiconductor device according to the fourth embodiment, a p-side electrode 32 is placed on the insulating film 24 which covers the nitride based semiconductor laser main unit 70, and on the p-side ohmic electrode 30 placed at stripe shape along with the laser stripe 80, and an n-side electrode 40 is placed on the GaN based semiconductor substrate 10 at the side of the back side which opposes the surface where the p-side electrode 32 is placed.

The insulating film 24 is formed by $ZrO_2$, for example. Moreover, the p-side ohmic electrode is formed by Pd/Au, for example. The n-side electrode 40 is formed by Al/Ti/Au, for example.

In the nitride based semiconductor device according to the fourth embodiment, as shown in the bird's-eye view of FIG. 23 corresponding to FIG. 21, the oxygen absorption layer 50 and the rear end face protection film 60 are placed so that the end face of both the nitride based semiconductor laser main unit 70 and the laser stripe 80 may be covered in common.

Figure 30:
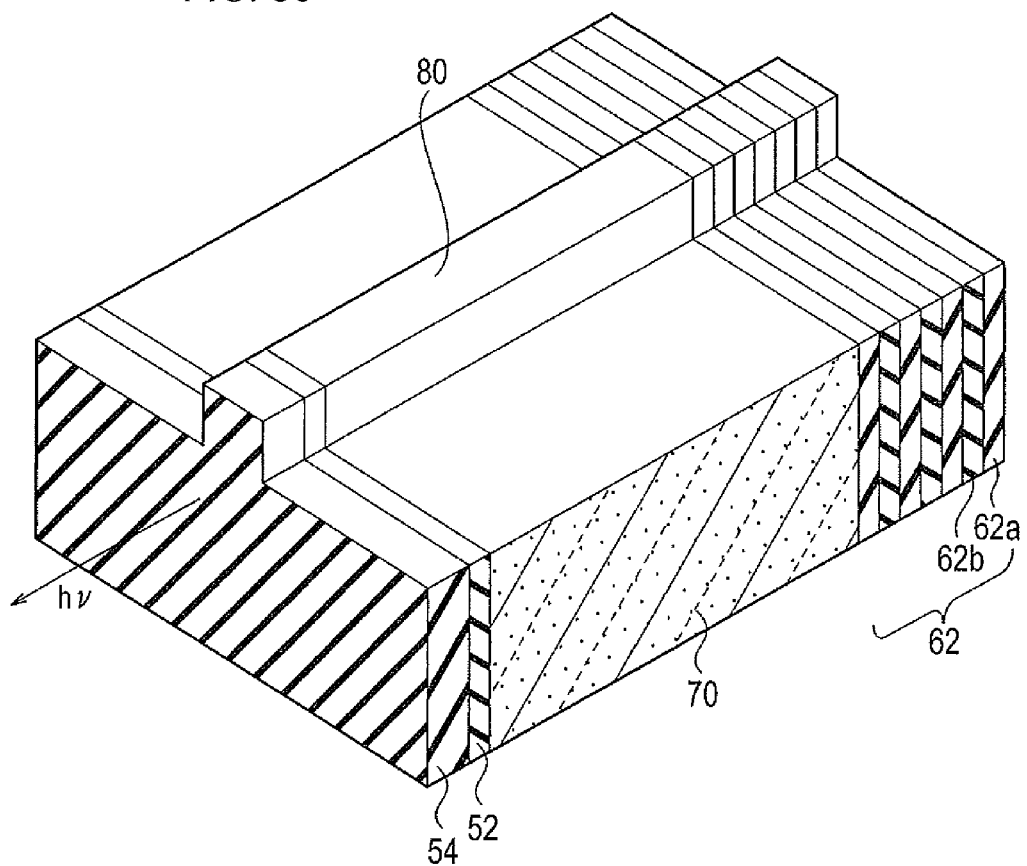
FIG. 30 is a bird's-eye view corresponding to FIG. 29 of the nitride based semiconductor device according to the fourth embodiment of the present invention.

Therefore, as shown in FIG. 22, FIG. 29, and FIG. 30, the nitride based semiconductor device according to the fourth embodiment includes: a GaN based semiconductor substrate 10; n-type semiconductor layers (12, 14, 16) and p-type semiconductor layers (25, 22, 26, 28) which are placed on the GaN based semiconductor substrate 10; an active layer (18) which is placed between the n-type semiconductor layers (12, 14, 16) and the p-type semiconductor layers (25, 22, 26, 28), and includes In; an oxygen absorption layer 50 which is placed in the emitting end surface 100 of the laser beam, and adjusted the extinction coefficient in the wavelength of 405 nm to about 0.2 to about 0.002; and a coating film without consideration for optical absorption 54 placed on the oxygen absorption layer 50.

Figure 31:
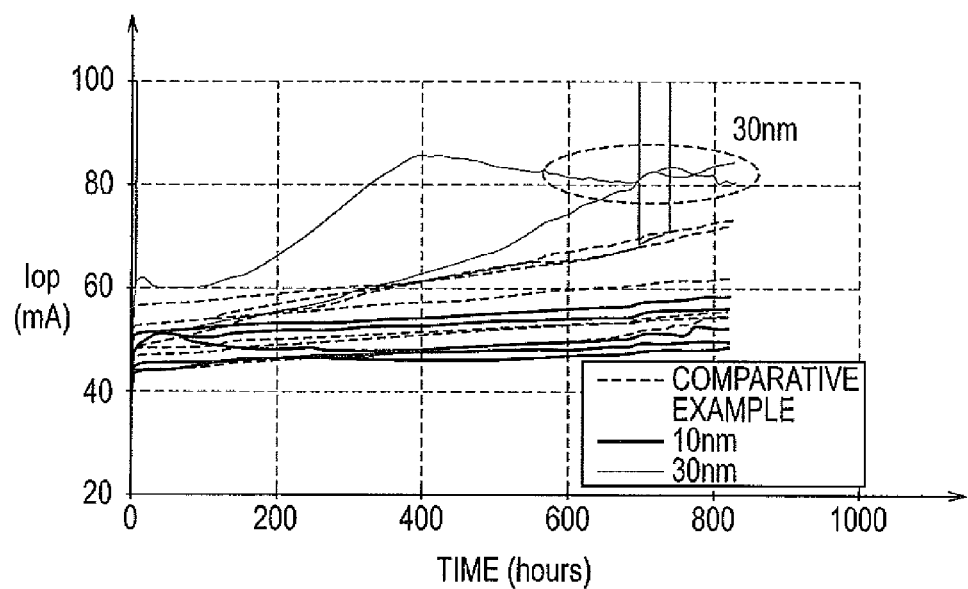
FIG. 31 shows comparison aging data showing the relationship between an operating current Iop (mA) and time (hr) at the time of inserting ZrO2 (the extinction coefficient is 0.11, the wavelength $\lambda$=405 nm) as an oxygen uptake film.

The comparison aging data showing the relationship of the operating current Top (mA) and time (hr) at the time of inserting $ZrO_2$ film which has the extinction coefficient k=0.11 in the wavelength of $\lambda$=405 nm as the oxygen absorption layer 52 is shown in FIG. 31. In this case, $ZrO_2$ film which has the extinction coefficient k=0.002 in the wavelength of $\lambda$=405 nm is used as the coating film without consideration for optical absorption 54. That is, in the example of FIG. 31, the example of combination of the oxygen absorption layer 52/the coating film without consideration for optical absorption 54 corresponds to the case of $ZrO_2/ZrO_2$.

As clearly from the tendency of FIG. 31, when the thick film of the oxygen absorption layer 52 is 30 nm, the temporal change of the operating current Top (mA) is rising greatly compared with the case where the thick film of the oxygen absorption layer 52 is 10 nm, and a comparative example (the case where the oxygen absorption layer 52 is not inserted, i.e., the thick film is 0 nm).

When the thick film of the oxygen absorption layer 52 is relatively as thick as 30 nm, the lights are absorbed within the oxygen absorption layer 52, and, for this reason, the rise of the operating current Top (mA) occurs by occurring of the heat in the oxygen absorption layer 52.

Figure 32:
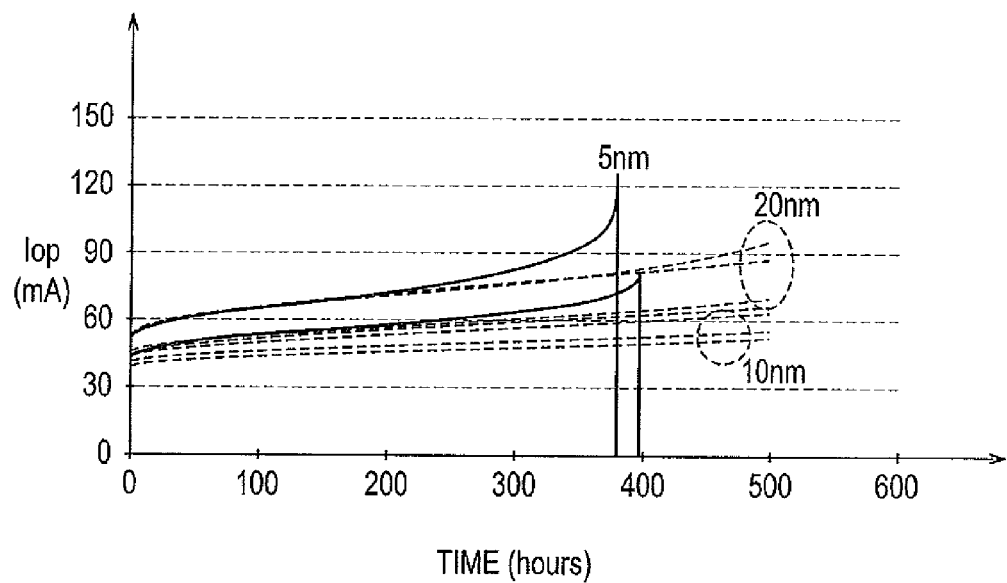
FIG. 32 shows comparison aging data showing the relationship an operating current Iop (mA) and time (hr) at the time of inserting AlN (the extinction coefficient is 0.004, the wavelength $\lambda$=405 nm) as an oxygen uptake film.

The comparison aging data showing the relationship of the operating current Top (mA) and time (hr) at the time of inserting the AlN film which has the extinction coefficient k=0.004 in the wavelength of $\lambda$=405 nm as the oxygen absorption layer 52 is shown in FIG. 32. In this case, $Al_2O_2$ film which has the extinction coefficient k=0.0002 in the wavelength of $\lambda$=405 nm is used as the coating film without consideration for optical absorption 54. That is, in the example of FIG. 32, the example of combination of the oxygen absorption layer 52/the coating film without consideration for optical absorption 54 corresponds to the case of $AlN/Al_2O_3$. As clearly from the tendency of FIG. 32, when the thick film of the oxygen absorption layer 52 is 5 nm, the temporal change of the operating current Top (mA) is rising greatly compared with the case where the thick film of the oxygen absorption layer 52 is 10 nm or 20 nm. When the thick film of the oxygen absorption layer 52 is relatively as thin as about 5 nm, since the oxygen absorption layer 52 may oxidize easily, the rise of the operating current Iop (mA) has occurred.

As clearly from the result of FIG. 31 and FIG. 32, in the nitride based semiconductor device according to the fourth embodiment, it is preferable that the thickness of the oxygen absorption layer 52 placed in the emitting end surface 100 of the laser beam is within the range of about 5 nm to about 20 nm.

Figures 33, 34:
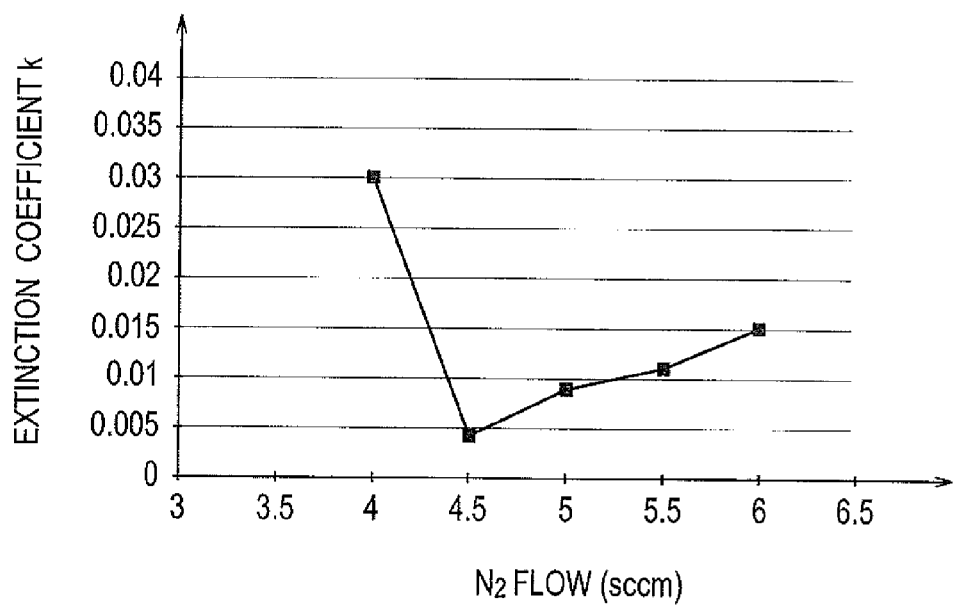
FIG. 33 shows a result of a measurement of a nitrogen ($N_2$) flow rate (sccm) and the value of the extinction coefficient k of an AlN film at the time of film formation of the AlN film.
FIG. 34 is a chart showing the relationship of the nitrogen ($N_2$) flow rate (sccm) and the value of the extinction coefficient k of the AlN film at the time of film formation of the AlN film.

FIG. 33 shows the value of the nitrogen ($N_2$) flow rate (sccm) at the time of film formation of the AlN film, and the extinction coefficient k of the AlN film. Moreover, FIG. 34 corresponds to FIG. 33 and shows the relationship of the value of the nitrogen ($N_2$) flow rate (sccm) at the time of film formation of the AlN film, and the extinction coefficient k of the AlN film.

In the nitride based semiconductor device according to the fourth embodiment, it is clear that the oxygen absorption layer 52 placed on the emitting end surface 100 of the laser beam is preferable to adjust the extinction coefficient in the wavelength of 405 nm to about 0.03 to about 0.0004, for example. For example, the oxygen absorption layer 52 may be AlN in which the refractive index is about 1.9 to about 2.15 adjusted the extinction coefficient in the wavelength of 405 nm to about 0.03 to about 0.0004.

According to the fourth embodiment, the nitride based semiconductor device which suppressed the end face oxidation by placing the film of oxygen absorbability to the emitting end surface of the laser beam, can reduce the degradation of the laser characteristic, and is stabilized long lasting can be provided.

According to the fourth embodiment, the nitride based semiconductor device which captures the oxygen which contributes to the end face oxidation, and suppresses the end face oxidation can be provided by placing the scarce film of the membranous quality which had absorption (metallic film with many element deficits) in the laser end surface.

Fifth Embodiment

Figure 35:
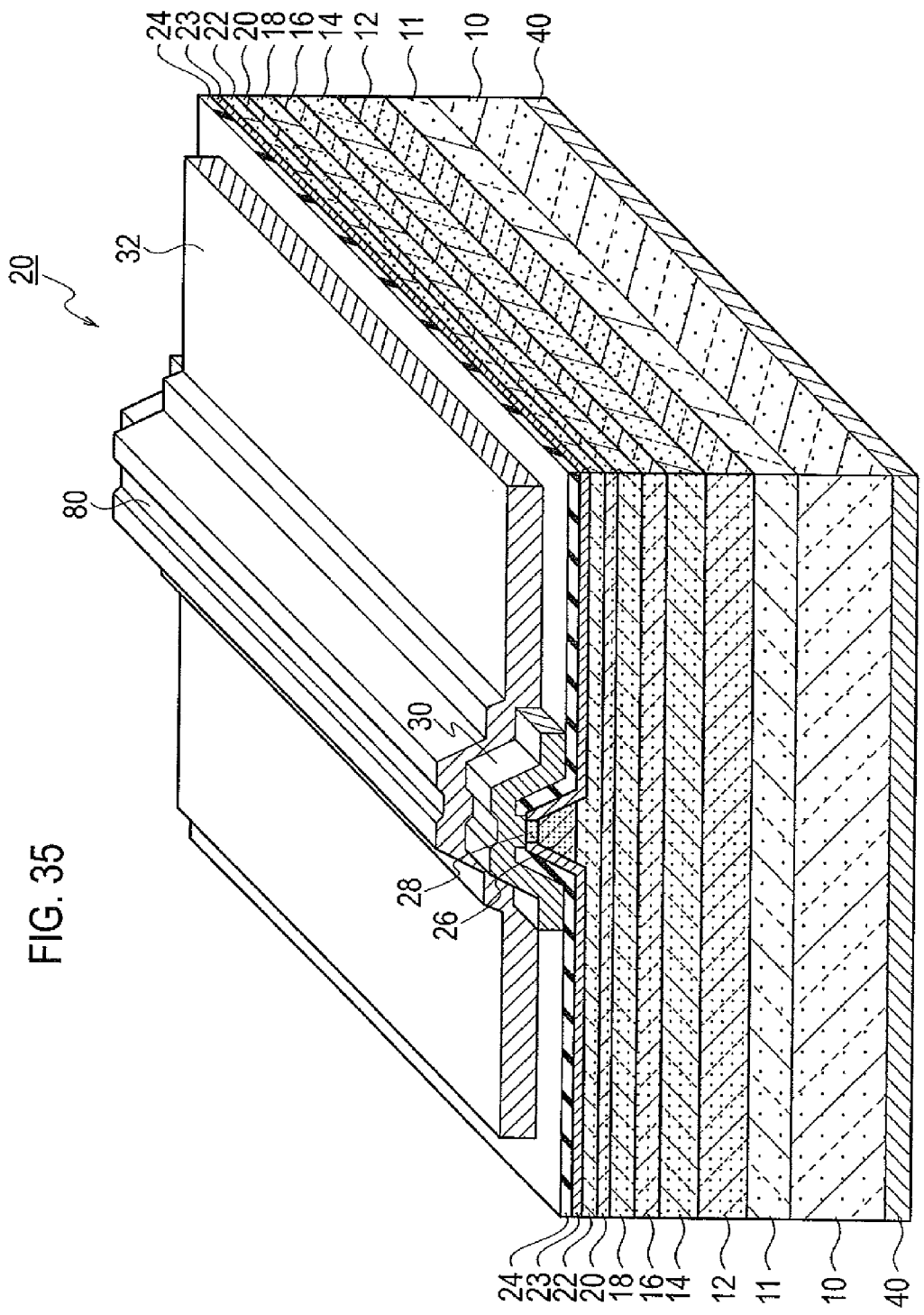
FIG. 35 is a schematic bird's-eye view of a nitride based semiconductor device according to a fifth embodiment of the present invention.

As schematically shown in the bird's-eye view of FIG. 35, a nitride based semiconductor device 20 according to a fifth embodiment of the present invention includes: a GaN based semiconductor substrate 10; a regrowth layer 11 placed on the GaN based semiconductor substrate 10; a crack prevention layer 12 placed on the regrowth layer 11; an n-type superlattice cladding layer 14 placed on the crack prevention layer 12; an n-type GaN guide layer 16 placed on the n-type superlattice cladding layer 14; an InGaN active layer 18 placed on the n-type GaN guide layer 16; an electron block layer 20 placed on the InGaN active layer 18; and a p-type GaN guide layer 22 placed on the electron block layer 20.

The nitride based semiconductor device 20 according to the fifth embodiment further includes a p-type superlattice cladding layer 26 placed on the p-type GaN guide layer 22 at stripe shape, and a p-type GaN contact layer 28 placed on the p-type superlattice cladding layer 26.

The nitride based semiconductor device 20 according to the fifth embodiment further includes an adhesion layer 23 placed on the p-type GaN guide layer 22 and placed on the sidewall of the p-type superlattice cladding layer 26 and the p-type GaN contact layer 28, and an insulating film 24 placed on the adhesion layer 23.

On the top surface of the p-type GaN contact layer 28 placed at stripe shape, window opening of the insulating film 24 is performed. In this apertural area by which the window opening is performed, the p-type GaN contact layer 28 contacts the p-side ohmic electrode 30.

Furthermore, in the nitride based semiconductor device 20 according to the fifth embodiment, the p-side ohmic electrode 30 covers the sidewall part of the p-type superlattice cladding layer 26 and the p type GaN contact layer 28 which are placed at stripe shape via the insulating film 24, and is placed along with the laser stripe 80 at stripe shape.

Furthermore, in the nitride based semiconductor device 20 according to the fifth embodiment, a p-side electrode 32 is placed on the p-side ohmic electrode 30 placed at stripe shape on the insulating film which covers the nitride based semiconductor laser main unit 24, and along with the laser stripe 80, and an n-side electrode 40 is placed on the GaN based semiconductor substrate 10 on the side of the back side which opposes the surface where the p-side electrode 32 is placed.

The bird's-eye view of FIG. 35 shows a chart which performed cleavage of the laser device in the cleavage plane, and cut the element in the direction in parallel to the resonance surface.

As shown in FIG. 35, the nitride based semiconductor device 20 according to the fifth embodiment includes: a GaN based semiconductor substrate 10; n-type semiconductor layers (12, 14, 16) placed on the GaN based semiconductor substrate 10; an active layer 18 including In and placed on the n-type semiconductor layers (12, 14, 16); p-type semiconductor layers (20, 22) placed on the active layer 18; compound semiconductor layers (26, 28) which are placed on the p-type semiconductor layers (20, 22), and include ridge shape; an adhesion layer 23 placed on the sidewall of the ridge shape of the compound semiconductor layers (26, 28); and an insulating film 24 placed on the adhesion layer 23.

The adhesion layer 23 is composed of a metal layer or an element semiconductor layer.

The metal layer, which composes the adhesion layer 23, is composed of any one kind in Zr, Al, Ti, and Ta, for example.

Alternatively, the element semiconductor layer, which composes the adhesion layer 23, may be composed of Si, for example.

The thickness of the adhesion layer 23 is not more than 10 nm.

The insulating film 24 is composed of any one kind in a $ZrO_2$ film, an $SiO_2$ film, an SiN film, an $Al_2O_2$ film, an AlN film, a $TiO_2$ film, and a $Ta_2O_5$ film. Moreover, the p-side ohmic electrode 30 and the p-side electrode 32 are formed by Pd/Au, for example. The n-side electrode 40 is formed by Al/Ti/Au, for example.

Figure 36:
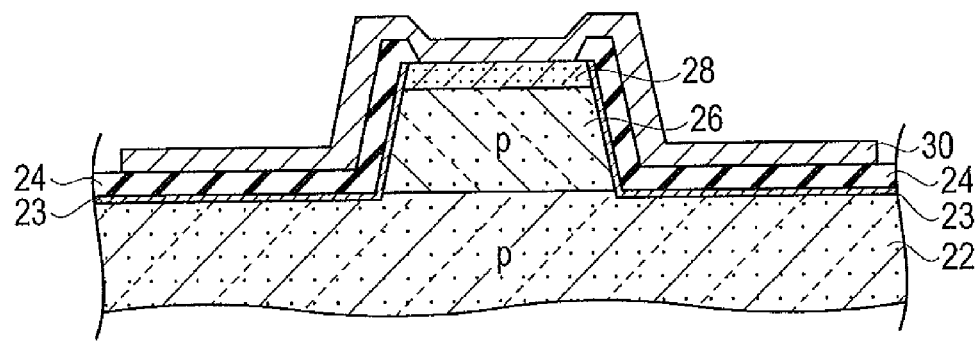
FIG. 36 is a schematic cross-sectional configuration chart of a ridge part of the nitride based semiconductor device according to the fifth embodiment of the present invention.

As shown in FIG. 36, a schematic section structure of the ridge part of the nitride based semiconductor device according to the fifth embodiment includes: a p-type GaN guide layer 22; a p-type superlattice cladding layer 26 placed on the p-type GaN guide layer 22; a p-type GaN contact layer 28 placed on the p-type superlattice cladding layer 26; an adhesion layer 23 formed on the p-type GaN guide layer 22 and the sidewall of the p-type superlattice cladding layer 26 and the p-type GaN contact layer 28; an insulating film 24 placed on the adhesion layer 23; and a p-side ohmic electrode 30 formed on the insulating film 24 and the p-type GaN contact layer 28.

Figure 37:
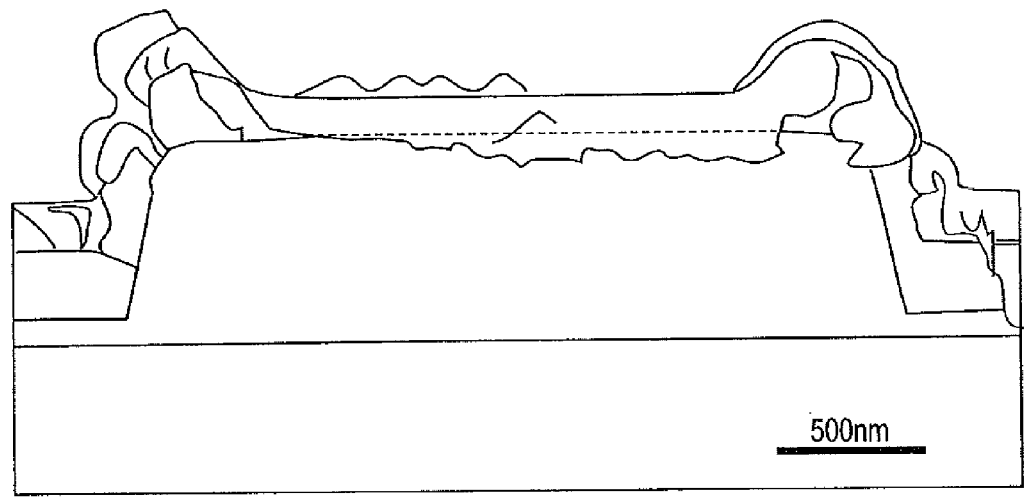
FIG. 37 shows an SEM photograph of the ridge part of the nitride based semiconductor device according to the fifth embodiment of the present invention.

As an SEM photograph of the ridge part of the nitride based semiconductor device according to the fifth embodiment is shown in FIG. 37, for example, by covering the insulating film 24 via the adhesion layer 23, the adhesion to the ridge sidewall becomes satisfactory and the thing in which the insulating film 24 exfoliated is not observed.

Figure 7:
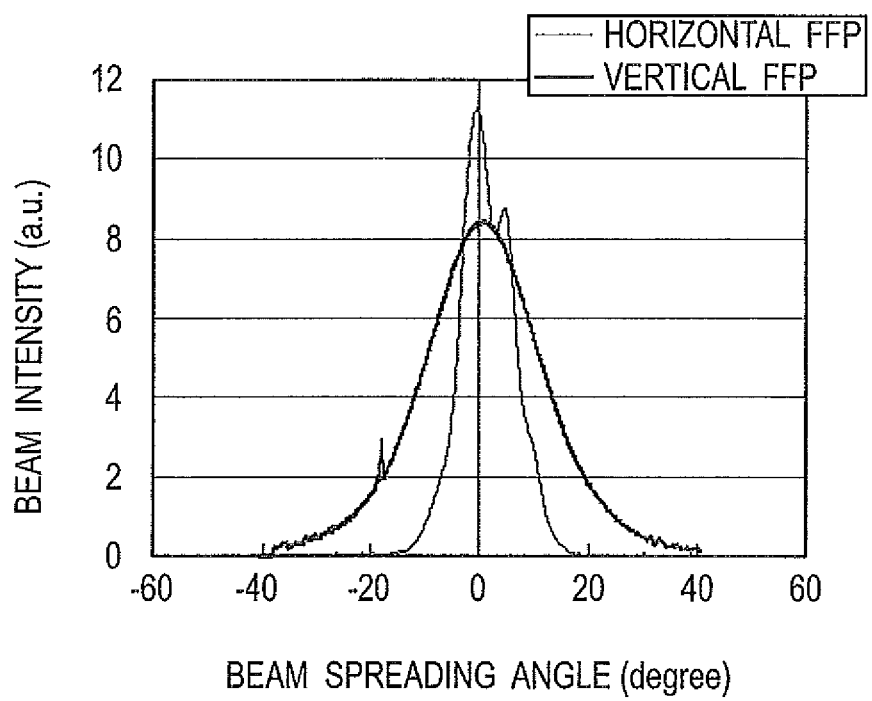
FIG. 7 is a chart showing the relationship of the horizontal and vertical beam-spreading angle and beam intensity of the nitride based semiconductor device according to the conventional example.
Figure 38:
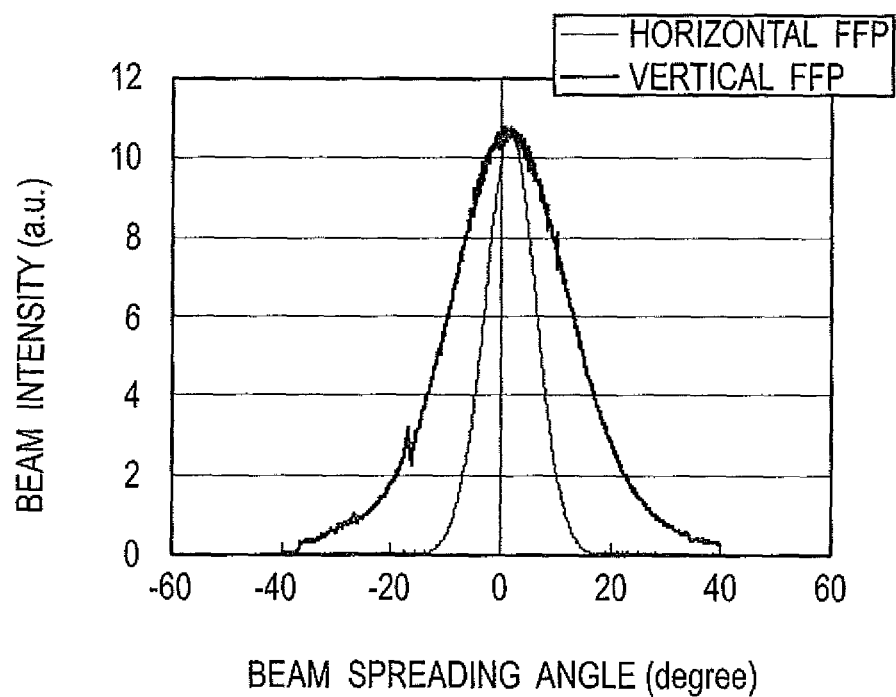
FIG. 38 shows the relationship of the horizontal and vertical beam spreading angle and beam intensity of the nitride based semiconductor device according to the fifth embodiment of the present invention.

The relation between the beam intensity and a horizontal and vertical beam spreading angle of the nitride based semiconductor device according to the fifth embodiment is expressed, for example, as shown in FIG. 38. Compared with the conventional structure shown in FIG. 7, in particular, the symmetry of horizontal FFP is improved, and the half width at half maximum of vertical FFP is also narrow.

In the nitride based semiconductor device according to the fifth embodiment, the adhesion between the insulating film 24 and the compound semiconductor layers (26, 28) can be improved by forming the adhesion layer 23 which is composed of the metal layer of an ultra-thin layer or element semiconductor layer of the degree which does not have influence for light to confine between the compound semiconductor layers (26, 28) and the insulating film 24. Accordingly, the degradation of the laser initial characteristic that the shape of beam collapses can be reduced.

In the nitride based semiconductor device according to the fifth embodiment, the scarce film of the membranous quality stops existing in the interface with the compound semiconductor layers (26, 28), and the adhesion improves by inserting the good-quality film of a ultra thin layer (stoichiometric composition is a general value or simple substance metal, and a semiconductor layer), and selecting the film of the same configuration as the element which composes the insulating film 24 to laminate as this good-quality film.

In the nitride based semiconductor device according to the fifth embodiment, this good-quality film is formed by performing trace sputtering of the target of reactant film deposition apparatus with Ar plasma. Even if this method changes to vacuum evaporation or CVD (Chemical Vapor Deposition), the effect of the present invention is the same.

(Fabrication Method)

A fabrication method of the nitride based semiconductor device according to the fifth embodiment includes: the step of forming the n-type semiconductor layers (12, 14, 16) on the GaN based semiconductor substrate 10; the step of forming the active layer 18 including In on the n-type semiconductor layers (12, 14, 16); the step of forming the p-type semiconductor layers (20, 22) on the active layer 18; the step of forming the compound semiconductor layers (26, 28) including ridge shape on the p-type semiconductor layers (20, 22); the step of forming the adhesion layer 23 on the sidewall of the ridge shape of the compound semiconductor layers (26, 28); and the step of forming the insulating film 24 on the adhesion layer 23.

The step of forming the adhesion layer has the step of sputtering of the metal layer or the element semiconductor layer from a target by Ar plasma irradiation.

In the step of forming the insulating film 24 on the compound semiconductor layers (26, 28) of ridge shape in the fabricating process of the nitride based semiconductor device according to the fifth embodiment, it illuminates with Ar plasma within the insulating film deposition apparatus before formation of the insulating film 24. Since the sputtering of the metal membrane of a trace is performed by this Ar plasma irradiation from the target 44 in the insulating film deposition apparatus, the metal layer can be formed as the adhesion layer 23 between the insulating film 24 and the compound semiconductor layers (26, 28), for example. Then, the insulating film 24 is formed and it is possible of formation of the insulating film, which sandwiched the metal layer acting as the adhesion layer 23.

Moreover, the element semiconductors, such as Si, can also form the target at the time of this plasma irradiation as the adhesion layer 23 by applying as the element semiconductor (for example, Si).

Since the Ar plasma irradiation is not the step that would form membranes positively (high frequency is not applied to the target 44), the metal layer of the trace can be formed. For example, since about 30 nm is formed by the plasma irradiation for 30 minutes, it is possible to control by the deposition rate of 1 nm/minute.

Figure 39:
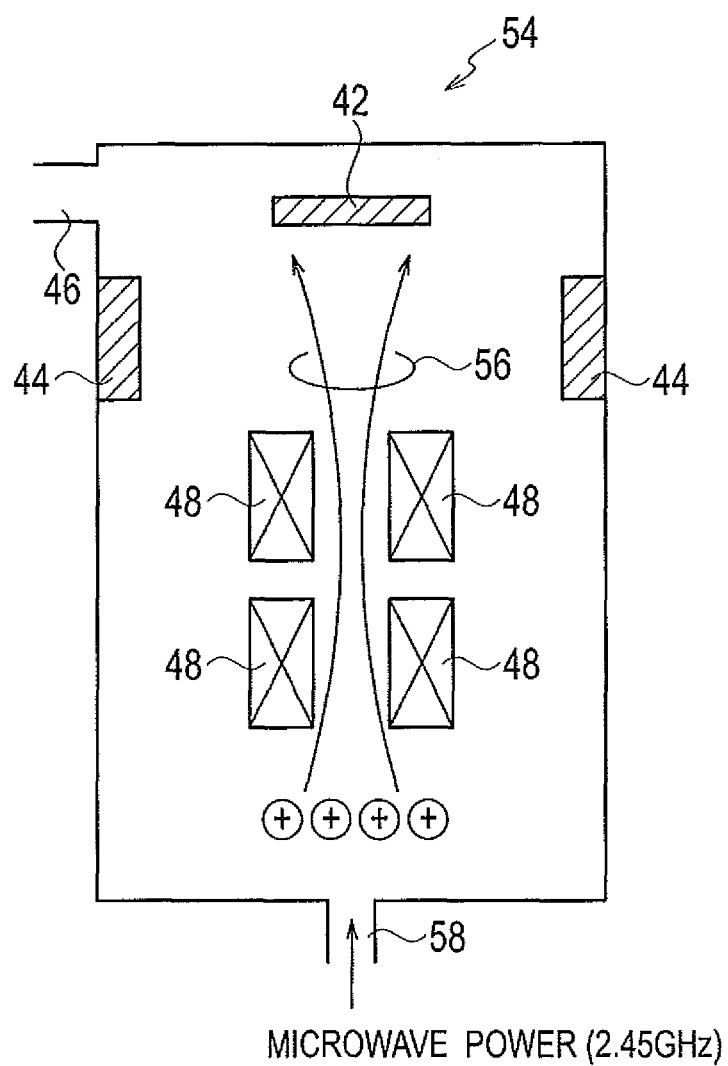
FIG. 39 is a schematic cross-sectional configuration chart of an ECR sputter device applied to a fabrication method of the nitride based semiconductor device according to the fifth embodiment of the present invention.

As shown in FIG. 39, as an insulating film deposition apparatus 54 applied to the fabrication method of the nitride based semiconductor device according to the fifth embodiment, a schematic section structure of an ECR sputter device includes: a microwave plasma introductory unit (microwave: 2.45 GHz) 58; an evacuation unit 46; an ECR generating magnet 48; a target 44; an ECR plasma 56; and a device placing unit 42.

Figure 40:
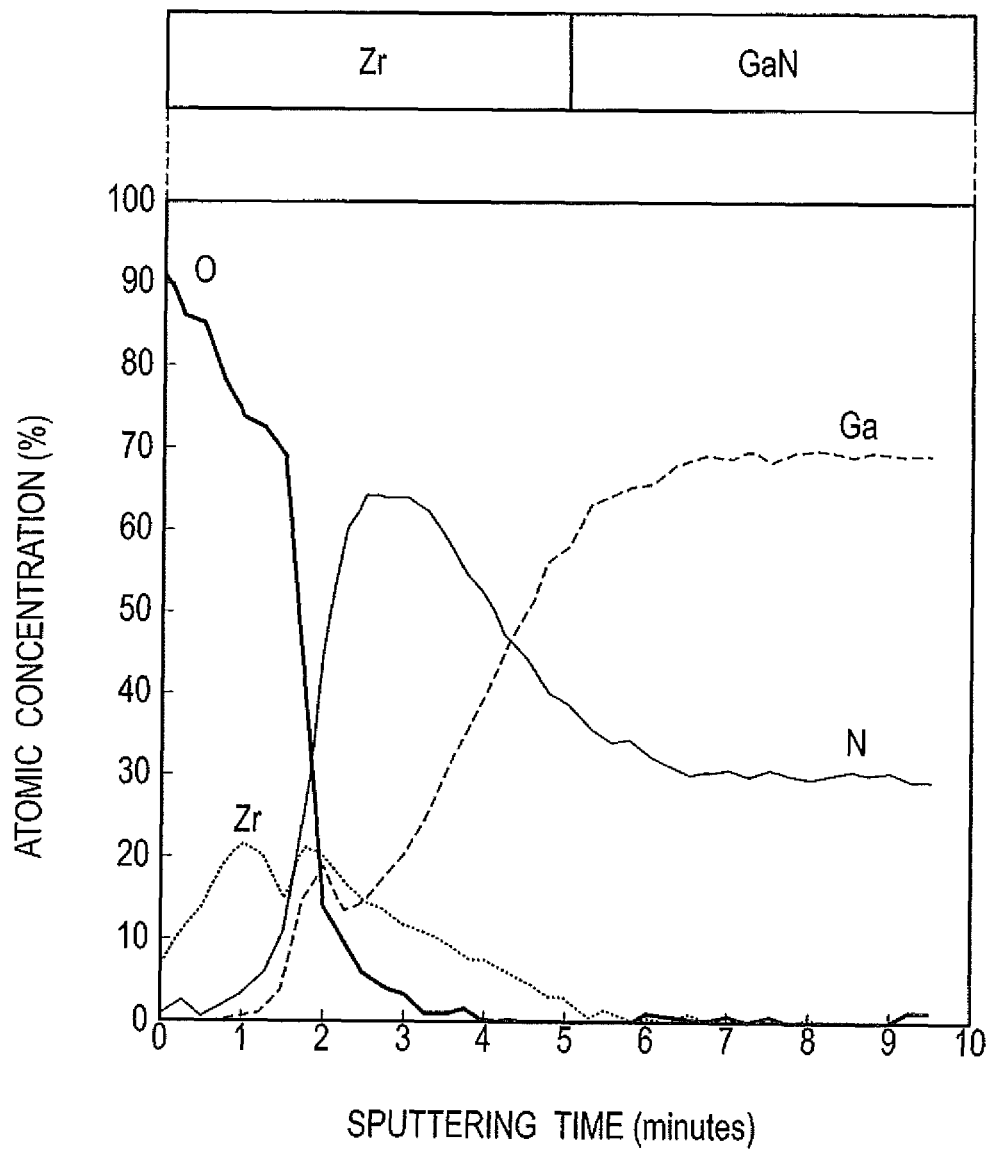
FIG. 40 shows an analysis result of the Auger depth direction of a sample, which illuminates with Ar plasma for 30 minutes, in the fabrication method of the nitride based semiconductor device according to the fifth embodiment of the present invention.

In the fabrication method of the nitride based semiconductor device according to the fifth embodiment, an Auger in-depth analysis result of a sample, which illuminated with Ar plasma for 30 minutes is expressed, as shown in FIG. 40. A vertical axis expresses atomic concentration (%) and a horizontal axis expresses sputtering time (minutes). The example using Zr as the target 44 is expressed.

According to $SiO_2$ conversion, the sputtering rate is about 6 nm/minute, for example. Therefore, since the signal of Zr continues from the sample surface to about 5 minutes, it can read that the membranes are formed by about 30 nm.

Hereinafter, the fabrication method of the nitride based semiconductor device according to the fifth embodiment will be explained in full detail.

(a) Setting a wafer, which applies the GaN based semiconductor substrate 10 to the principal surface in the reactor of an MOCVD system, and growing up 2 micrometers of the regrowth layer 11 composed of GaN, which is doped of Si of $1\times10^{18}/cm^3$ on this GaN based semiconductor substrate 10 at 1050 degrees C.

(b) Next, growing up the crack prevention layer 12 composed of InGaN, which is doped of Si of $5\times10^{18}/cm^3$ on the regrowth layer 11 by a 500 angstrom thick film. The crack can be prevented from entering into Al mixed crystal by growing up this crack prevention layer 12 with the n-type nitride based semiconductor (preferably InGaN) including In.

(c) Next, forming the n-type superlattice cladding layer 14 which has the superlattice structure of 1.3 micrometers of the total thick films that laminate 260 layers of a first layer of 25 angstrom composed of n-type $Al_{0.1}Ga_{0.9}N$, which doped Si $5\times10^{18}/cm^3$ and a second layer of 25 angstrom composed of undoped GaN by turns on the crack prevention layer 12. This n-type superlattice cladding layer 14 has a carrier and a optical confinement effect, and its band gap is higher than GaN, and it is preferable to apply as the superlattice layers including AlGaN whose refractive index is lower than GaN, and it can form an effective crystalline cladding layer without a crack by applying the superlattice layers.

(d) Next, growing up the n-type GaN guide layer 16 composed of n-type GaN, which is doped of Si of $5\times10^{18}/cm^3$ on the n-type superlattice cladding layer 14 by a 0.1 micrometer thick film. This n-type GaN guide layer 16 acts as a light guide layer of the InGaN active layer 18.

(e) Next, growing up the InGaN active layer 18 of the MQW (Multiple Quantum Well structure) of 175 angstrom of the total thick films that laminate a well layer of 25 angstrom composed of $In_{0.2}Ga_{0.8}N$ and a barrier layer of 50 angstrom composed of $In_{0.05}Ga_{0.95}N$ by turns on the n-type GaN guide layer 16.

(f) Next, growing up the electron block layer 20 composed of p-type $Al_{0.1}Ga_{0.9}N$, which is doped of Mg of $1\times10^{20}/cm^3$ with a larger band gap than the p-side light guide layer by a 300 angstrom thick film on the InGaN active layer 18.

(g) Next, growing up the p-type GaN guide layer 22 composed of p-type GaN, which is doped of Mg of $1\times10^{20}/cm^3$ with a smaller band gap than the electron block layer 20 by a 0.1 micrometer thick film on the electron block layer 20. This p-type GaN guide layer 22 acts as a light guide layer of the InGaN active layer 18.

(h) Next, forming the p-type superlattice cladding layer 26 composed of superlattice layers of 0.4 micrometer of the total thick films that laminate a first layer of 25 angstrom composed of p-type $Al_{0.1}Ga_{0.9}N$ which is doped of Mg of $1\times10^{20}/cm^3$ and a second layer of 25 angstrom composed of p-type GaN, which is doped of Mg of $1\times10^{20}/cm^3$ by turns on the p-type GaN guide layer 22. This p-type superlattice cladding layer 26 acts as a carrier confining layer as well as the n-type superlattice cladding layer 14, and acts by applying as the superlattice structure as a layer for reducing the specific resistance at the side of the p-type layer.

(i) Finally, growing up the p-type GaN contact layer 28 composed of p-type GaN, which is doped of Mg of $2\times10^{20}/cm^3$ by a 150 angstrom thick film.

(j) After completing of element structure film formation, performing annealing for a wafer at 700 degrees C. among a nitrogen atmosphere, and apply further the p-type superlattice cladding layer 26 and the p-type GaN contact layer 28 into low resistance. The wafer is extracted after annealing, and as shown in FIG. 35 to FIG. 37, the p-type GaN contact layer 28 of the top layer and the p-type superlattice cladding layer 26 are etched with the dry etching apparatus, and the ridge shape which has the stripe width of 2 micrometers is formed.

(k) Next, illuminating with Ar plasma within the insulating film deposition apparatus 54 except this ridge upper part, and forming the ultra-thin adhesion layer 23 composed of a Zr metal. The thick film is about 5 nm to 10 nm, for example. Since high frequency is not applied to the target 44 in the insulating film deposition apparatus 54 at the time of the Ar plasma irradiation, the positive film formation from the target 44 does not occur, but the sputtering of the Zr of the trace is performed by the Ar plasma of extremely low energy, and the film formation is achieved. Accordingly, it becomes possible to form Zr film of a ultra thin layer.

(l) After this Ar plasma irradiation, forming the insulating film 24 composed of $ZrO_2$ except the ridge upper part.

(m) Next, forming in the ridge surface the p-side ohmic electrode 30 composed of Pd/Au. The ridge formation position is adjusted with the plane direction of the GaN based semiconductor substrate 10, and it is placed so that m-plane may be applied into a cleavage plane (resonance surface).

(n) Next, forming the p-side electrode 32 which electrically connected with the p-side ohmic electrode 30 via this insulating film 24.

(o) After formation of the p-side electrode 32, grinding and sliming down the backside of the GaN based semiconductor substrate 10 of the wafer. More specifically, it slims down by mechanical polishing operations with a diamond whetstone to a thickness of not more than 100 micrometers (it is from the final thick film to 10 micrometer thick film thickness preferable). Next, the polishing work using the diamond slurry of two kinds of particle diameter removes the affected layer generated in mechanical polishing operations. Next, mirror figuring of finishing is performed using CMP (Chemical Mechanical Polishing) technology. Slimming down to the target thick film of 80 micrometers is performed through such a step.

(p) Next, forming the n-side electrode 40 composed of Al/Ti/Al on the whole backside of the GaN based semiconductor substrate 10 in which element structure is not formed.

(q) Next, cleaving the substrate on the surface of vertical to the stripe (surface equivalent to the resonance surface), i.e., m-plane of the GaN based semiconductor substrate 10, and fabricating the resonance surface to the end face of the InGaN active layer 18. The shape is changed from a wafer state to bar state at this cleavage step. The dielectric multilayer composed of $SiO_2$ and $ZrO_2$ is formed on the resonance surface of the element of this bar state, and in the direction in parallel to the p-side electrode 32, the bar is cut and it is applied as the laser chip.

Figure 41:
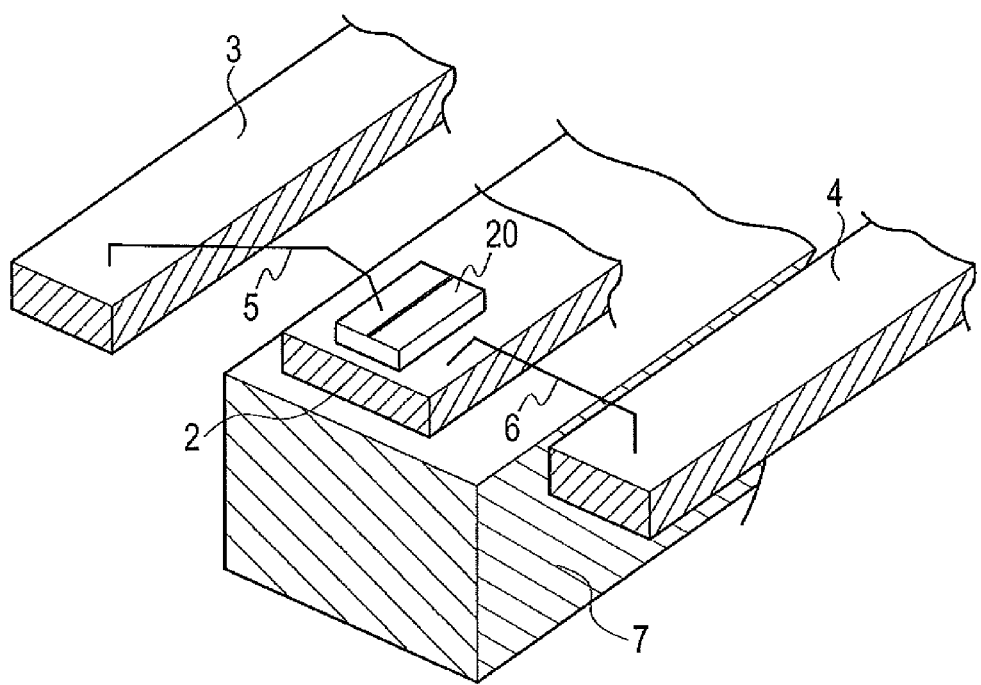
FIG. 41 is a chart for explaining a mounting mount state of the nitride based semiconductor device according to the fifth embodiment of the present invention.

(r) As shown in FIG. 41, installing the laser chip composed of the nitride based semiconductor device 20 on the sub-mount 2 by junction-up (the back side of the GaN based semiconductor substrate 10 is the heat sink 7 side), and installing the sub-mount 2 on the heat sink 7 of a stem, performing the wire bonding of the p-side electrode 32, and applying as a finished product. The p-side electrode 32 and the electrically conductive pin 3 are connected with the golden (Au) wire 5, and the n-side electrode 40 and the electrically conductive pin 4 are connected with Au wire 6.

When the room temperature laser oscillation was tried with this finished product, the continuous oscillation with the oscillation wavelength of 405 nm was verified in room temperature, with the threshold current density 2.5 $kA/cm^2$ and the threshold voltage 4.5 V, and the life time of 500 hours or more was shown.

According to this embodiment, the nitride based semiconductor device which prevents the exfoliation of the insulating film of the ridge sidewall part, and improves the far field pattern, and the fabrication method for the nitride based semiconductor device can be provided.

Sixth Embodiment

Element Structure

Figure 42:
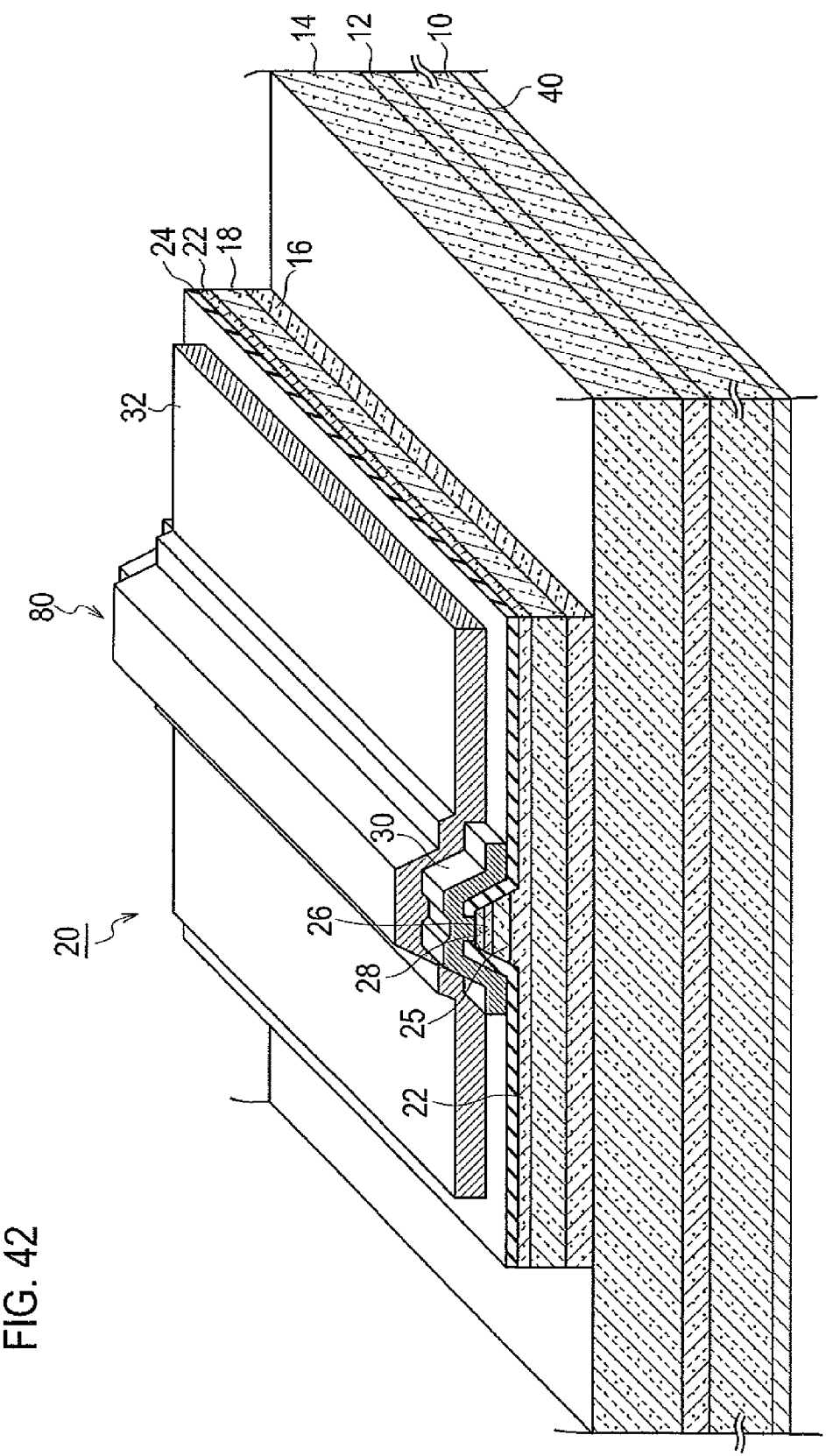
FIG. 42 shows a nitride based semiconductor device according to a sixth embodiment of the present invention, and is a schematic bird's-eye view structural drawing provided with a first step region which forms a laser stripe 80 on a p-type GaN based guide layer 22, and a second step region which is formed by removing an n-type GaN based guide layer 16 in the extension direction and parallel direction of a laser stripe 80.

A schematic bird's-eye view structure of a nitride based semiconductor device 20 according to a sixth embodiment having a first step region which forms a laser stripe 80 on a p-type GaN based guide layer 22 and a second step region which removes and forms an n-type GaN based guide layer 16 in the extension direction and parallel direction of the laser stripe 80 is expressed as shown in FIG. 42.

Figure 43:
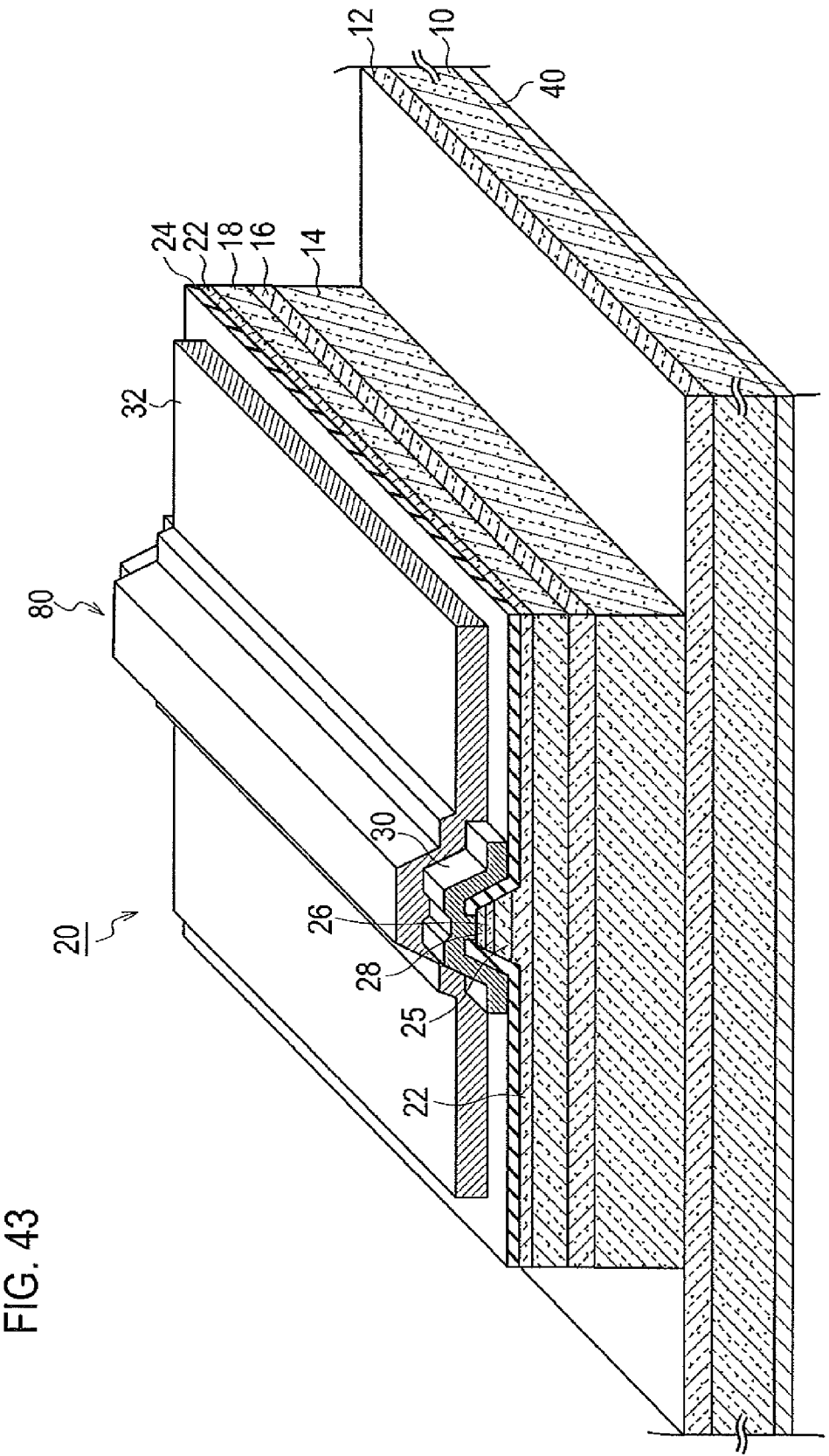
FIG. 43 shows another constructional example of the nitride based semiconductor device according to the sixth embodiment of the present invention, and a schematic bird's-eye view structural drawing provided with a first step region which forms the laser stripe 80 on the p-type GaN based guide layer 22, and a second step region which removed and formed a part of or all of an n-type GaN based cladding layer 14 in the extension direction and parallel direction of the laser stripe 80 in addition to the n-type GaN based guide layer 16.

Moreover, a schematic bird's-eye view structure of another constructional example of the nitride based semiconductor device 20 according to the sixth embodiment having a first step region which forms the laser stripe 80 on the p-type GaN based guide layer 22 and a second step region which removes and forms a part of or all of the n-type GaN based cladding layer 14 in the extension direction and parallel direction of the laser stripe 80 is expressed as shown in FIG. 43.

As schematically shown in the bird's-eye view of FIG. 42, the nitride based semiconductor device 20 according to the sixth embodiment includes: a GaN based semiconductor substrate 10; an n-type GaN based buffer layer 12 which is placed on the GaN based semiconductor substrate 10, and is doped of the n-type impurity; the n-type GaN based cladding layer 14 which is placed on the n-type GaN based buffer layer 12, and is doped of the n-type impurity; the n-type GaN based guide layer 16 which is placed on the GaN based cladding layer 14 and is doped of the n-type impurity, and in which the band gap is smaller than the n-type GaN based cladding layer 14; an active layer 18 placed on the n-type GaN based guide layer 16; the p-type GaN based guide layer 22 which is placed on the active layer 18 and is doped the p-type impurity; an electron block layer 25 placed on the p-type GaN based guide layer 22; a p-type GaN based cladding layer 26 which is placed on the electron block layer 25, and is doped of the p-type impurity; the first step region which removes all or a part of the p-type GaN based cladding layer 26, and forms the laser stripe 80 on the p-type GaN based guide layer 22; and the second step region which removes and forms the n-type GaN based guide layer 16 in the extension direction and parallel direction of the laser stripe 80.

In addition, aluminum (Al) may be included in the n-type GaN based cladding layer 14 and the p-type GaN based cladding layer 26.

The structure for increasing current concentration is formed by the first step region, and the laser cavity is formed by a part of the second step region by mostly centering on the active layer 18. The laser cavity is because it is formed below the first step region.

Furthermore, as the nitride based semiconductor device 20 according to the sixth embodiment is schematically shown in the bird's-eye view of FIG. 43, the second step region may remove a part of or all of the n-type GaN based cladding layer 14, and may be formed.

Moreover, in FIG. 42 and FIG. 43, the insulating film 24 placed on the n-type GaN based cladding layer 14 is omitting illustration, in order to show the element structure clearly. Moreover, the insulating film 24 placed at the sidewall part of the p-type GaN based guide layer 22, the active layer 18, and the n-type GaN based guide layer 16 is omitting illustration similarly.

In the first step region, it is effective at the point where the height of the first step region is smaller than the height of the second step region alleviates the stress concentrated on the stripe step corner for current concentration and optical confinement (the first step region), and improves the reliability of the element.

It is effective at the point where the length of the flat part of the direction vertical to the extension direction of the laser stripe 80 in the first step region is sufficiently smaller than the length of the flat part of the direction vertical to the extension direction of the laser stripe 80 in the second step region alleviates the stress concentrated on the first step region, and improves the reliability of an element.

The active layer 18 may be provided with the MQW structure of an $In_zGa_{1-z}N$ layer (where $0<=z<1$) as the barrier layer and an $In_uGa_{1-u}N$ layer (where $0<=z<u<=1$) as the well layer.

The n-type GaN based cladding layer 14 may be provided with the superlattice structure including the nitride based semiconductor including Al.

The n-type GaN based guide layer 16 may be composed of $Al_xIn_yGa_{1-x-y}N$ (where $0<=x$, $0<=y$, $x+y<=1$).

The electron block layer 25 may be composed of an $Al_yGa_{1-y}N$ layer (where $0<y<=1$).

It is preferable that the number of pairs of the MQW structure, which composes the active layer 18 is not more than three in order to raise the recombination efficiency of the injected electron-hole pairs.

The p-type cladding layer 26 is patterned and is removed by etching, and as shown in FIG. 42 and FIG. 43, a part of the patterned p-type cladding layer 26 is placed along the extension direction of the laser stripe 80 at stripe shape. On the p-type cladding layer 26, the p-type GaN based contact layer 28 is further placed along the extension direction of the laser stripe 80.

Moreover, the insulating film 24 placed on the flat part and the sidewall part of the p-type GaN based guide layer 22, and placed on the sidewall part of the p type GaN based contact layer 28 is provided. The window opening of the insulating film 24 is performed on the top surface of the p-type GaN based contact layer 28 placed at stripe shape. In this apertural area by which the window opening is performed, the p-type GaN based contact layer 28 contacts the p-side ohmic electrode 30.

The p-side ohmic electrode 30 covers the sidewall part of the p-type cladding layer 26 and the p-type GaN based contact layer 28 which are placed at stripe shape via the insulating film 24, and is placed along the extension direction of the laser stripe 80 at stripe shape.

The p side electrode 32 is placed on the p-side ohmic electrode 30 placed at stripe shape along on the extension direction of the insulating film 24 and the laser stripe 80, and the n-side electrode 40 is placed on the GaN based semiconductor substrate 10 at the side of the back side which opposes the surface where the p-side electrode 32 is placed.

(Stress)
—Elastic Constant—

For example, since the value of the lattice constant of $Al_{0.1}Ga_{0.9}N$ layer of the a-axial direction is smaller than the value of 3.1892 angstrom of the lattice constant of the a-axial direction of GaN about 0.25%, the tensile stress acts in growth in the $Al_{0.1}Ga_{0.9}N$ layer. An elastic body is distorted if the power (power per unit area=stress) is added to the elastic body. An elastic constant or an elastic stiffness constant gives the relation between the stress and the distortion at this time. This elastic constant needs to treat as tensor quantity when the elastic body is the three-dimensional structure. The relationship of the following formula is satisfied:

$$T_{ij} = C_{ijkl} \times e_{kl} \quad (1)$$

where $T_{ij}$, $C_{ijkl}$, and $e_{kl}$ are the stress (Pa), the distortion, and the elastic constant (Pa), respectively. In this case, i, j, k, and l can be written by 1, 2, 3, and 4 at a rectangular coordinates system. For example, in a hexagonal system, i, j, k, and 1 can be written c11, c12, c33, and c44.

—Young's Modulus—

The Young's modulus considers the elastic constant by one dimension briefly. When the power F is applied to the elastic body of length l in the length direction, the length presupposes that only $\Delta l$ is extended. In this case since the stress is F/S and the distortion is $\Delta l/l$ when the cross section is set to S, the following formula is satisfied:

$$F/S = x \times (\Delta l/l) \quad (2)$$

In this case, the constant of proportion x is defined by Young's modulus (Pa). This Young's modulus can be expressed using the elastic constant $c_{ijkl}$, if it calculates in consideration of the symmetry of the crystal.

—Poisson's Ratio—

When the stress is added to the elastic body in the direction of one dimension (for example, the length direction), it changes also in the direction right-angled to the stress. For example, if the tensile stress or the compressive stress is added, it shrinks or expands in the direction right-angled to the stress, respectively. When the length is extended only $\Delta l$ and the width of $\Delta w$ shrinks vertically from w, the Poisson's ratio $\sigma$ (the unit, non-dimension) is defined by the following formula:

$$\sigma = (\Delta/w)/(\Delta/l) \quad (3)$$

If this Poisson's ratio as well as Young's modulus is calculated in consideration of the symmetry of the crystal, this Poisson's ratio can express using the elastic constant $c_{ijkl}$.

(N-Type GaN Based Buffer Layer)

The n-type GaN based buffer layer 12 is formed by the GaN layer by which silicon (Si) is doped, for example as the n-type impurity, and the thickness is not more than about 2000 nm, for example.

(N-Type GaN Based Cladding Layer)

The n-type GaN based cladding layer 14 is formed by the $Al_wGa_{1-w}N$ layer (where $0<=w<=1$), by which Si is doped, for example as the n-type impurity. The composition ratio w of Al is about 0.06, and the thickness is about 1300 nm, for example. Specifically, the monolayer about 1300 nm of $Al_{0.06}Ga_{0.94}N$ layer may be formed. In this case, the Young's modulus of the monolayer of the $Al_{0.06}Ga_{0.94}N$ layer is about 159.5 (GPa), for example, and the Poisson's ratio is about 0.38, for example.

In addition, the n-type GaN based cladding layer 14 may be provided with the superlattice structure. For example, the number of pairs of the GaN layer/$Al_{0.12}Ga_{0.88}N$ layer which are composed of the GaN layer of about 2.5 nm thick and $Al_{0.12}Ga_{0.88}N$ layer of about 2.5 nm thick may be repeated abbreviation 260, and superlattice structure of about 1300 nm may be formed. In this case, the Young's modulus of the GaN layer, which composes the superlattice structure is about 150 (GPa), for example, and its Poisson's ratio is about 0.38, for example. The Young's modulus of $Al_{0.12}Ga_{0.88}N$ layer is about 169 (GPa), for example, and its Poisson's ratio is about 0.38, for example.

(N-Type GaN Based Guide Layer)

The n-type GaN based guide layer 16 is formed by the GaN layer, by which Si is doped, for example as the n-type impurity, and the thickness is about 70 nm, for example. The band gap is smaller than the band gap of the n-type GaN based cladding layer 14. The Young's modulus of the n-type GaN based guide layer 16 is about 150 (GPa), for example, and its Poisson's ratio is about 0.38, for example.

(Active Layer)

The active layer 18 is composed of MQW structure which has the $In_zGa_{1-z}N$ layer (where $0<=z<1$) as the barrier layer and the $In_uGa_{1-u}N$ layer (where $0<=z<u<=1$) as the well layer. The composition ratio z of In of the $In_zGa_{1-z}N$ layer (where $0<=z<1$) which forms the barrier layer is about 0.01, for example, and the thickness is about 7 nm to about 18 nm (preferable about 16.5 nm), for example. On the other hand, the composition ratio u of In of the $In_uGa_{1-u}N$ layer (where $0<=z<u<=1$) which forms the well layer is about 0.07, for example, and the thickness is about 2 nm to about 3 nm (preferable about 2.8 nm), for example. It is effective that the number of pairs of the MQW structure, which composes the p-type active layer 18 is not more than three at the point which heightens the confinement effect of the carrier. As the p-type impurity, magnesium (Mg) is doped, for example. The Young's modulus of the barrier layer and the well layer is about 150 (GPa), for example, and its Poisson's ratio is about 0.38, for example.

(P-Type GaN Based Guide Layer)

The p-type GaN based guide layer 22 is formed by the GaN layer by which magnesium (Mg) is doped, for example as the p-type impurity, and the thickness of the p-type GaN based guide layer 22 is about 30 nm to about 108 nm, for example.

The Young's modulus of the p-type GaN based guide layer 22 of 108 nm thick is about 150 (GPa), for example, and its Poisson's ratio is about 0.38, for example. In addition, the p-type GaN based guide layer 22 should just be provided with the effect as the light guide layer, and may be formed as the undoped $In_\beta Ga_{1-\beta}N$ layer (where $0<=\beta<1$) instead of the p-type GaN based layer, for example. In this case, the composition ratio β of In is about 0.02, for example, and the thickness is about 30 nm to about 108 nm similarly, for example. In addition, the thickness of the p-type GaN based guide layer 22 and the thickness of the n-type GaN based guide layer 16 are usually equal. By setting up in this way, the FFP of the laser beam outputted from the output end face can be applied satisfactory.

(Electron Block Layer)

The electron block layer 25 can be formed by the $Al_v Ga_{1-v}N$ layer (where $0<v<=1$), by which Mg is doped, for example as the p-type impurity. The thickness is about 3 nm to about 20 nm, and is about 7 nm to about 14 nm preferable, for example. The composition ratio v of Al is constant value, for example, about 0.25. The Young's modulus of the electron block layer 25 is about 190 GPa, and the Poisson's ratio is about 0.38, for example.

(Stress Relaxation Layer)

The stress relaxation layer may be provided between the electron block layer 25 and the p-type GaN based cladding layer. The stress relaxation layer can be formed by the $In_v Ga_{1-v}N$ layer (where $0<=v<=1$), by which Mg is doped as the p-type impurity, for example. The thickness of the stress relaxation layer is about 30 nm to about 50 nm, for example. The preferable composition ratio v of 1n is about 0.02, for example. In addition, the stress relaxation layer may be the p-type GaN layer which corresponds in the case of v=0. By forming the stress relaxation layer, the stress accompanying the lattice constant mismatching of GaAlN/GaN occurred in the interface between the electron block layer 25 and the p-type GaN based guide layer 22 can be distributed on both sides of the p-type GaN based guide layer 22 and the stress relaxation layer.

(P-Type Cladding Layer)

The p-type cladding layer 26 is doped of Mg as the p-type impurity and is composed of MQW structure which has the $Al_w Ga_{1-w}N$ layer (where $0<=w<=1$) as the barrier layer and the GaN layer as the well layer, for example. The composition ratio w of Al of the $Al_w Ga_{1-w}N$ layer (where $0<=w<=1$), which forms the barrier layer, is about 0.12, for example. It is preferable that the number of pairs of the MQW structure, which composes the p-type cladding layer 26, is about 90 in respect of improvement in crystal quality. The number of pairs of the GaN layer/$Al_{0.12}Ga_{0.88}N$ layer which are composed of the GaN layer of about 2.5 nm thick and $Al_{0.12}Ga_{0.88}N$ layer of about 2.5 nm thick may specifically be repeated about 90 pairs, for example, and the MQW structure of about 450 nm may be formed. In this case, the Young's modulus of the GaN layer, which composes the MQW structure, is about 150 (GPa), for example, and its Poisson's ratio is about 0.38, for example. The Young's modulus of $Al_{0.12}Ga_{0.88}N$ layer is about 169 (GPa), for example, and its Poisson's ratio is about 0.38, for example.

(P-Type GaN Based Contact Layer)

The p-type GaN based contact layer 28 is formed by the GaN layer, by which Mg is doped as the p-type impurity, for example, and the thickness is about 60 nm, for example. The Young's modulus of the p-type GaN based contact layer 28 is about 150 (GPa), for example, and its Poisson's ratio is about 0.38, for example.

(Insulating Film)

The insulating film 24 is formed by $ZrO_2$, for example, and the thickness is about 200 nm, for example.

As the insulating film 24, $Al_2O_3$, $SiO_2$, $TiO_2$, $Ta_2O_5$, $Nb_2O_5$, AlN, SiN, AlON, SiON, $AlN_\alpha$ ($0<\alpha<1$), or these cascade films are applicable as others.

(Electrode Structure)

Moreover, the p-side ohmic electrode 30 is also called a p-type contact metal, for example, and is formed by Pd/Au. The thickness of Pd/Au is about 10 nm/50 nm, for example.

Moreover, the p-side electrode 32 is also called a p-type pad metal, for example, and is formed by Ti/Au. The thickness of Ti/Au is about 50 nm/500 nm, for example.

Moreover, the n-side electrode 40 is formed by Al/Pt/Au or Al/Ti/Au, for example. The thickness of Al/Pt(Ti)/Au is about 100 nm/10 nm/200 nm, for example.

(Analysis Result of Stress)

Figure 44:
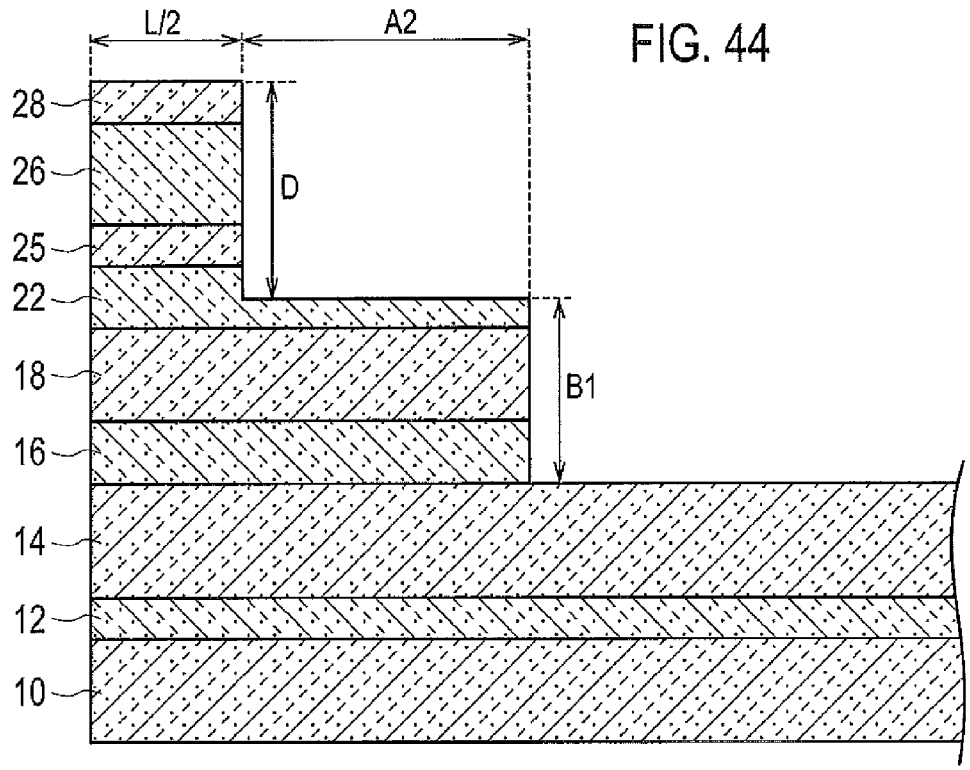
FIG. 44 is a schematic cross-sectional configuration chart which sets up the step depth D of the first step region into the p-type GaN based guide layer 22 as the width of the laser stripe is set to L, and sets up the step depth B1 of the second step region to near the top surface of the n-type GaN based cladding layer 14 as the width of the step flat part of the first step region is set to A2, in the nitride based semiconductor device according to the sixth embodiment of the present invention.

In the nitride based semiconductor device according to the sixth embodiment, a schematic section structure which sets up the step depth D of the first step region into the p-type GaN based guide layer 22 as the width of the laser stripe is set to L, and sets up the step depth B1 of the second step region near the top surface of the n-type GaN based cladding layer 14 as the width of the step flat part of the first step region is set to A2 is expressed as shown in FIG. 44.

Figure 45:
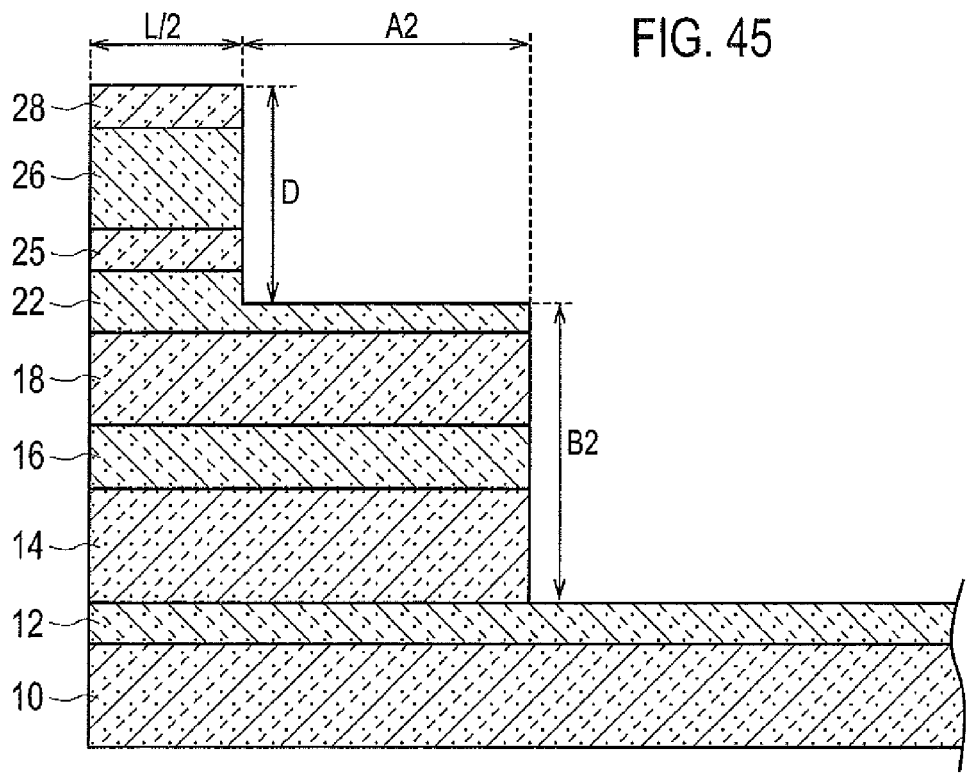
FIG. 45 is a schematic cross-sectional configuration chart which sets up step depth D of the first step region into the p-type GaN based guide layer 22 as the width of the laser stripe is set to L, and sets up step depth B2 of the second step region to near the top surface of the n-type GaN based buffer layer 12 as the width of the step flat part of the first step region is set to A2, in the nitride based semiconductor device according to the sixth embodiment of the present invention.

Similarly, a schematic section structure which sets up the step depth D of the first step region into the p-type GaN based guide layer 22, and set up the step depth B2 of the second step region near the top surface of the n-type GaN based buffer layer 12 as the width of the step flat part of the first step region is set to A2 is expressed as shown in FIG. 45.

Figure 46:
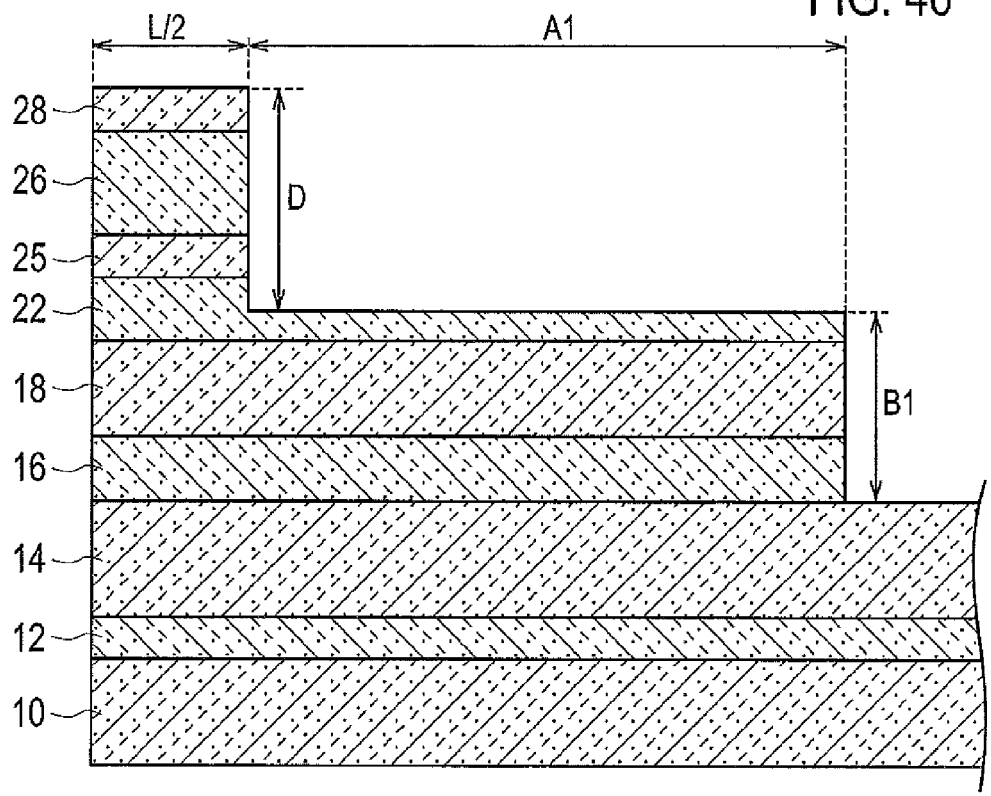
FIG. 46 is a schematic cross-sectional configuration chart which sets up the step depth D of the first step region into the p-type GaN based guide layer 22 as the width of the laser stripe is set to L, and sets up the step depth B1 of the second step region to near the top surface of the n-type GaN based cladding layer 14 as the width of the step flat part of the first step region is set to A1 (>A2), in the nitride based semiconductor device according to the sixth embodiment of the present invention.

Similarly, a schematic section structure which sets up the step depth D of the first step region into the p-type GaN based guide layer 22, and set up the step depth B1 of the second step region near the top surface of the n-type GaN based buffer layer 12 as the width of the step flat part of the first step region is set to A1 (>A2) is expressed as shown in FIG. 46.

Figure 47:
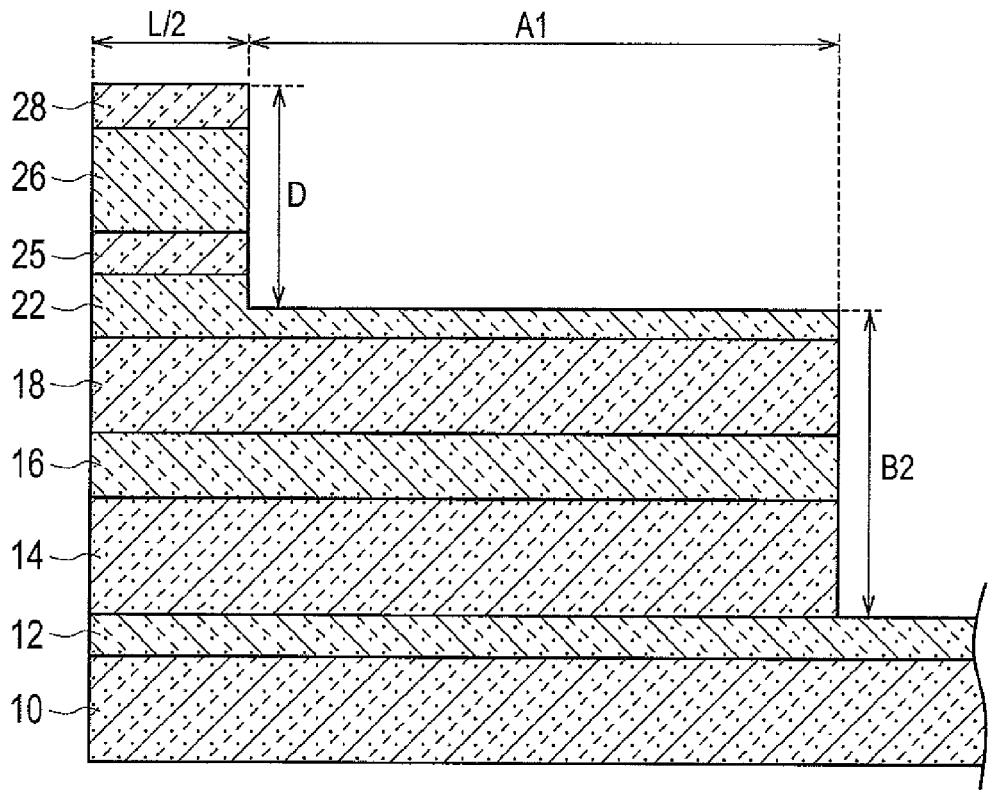
FIG. 47 is a schematic cross-sectional configuration chart which sets up the step depth D of the first step region into the p-type GaN based guide layer 22 as the width of the laser stripe is set to L, and sets up the step depth B1 of the second step region to near the top surface of the n-type GaN based buffer layer 12 as the width of the step flat part of the first step region is set to A1 (>A2), in the nitride based semiconductor device according to the sixth embodiment of the present invention.
Figure 48B:
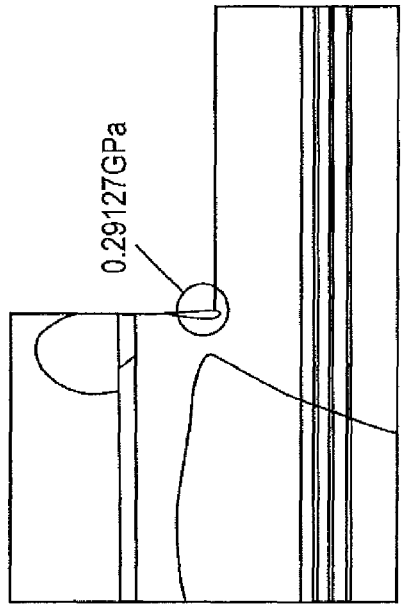
FIG. 48B shows an analysis result of the stress concentrated on the step corner of the first step region of the stripe for current concentration and optical confinement (in the case of corresponding to FIG. 45), in the nitride based semiconductor device according to the sixth embodiment of the present invention.
Figure 48D:
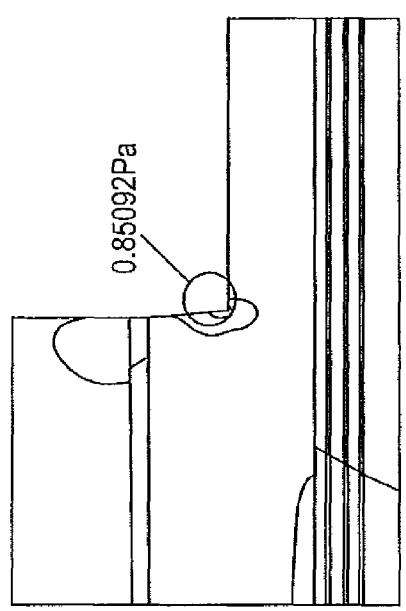
FIG. 48D shows an analysis result of the stress concentrated on the step corner of the first step region of the stripe for current concentration and optical confinement (in the case of corresponding to FIG. 47), in the nitride based semiconductor device according to the sixth embodiment of the present invention.
Figure 48A:
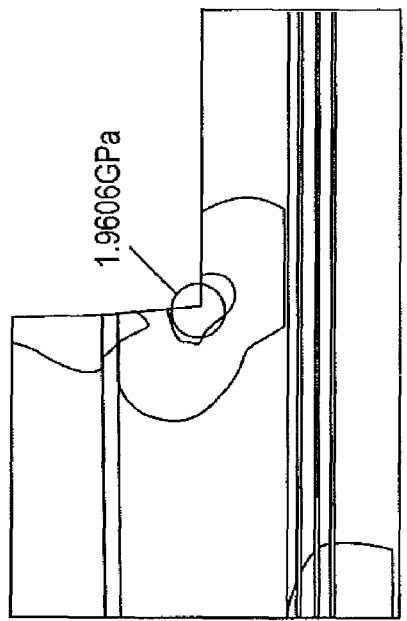
FIG. 48A shows an analysis result of the stress concentrated on the step corner of the first step region of the stripe for current concentration and optical confinement (in the case of corresponding to FIG. 44), in the nitride based semiconductor device according to the sixth embodiment of the present invention.
Figure 48C:
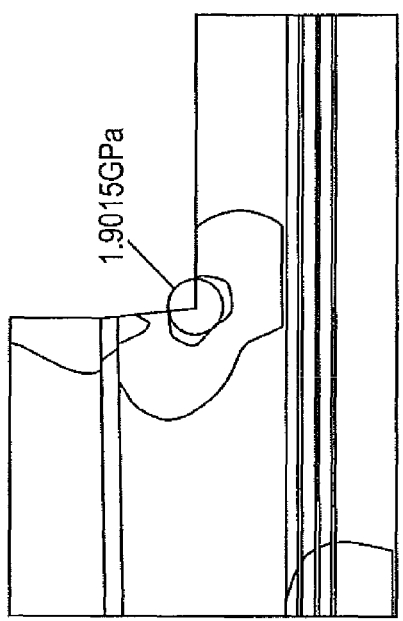
FIG. 48C shows an analysis result of the stress concentrated on the step corner of the first step region of the stripe for current concentration and optical confinement (in the case of corresponding to FIG. 46), in the nitride based semiconductor device according to the sixth embodiment of the present invention.
Figure 49B:
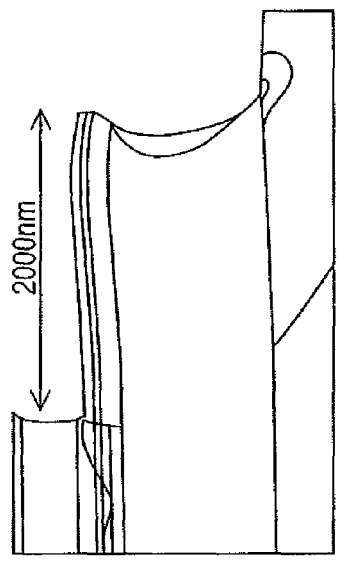
FIG. 49B shows a structure applied to analyzing of the stress concentrated on step corner of the stripe for current concentration and optical confinement (in the case of corresponding to FIG. 45, D=about 578 nm, A1=about 2000 nm, B1=about 1491 nm), in the nitride based semiconductor device according to the sixth embodiment of the present invention.
Figure 49D:
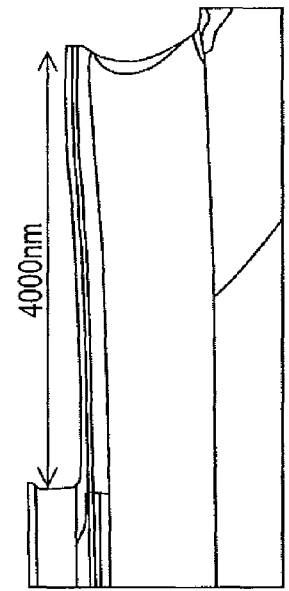
FIG. 49D shows a structure applied to analyzing of the stress concentrated on step corner of the stripe for current concentration and optical confinement (in the case of corresponding to FIG. 47, D=about 578 nm, A1=about 4000 nm, B1=about 1491 nm), in the nitride based semiconductor device according to the sixth embodiment of the present invention.
Figure 49A:
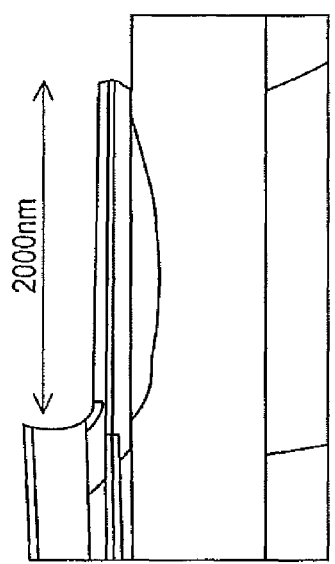
FIG. 49A shows a structure applied to analyzing of the stress concentrated on step corner of the stripe for current concentration and optical confinement (in the case of corresponding to FIG. 44, D=about 578 nm, A1=about 2000 nm, B1=about 191 nm), in the nitride based semiconductor device according to the sixth embodiment of the present invention.
Figure 49C:
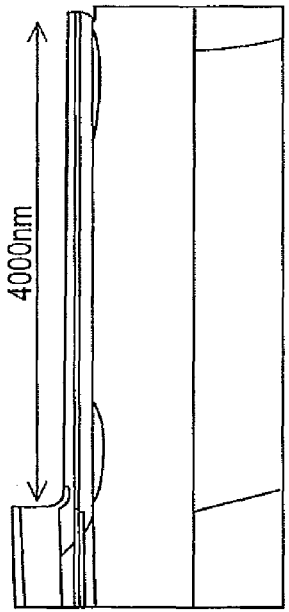
FIG. 49C shows a structure applied to analyzing of the stress concentrated on step corner of the stripe for current concentration and optical confinement (in the case of corresponding to FIG. 46, D=about 578 nm, A1=about 4000 nm, B1=about 191 nm), in the nitride based semiconductor device according to the sixth embodiment of the present invention.

Similarly, a schematic section structure which sets up the step depth D of the first step region into the p-type GaN based guide layer 22, and set up the step depth B2 of the second step region near the top surface of the n-type GaN based buffer layer 12 as the width of the step flat part of the first step region is set to A1 (>A2) is expressed as shown in FIG. 47.

In the nitride based semiconductor device according to the sixth embodiment, an analysis result of the stress concentrated on the step corner of the first step region of the laser stripe 80 for current concentration and optical confinement is expressed, as shown in FIG. 48. That is, FIG. 48A is applicable to the case of corresponding to FIG. 44, FIG. 48B is applicable to the case of corresponding to FIG. 45, FIG. 48C is applicable to the case of corresponding to FIG. 46, and FIG. 48D is applicable to the case of corresponding to FIG. 47. As shown in FIG. 48, according to the analysis result of stress, in the structure of FIG. 48A, it is 1.9606 (GPa). On the other hand, in the structure of FIG. 48B, the result of decreasing substantially, such as 0.29127 (GPa), is obtained. In the structure of FIG. 48C, it is 1.9015 (GPa). On the other hand, in the structure of FIG. 48D, the result of decreasing to 0.85092 (GPa) is obtained. As more clearly from the comparison result of FIG. 48A and FIG. 48B, and the comparison result of FIG. 48C and FIG. 48D, the reduction effect of the stress concentrated on the step corner of the first step region is observed in a side of the depth B of the second step part being deeper (B2>B1). Moreover, as more clearly than the comparison result of FIG. 48B and FIG. 48D, in the 1st step region, the reduction effect of the stress concentrated on the step corner of the first step region is observed in a side of the length A of the flat part of the direction vertical to the extension direction of the laser stripe 80 being smaller (A2<A1). On the contrary, since it contracts in the surface as the whole height, the compressive stress to the active layer 18 becomes large.

In the nitride based semiconductor device according to the sixth embodiment, the structure applied to analyzing of the stress concentrated on step corner of the stripe for current concentration and optical confinement is shown in FIG. 49. That is: FIG. 49A corresponds to FIG. 44, and shows the case of D=about 578 nm, A1=about 2000 nm and B1=about 191 nm; FIG. 49B corresponds to FIG. 45, and shows the case of D=about 578 nm, A1=about 2000 nm and B2=about 1491 nm; FIG. 49C corresponds to FIG. 46, and shows the case of D=about 578 nm, A1=about 4000 nm and B1=about 191 nm; and FIG. 49D corresponds to FIG. 47, and shows the case of D=about 578 nm, A1=about 4000 nm and B2=about 1491 nm, respectively.

Moreover, in the first step region on the structure of the nitride based semiconductor device 20 according to the sixth embodiment, the length A of the flat part of the direction vertical to the extension direction of the laser stripe 80 is smaller than length C (not shown) of the flat part of the direction vertical to the extension direction of the laser stripe 80 enough, in the second step region.

In the nitride based semiconductor device according to the sixth embodiment, an analysis result of the stress concentrated on the step corner of the second step region is expressed, as shown in FIG. 50. That is, FIG. 50A is applicable to the case of corresponding to FIG. 44, FIG. 50B is applicable to the case of corresponding to FIG. 45, FIG. 50C is applicable to the case of corresponding to FIG. 46, and FIG. 50D is applicable to the case of corresponding to FIG. 47, respectively.

As shown in FIG. 50, according to the analysis result of stress, in the structure of FIG. 50A, it is 0.035087 (GPa)/0.010129 (GPa) in the inner side/the outside of the step corner of the second step region. On the other hand, in the structure of FIG. 50B, the result of increasing substantially, such as 4.5683 (GPa)/3.1598 (GPa), is obtained. In the structure of FIG. 50C, it is also 0.03919 (GPa)/0.0085477 (GPa). On the other hand, in the structure of FIG. 50D, the result of increasing substantially, such as 5.2832 (GPa)/3.6600 (GPa), is obtained. As clearly from the comparison result of FIG. 50A and FIG. 50B, and the comparison result of FIG. 50C and FIG. 50D, the stress to the corner of the second step region becomes large as the stress to the corner of the first step region becomes small, when the step depth B of the second step region is etched to the n-type GaN based cladding layer 14 (B=B2). That is, the stress concentrates on the corner of the second step region rather than the corner of the first step region. Moreover, since the AlGaN thick film above height is large, the stress to the corner of the second step region becomes large rather than the stress to the corner of the first step region.

Comparative Example

Figure 51:
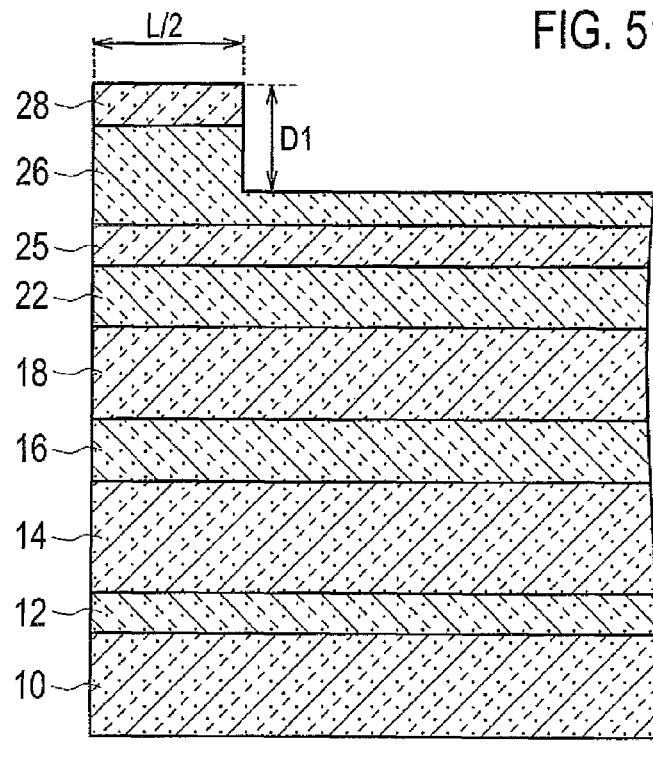
FIG. 51 is a schematic cross-sectional configuration chart of a nitride based semiconductor device according to a comparative example of the present invention, and is a constructional example in which a laser stripe has one step of height, the width of the laser stripe L=2000 nm, step depth D1=about 285 nm, and formed to the halfway of the p-type GaN based cladding layer 26.

A constructional example in which the laser stripe has one step of height, the width of laser stripe L=2000 nm in, and the step depth D1=about 285 nm, and which is formed to the halfway of the p-type GaN based cladding layer 26, and is a schematic cross-sectional configuration chart of the nitride based semiconductor device according to a comparative example of the present invention is expressed as shown in FIG. 51.

Figure 52:
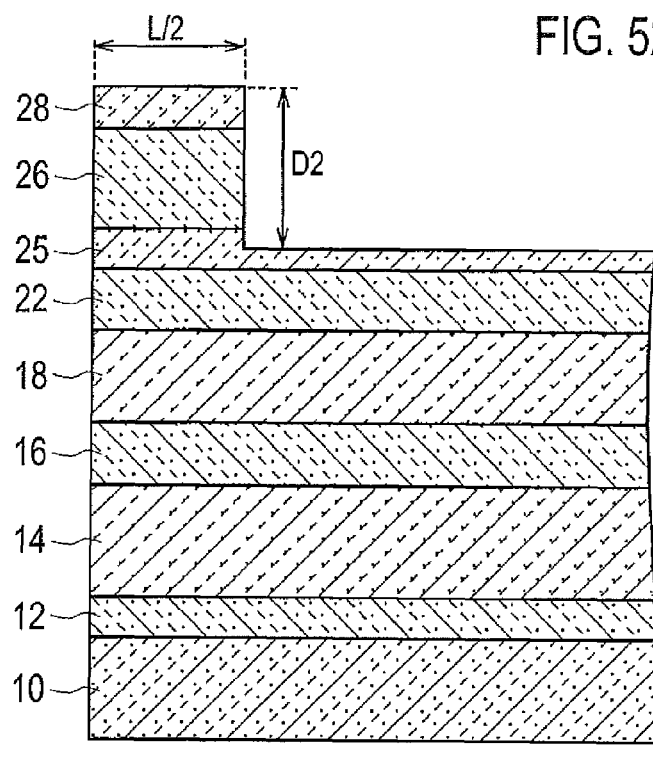
FIG. 52 is a schematic cross-sectional configuration chart of the nitride based semiconductor device according to the comparative example of the present invention, and is a constructional example in which the laser stripe has one step of height, the width of the laser stripe L=2000 nm, step depth D1=about 517 nm, and formed to the halfway of the p-type GaN electron block layer 25.

Similarly, a constructional example in which the laser stripe has one step of height, the width of laser stripe L=2000 nm, and the step depth D2=about 517 nm, and which is formed to the halfway of the p-type AlGaN electron block layer 25 is expressed as shown in FIG. 52.

Figure 53:
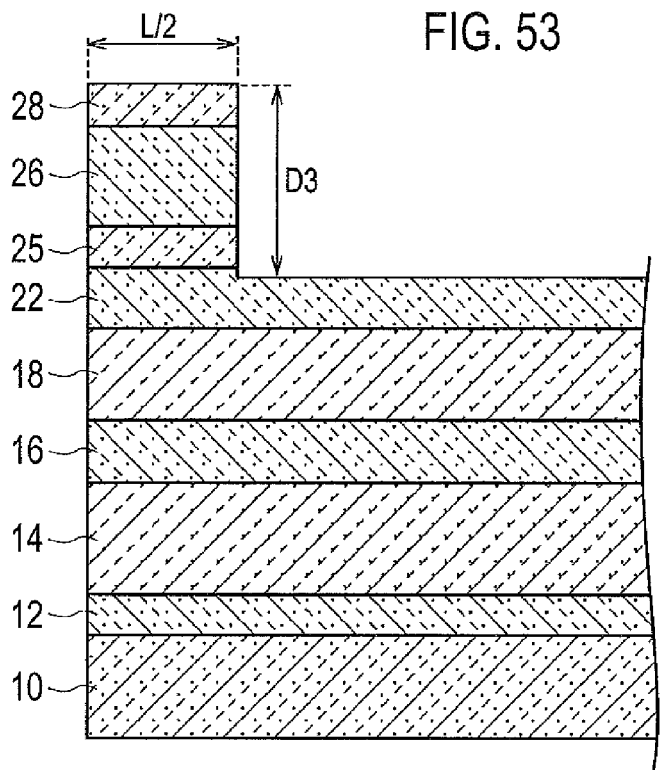
FIG. 53 is a schematic cross-sectional configuration chart of the nitride based semiconductor device according to the comparative example of the present invention, and is a constructional example in which the laser stripe has one step of height, the width of the laser stripe L=2000 nm, step depth D1=about 524 nm, and formed to near the lower part of the p-type AlGaN electron block layer 25.

Similarly, a constructional example in which the laser stripe has one step of height, the width of laser stripe L=2000 nm, and the step depth D3=about 524 nm, and which is formed to near the lower part of the p-type AlGaN electron block layer 25 is expressed as shown in FIG. 53.

Similarly, a constructional example in which the laser stripe has one step of height, the width of laser stripe L=2000 nm, and the step depth D4=about 600 nm, and which is formed to near the lower part of the p-type GaN guide layer 22 is expressed as shown in FIG. 53.

Figure 54:
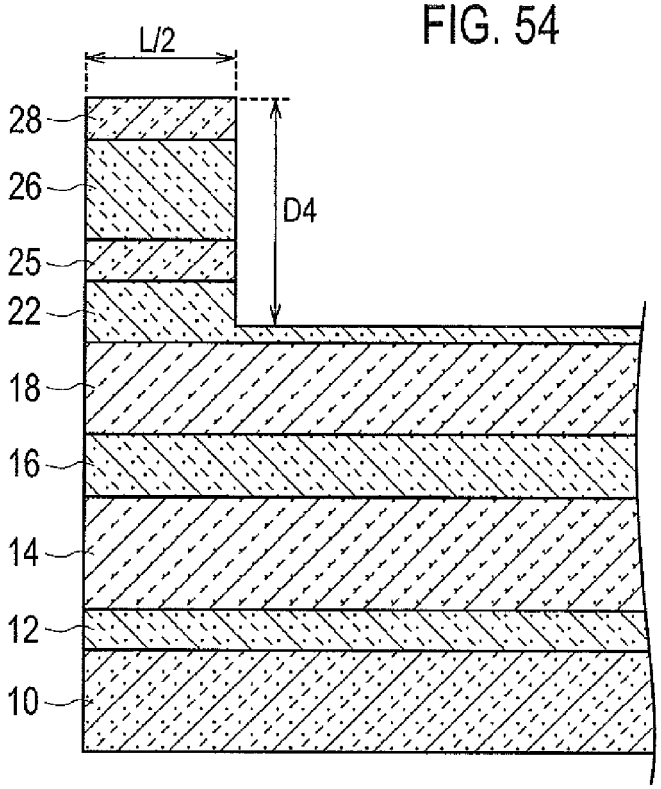
FIG. 54 is a schematic cross-sectional configuration chart of the nitride based semiconductor device according to the comparative example of the present invention, and is a constructional example in which the laser stripe has one step of height, the width of the laser stripe L=2000 nm, step depth D1=about 600 nm, and formed to near the lower part of the p-type GaN guide layer 22.
Figure 55B:
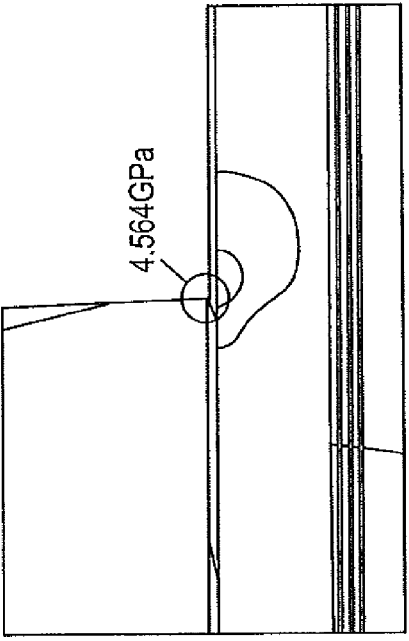
FIG. 55B shows an analysis result of the stress concentrated on step corner of the stripe for current concentration and optical confinement (in the case of corresponding to FIG. 52), in the nitride based semiconductor device according to the comparative example of the present invention.
Figure 55D:
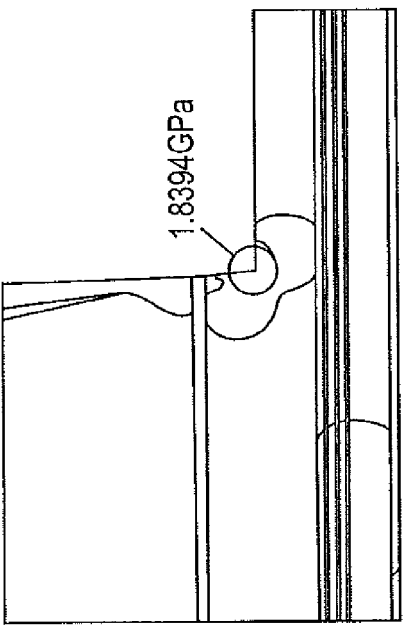
FIG. 55D shows an analysis result of the stress concentrated on step corner of the stripe for current concentration and optical confinement (in the case of corresponding to FIG. 54), in the nitride based semiconductor device according to the comparative example of the present invention.
Figure 55A:
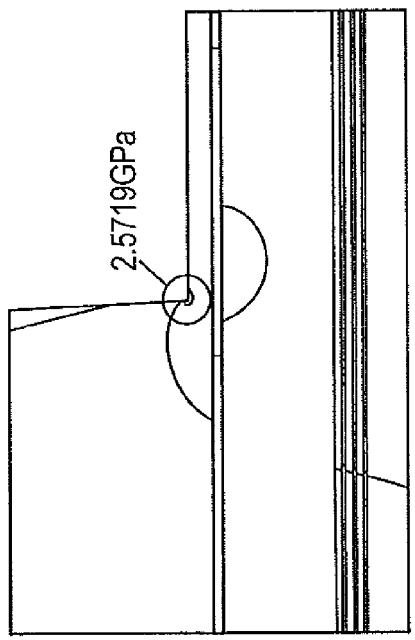
FIG. 55A shows an analysis result of the stress concentrated on step corner of the stripe for current concentration and optical confinement (in the case of corresponding to FIG. 51), in the nitride based semiconductor device according to the comparative example of the present invention.
Figure 55C:
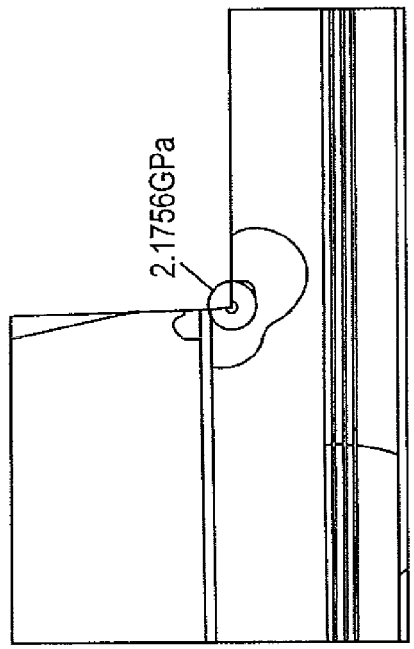
FIG. 55C shows an analysis result of the stress concentrated on step corner of the stripe for current concentration and optical confinement (in the case of corresponding to FIG. 53), in the nitride based semiconductor device according to the comparative example of the present invention.

In the nitride based semiconductor device according to the comparative example, an analysis result of the stress concentrated on step corner of the stripe for current concentration and optical confinement is expressed, as shown in FIG. 55. That is, FIG. 55A is applicable to the case of corresponding to FIG. 51, FIG. 55B is applicable to the case of corresponding to FIG. 52, FIG. 55C is applicable to the case of corresponding to FIG. 53, and FIG. 55D is applicable to the case of corresponding to FIG. 54, respectively. As shown in FIG. 55, according to the analysis result of stress, in the structure of FIG. 55A, it is 2.5719 (GPa). On the other hand, in the structure of FIG. 55B, the result of increasing substantially, such as 4.564 (GPa), is obtained. In the structure of FIG. 55C, it is 2.1756 (GPa). On the other hand, in the structure of FIG. 55D, the result of decreasing to 1.8394 (GPa) is obtained. As clear from the comparison result of FIG. 55A to FIG. 55D, the constructional example which the depth of step part D2=about 517 nm, and formed to the halfway of the p-type AlGaN electron block layer 25 has the highest stress. When the step depth D deeper than the p-type AlGaN electron block layer 25, as clearly from the comparison result of FIG. 55C and FIG. 55D, the reduction effect of the stress concentrated on the step corner is observed in a side of the step depth D being deeper (D4>D3).

(Fabrication Method)

One process step of the fabrication method of the nitride based semiconductor device according to the sixth embodiment is expressed as shown in FIG. 56 to FIG. 64.

Figure 65A:
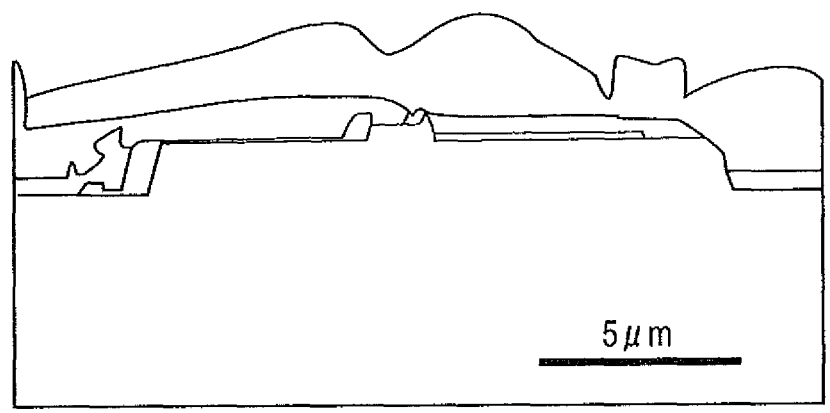
FIG. 65A shows an SEM photograph showing an aspect of the step corner of two stage structures of the first step region which forms the laser stripe 80 on the p-type GaN based guide layer 22, and the second step region which is formed by removing the n-type GaN based cladding layer 14, in the nitride based semiconductor device according to the sixth embodiment of the present invention.
Figure 65B:
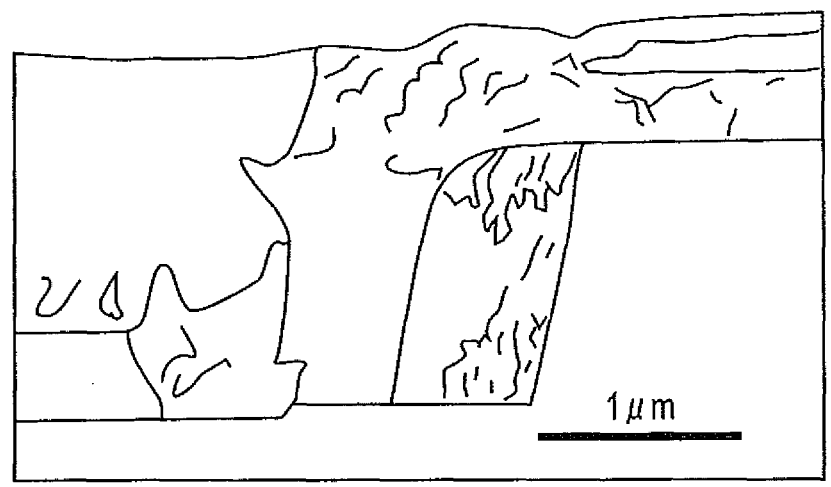
FIG. 65B shows an SEM photograph to which the second step region is enlarged, in the nitride based semiconductor device according to the sixth embodiment of the present invention.

In the nitride based semiconductor device according to the sixth embodiment, an SEM photograph of the first step region which forms the laser stripe 80 on the p-type GaN based guide layer 22, and the second step region which removes the n-type GaN based cladding layer 14 and is formed is expressed as shown in FIG. 65A, and an SEM photograph to which the second step region is enlarged is expressed as shown in FIG. 65B.

Figure 66A:
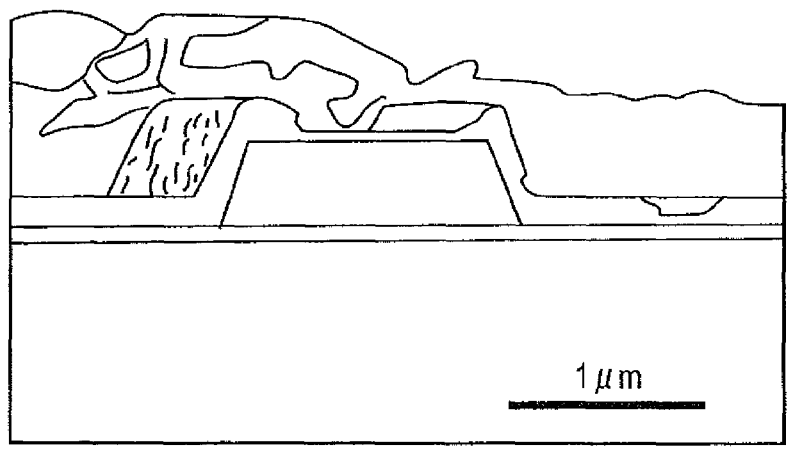
FIG. 66A shows an SEM photograph of the height of the laser stripe 80, in the nitride based semiconductor device according to the sixth embodiment of the present invention.
Figure 66B:
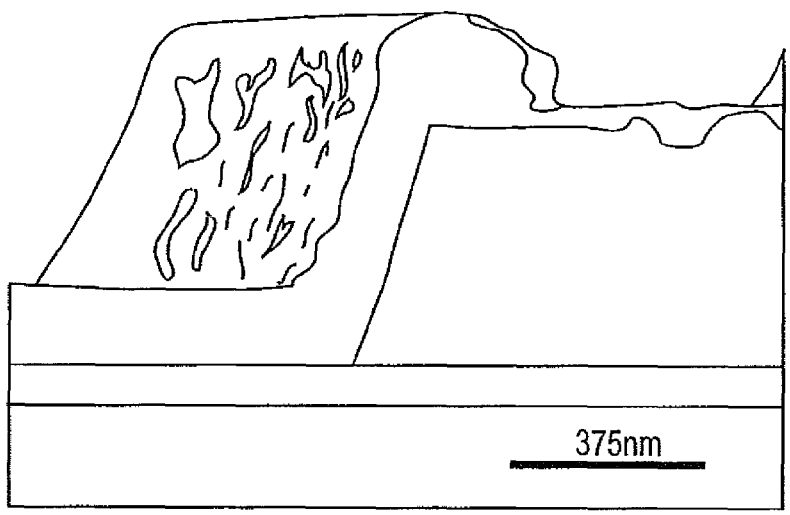
FIG. 66B shows a photographic enlargement of FIG. 66A.

In the nitride based semiconductor device according to the sixth embodiment, an SEM photograph of the height of the laser stripe 80 is expressed as shown in FIG. 66A, and a photographic enlargement of FIG. 66A is expressed as shown in FIG. 66B.

The fabrication method of the nitride based semiconductor device according to the sixth embodiment includes: the step for which the GaN based semiconductor substrate 10 is prepared; the step of forming the n-type GaN based cladding layer 14 by which the n-type impurity is doped, on the GaN based semiconductor substrate 10; the step of forming the n-type GaN based guide layer 16 in which the n-type impurity is doped on the GaN based cladding layer 14 and in which the band gap is smaller than the n-type GaN based cladding layer 14; the step of forming the active layer 18 on the n-type GaN based guide layer 16; the step of forming the p-type GaN based guide layer 22 by which the p-type impurity is doped, on the active layer 18; the step of forming the electron block layer 25 on the p-type GaN based guide layer 22; the step of forming the p-type GaN based cladding layer 26 by which the p-type impurity is doped, on the electron block layer 25; the step of removing all or a part of the p-type GaN based cladding layer 26, and forming the first step region, in order to form the laser stripe 80 on the p-type GaN based guide layer 22; and the step of removing the n-type GaN based guide layer 16 and forming the second step region to the extension direction and parallel direction of the laser stripe 80.

While the current concentration structure is formed by the first step region, the laser cavity is formed by a part of the second step region by mostly centering on the active layer 18.

The step of forming the second step region may have the step of removing a part of or all of the n-type GaN based cladding layer 14.

In the active layer 18, the $In_zGa_{1-z}N$ layer (where $0<=z<1$) may be formed as the barrier layer, and the MQW structure of the $In_uGa_{1-u}N$ layer (where $0<=z<u<=1$) may be formed as the well layer.

The superlattice structure including the nitride based semiconductor including Al may be formed in the n-type GaN based cladding layer 14.

The $Al_XIn_YGa_{1-X-Y}N$ (where $0<=X, 0<=Y, X+Y<=1$) layer may be formed on the n-type GaN based guide layer 16.

It may have the step of forming the stress relaxation layer on the electron block layer 25 between the electron block layer 25 and the p-type GaN based cladding layer 26.

The $In_xGa_{1-x}N$ layer (where $0<=x<=1$) may be formed on the stress relaxation layer.

The $Al_yGa_{1-y}N$ layer (where $0<y<=1$) may be formed on the electron block layer 25.

The fabrication method of the nitride based semiconductor device according to the sixth embodiment further includes: the step of arraying a plurality of chips of the nitride based semiconductor device to array form in the direction vertical to the extension direction of the laser stripe 80 at parallel, in the semiconductor wafer; and the step of cleaving the end face of the laser stripe 80 of the nitride based semiconductor device.

Moreover, it may include the step of forming the protection film in the cleaved surface.

For example, the protection film is formed of sputtering. In addition, the formation process of the protection film is not limited to sputtering, and can also apply CVD, a vacuum evaporation method, an ALD (Atomic Layer Deposition) method, an MBE (Molecular Beam Epitaxy) method, an MLE (Molecular Layer Epitaxy) method, and an ion beam sputtering method, etc.

Hereinafter, the fabrication method of the nitride based semiconductor device according to the sixth embodiment of the present invention will be explained with reference to drawings.

Figure 56:
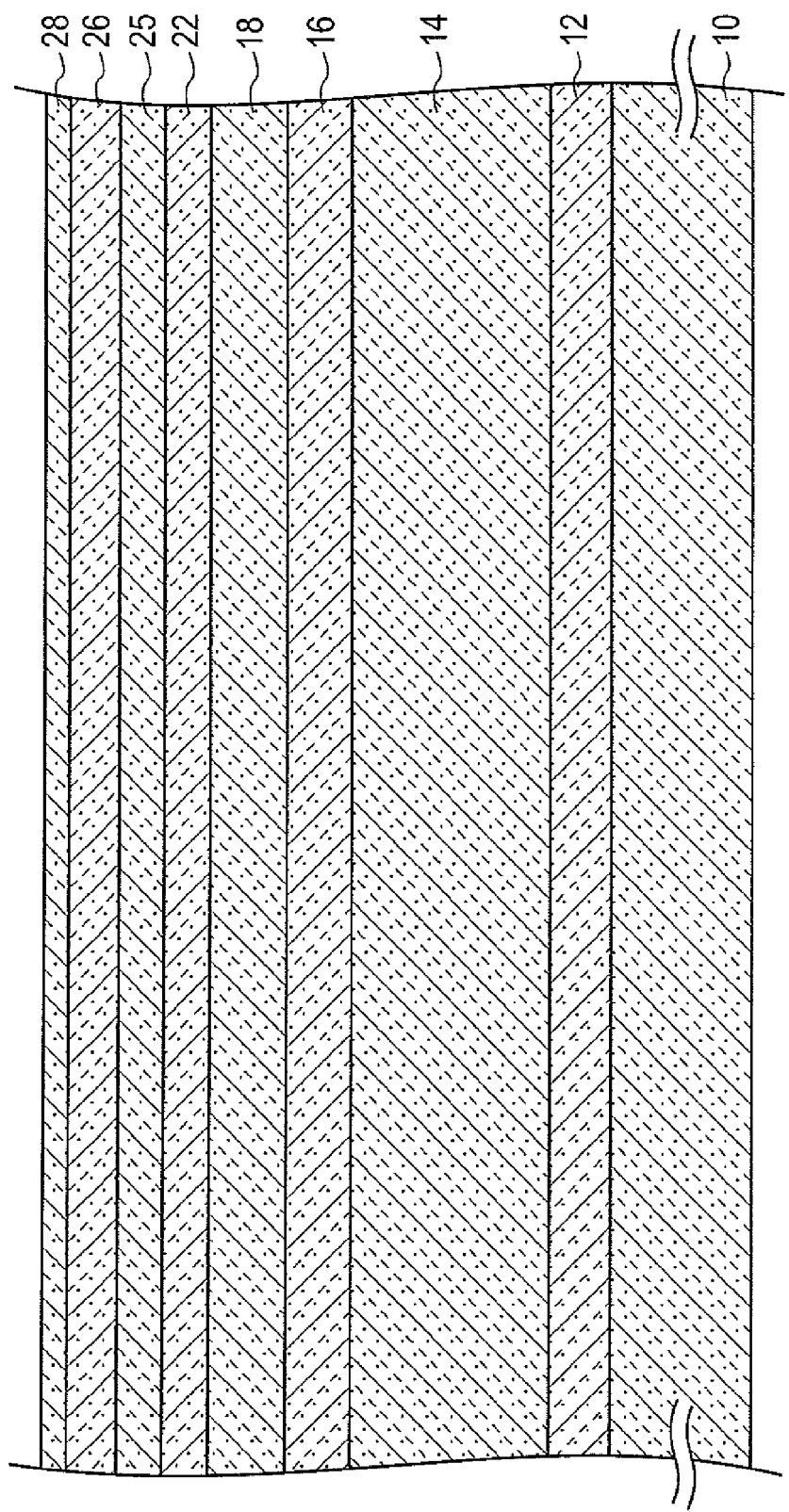
FIG. 56 is a schematic cross-sectional configuration chart for explaining one process step of a fabrication method of the nitride based semiconductor device according to the sixth embodiment of the present invention.

(a) First of all, as shown in FIG. 56, preparing the GaN based semiconductor substrate 10. The thickness of the GaN based semiconductor substrate 10 is about 300 micrometers, for example. A plane direction applies c plane, except c plane, that is, a nonpolar plane, such as a plane and m plane, or a semi-polar plane, to the principal surfaceand. When the light-emitting device, which has a p-type layer and an n-type layer by the GaN based semiconductor substrate 10, which applies the nonpolar plane or the semi-polar plane to the principal surface is fabricated, the light-emission of a strong polarization condition is possible.

(b) Next, as shown in FIG. 56, forming the n-type GaN based buffer layer 12, the n-type GaN based cladding layer 14, the n-type GaN based guide layer 16, the active layer 18, the p-type GaN based guide layer 22, the electron block layer 25, the p-type cladding layer 26, and the p-type GaN based contact layer 28 one after another on the GaN based semiconductor substrate 10. As the formation method of these layers, the MOCVD method is applicable. Alternatively, the ALD method, the MBE method, the MLE method, the spattering method, etc. are also applicable.

Figure 57:
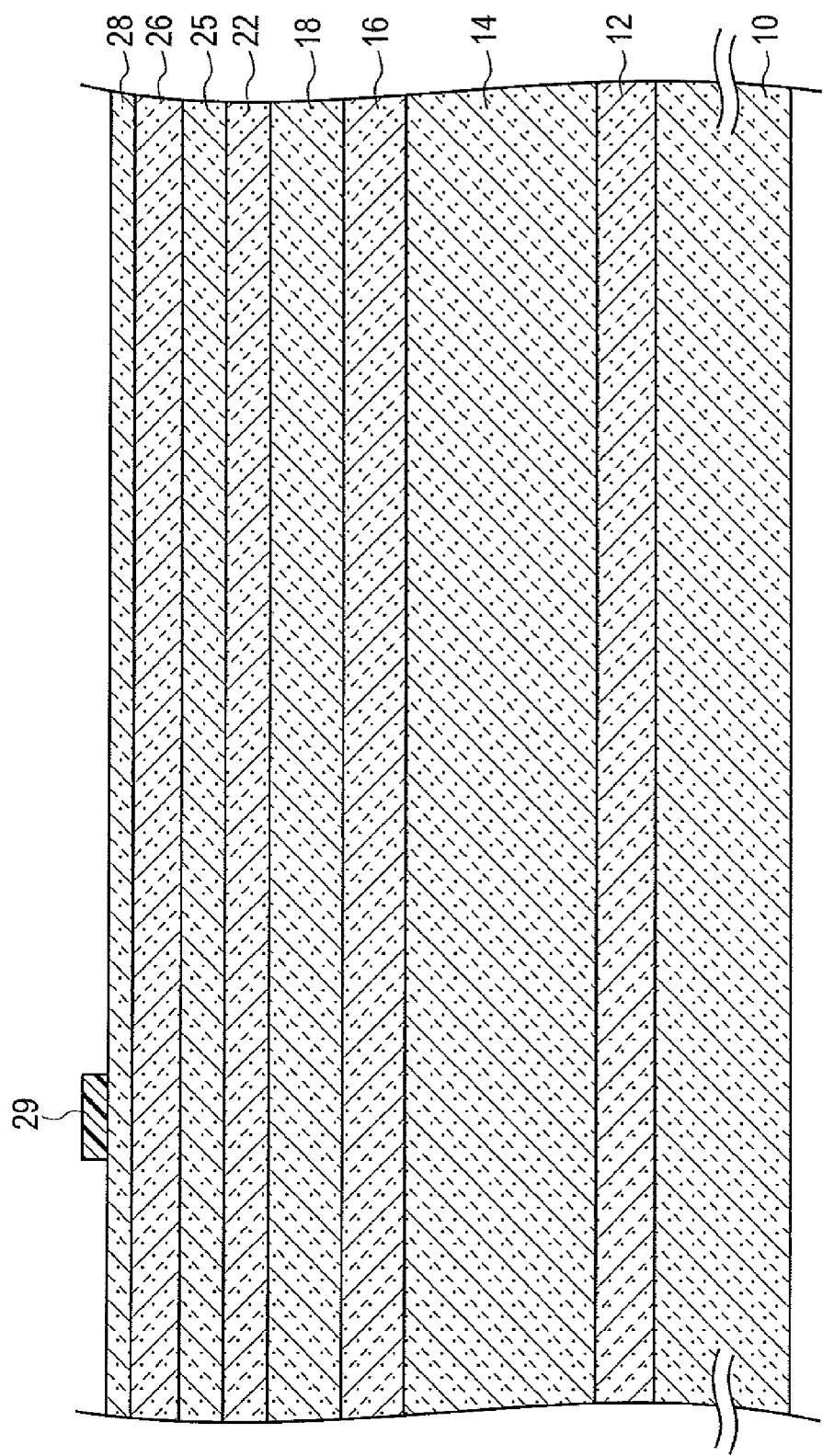
FIG. 57 is a schematic cross-sectional configuration chart for explaining one process step of the fabrication method of the nitride based semiconductor device according to the sixth embodiment of the present invention.

(c) Next, as shown in FIG. 57, performing lithography and patterning after applying the resist layer 29 on the p-type GaN based contact layer 28.

Figure 58:
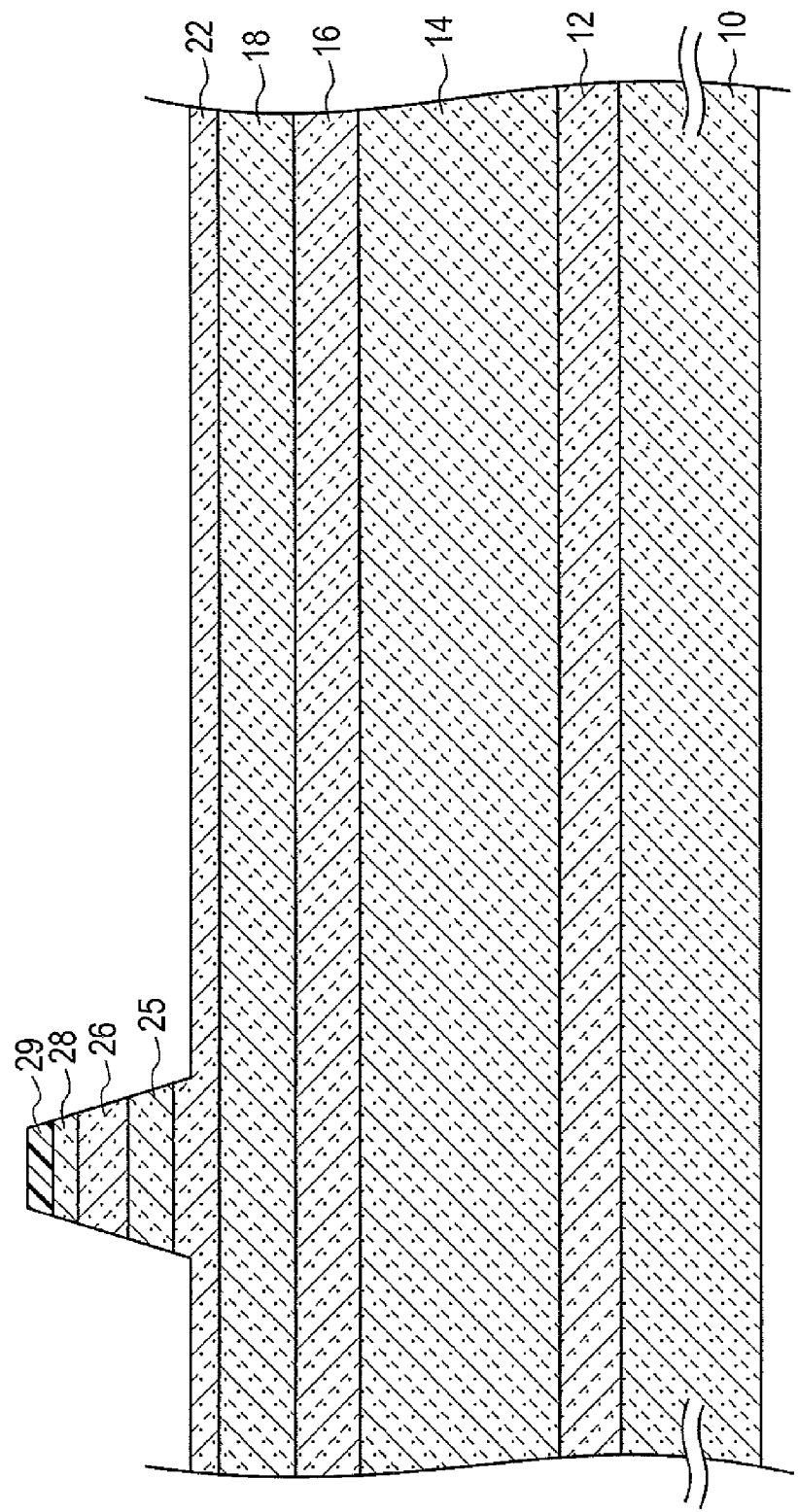
FIG. 58 is a schematic cross-sectional configuration chart for explaining one process step of the fabrication method of the nitride based semiconductor device according to the sixth embodiment of the present invention.

(d) Next, as shown in FIG. 58, forming the first step region for forming the laser stripe 80 on the p-type GaN based guide layer 22 by removing a part or all of the p-type GaN based contact layers 28 and the p-type cladding layers 26 by etching by applying the resist layer 29 as a mask. As conditions for etching, RIE (Reactive Ion Etching) or the combination of RIE and wet etching may be suitable. By such etching, as shown in FIG. 45, the laser stripe 80, which has current concentration structure, can be formed. The depth of etching is about 0.5 micrometer to about 1.0 micrometer, for example. In the above-mentioned example, D=about 78 nm, for example.

Figure 59:
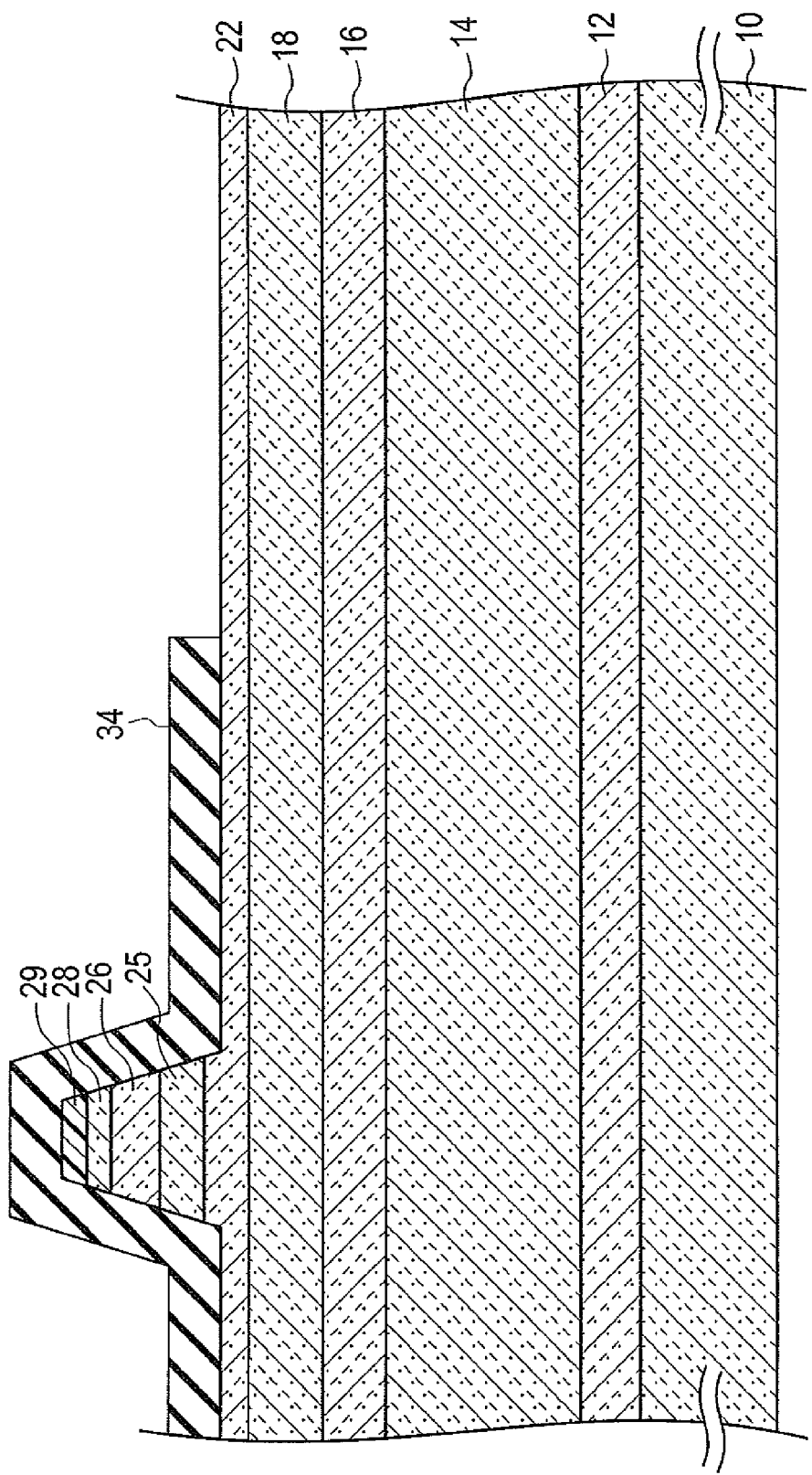
FIG. 59 is a schematic cross-sectional configuration chart for explaining one process step of the fabrication method of the nitride based semiconductor device according to the sixth embodiment of the present invention.

(e) Next, as shown in FIG. 59, removing the insulating film 34 on the formation scheduled region of the second step region by the photo lithography process and the etching process after forming the insulating film 34 in the whole semiconductor wafer surface.

Figure 60:
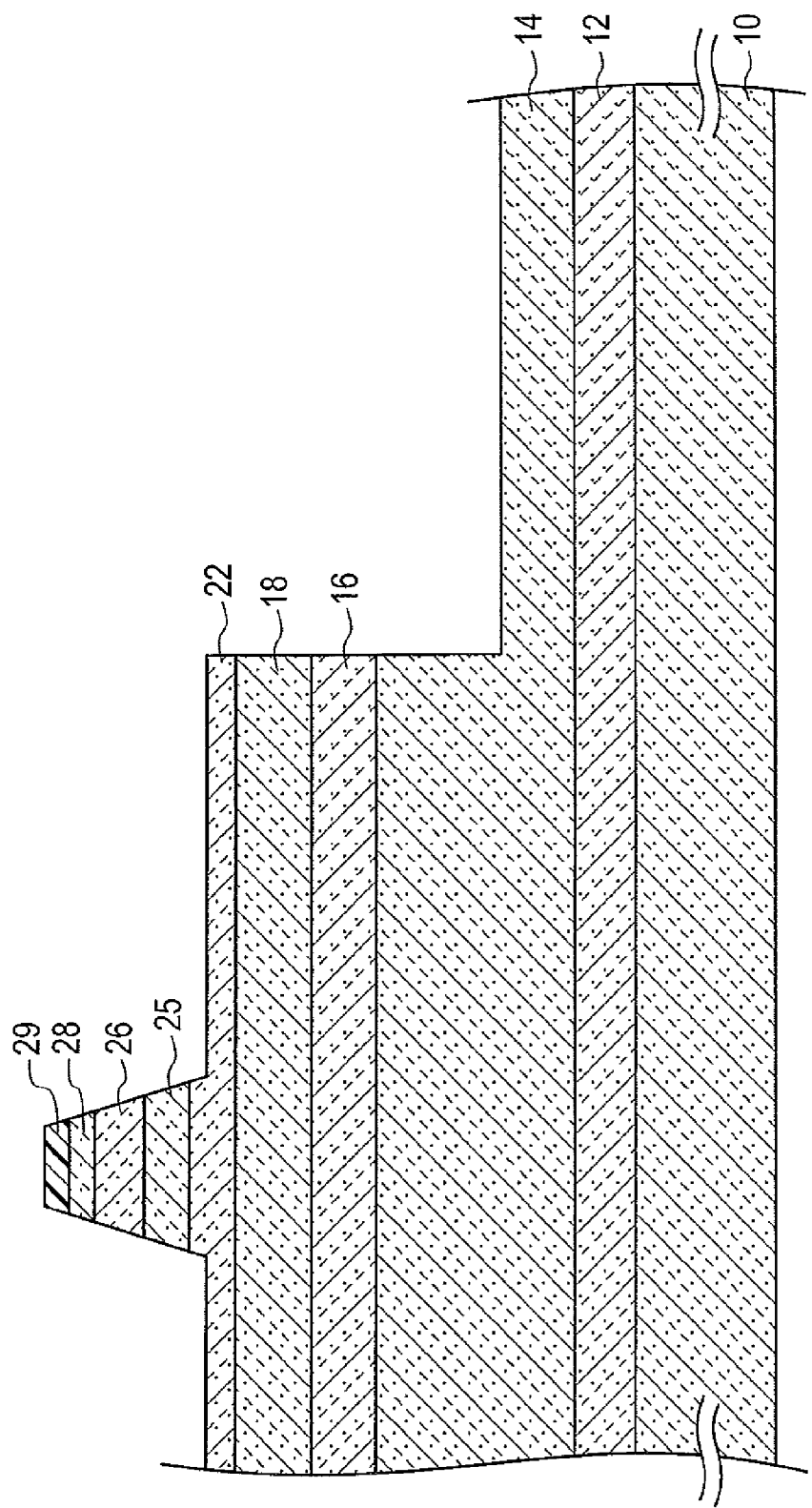
FIG. 60 is a schematic cross-sectional configuration chart for explaining one process step of the fabrication method of the nitride based semiconductor device according to the sixth embodiment of the present invention.

(f) Next, as shown in FIG. 60, removing a part of the p-type GaN based guide layer 22, the active layer 18, the n-type GaN based guide layer 16, and the n-type GaN based cladding layer 14 by etching, and then forming the second step region.

Figure 61:
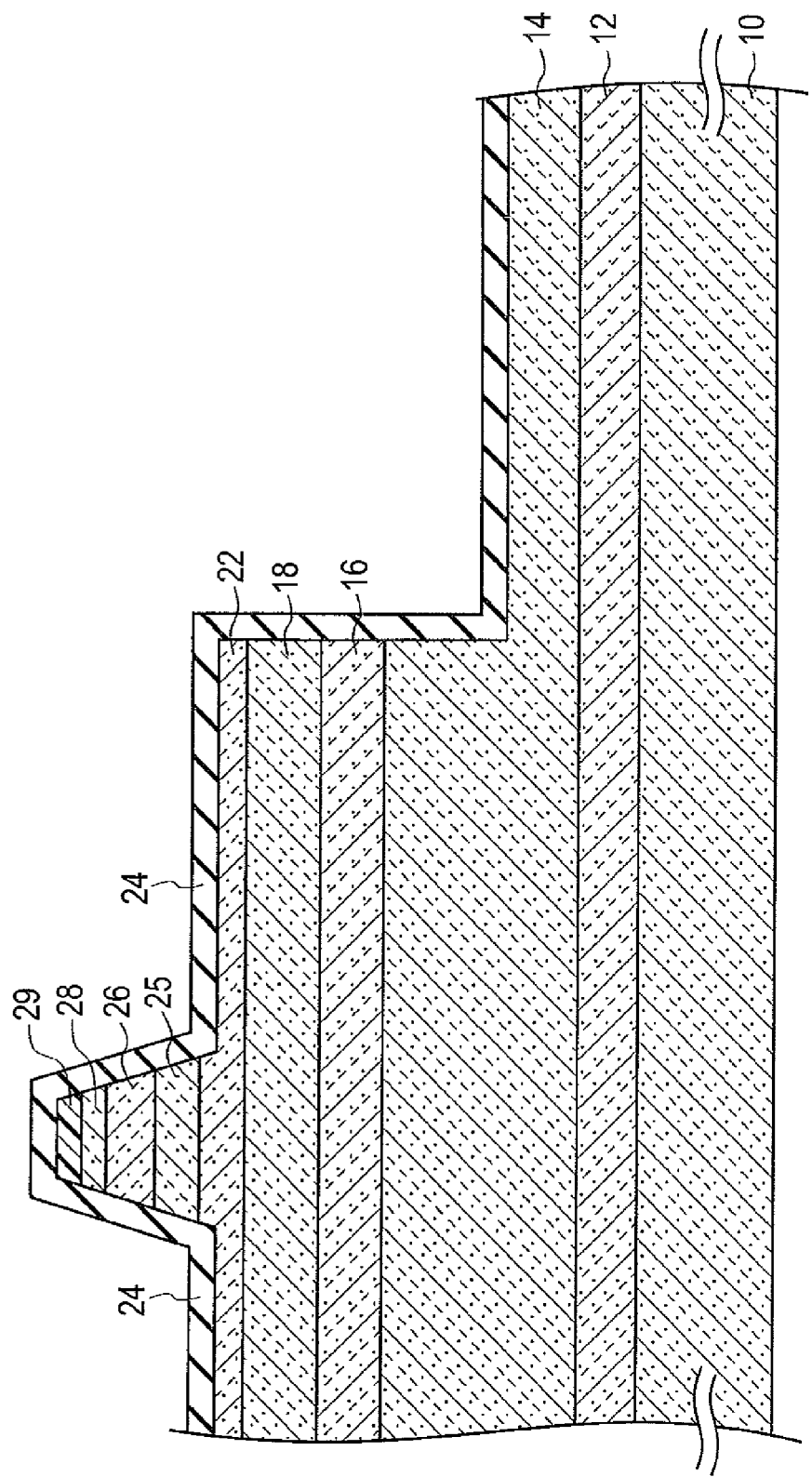
FIG. 61 is a schematic cross-sectional configuration chart for explaining one process step of the fabrication method of the nitride based semiconductor device according to the sixth embodiment of the present invention.

(g) Next, as shown in FIG. 61, forming the insulating film 24 all over the semiconductor wafer.

Figure 62:
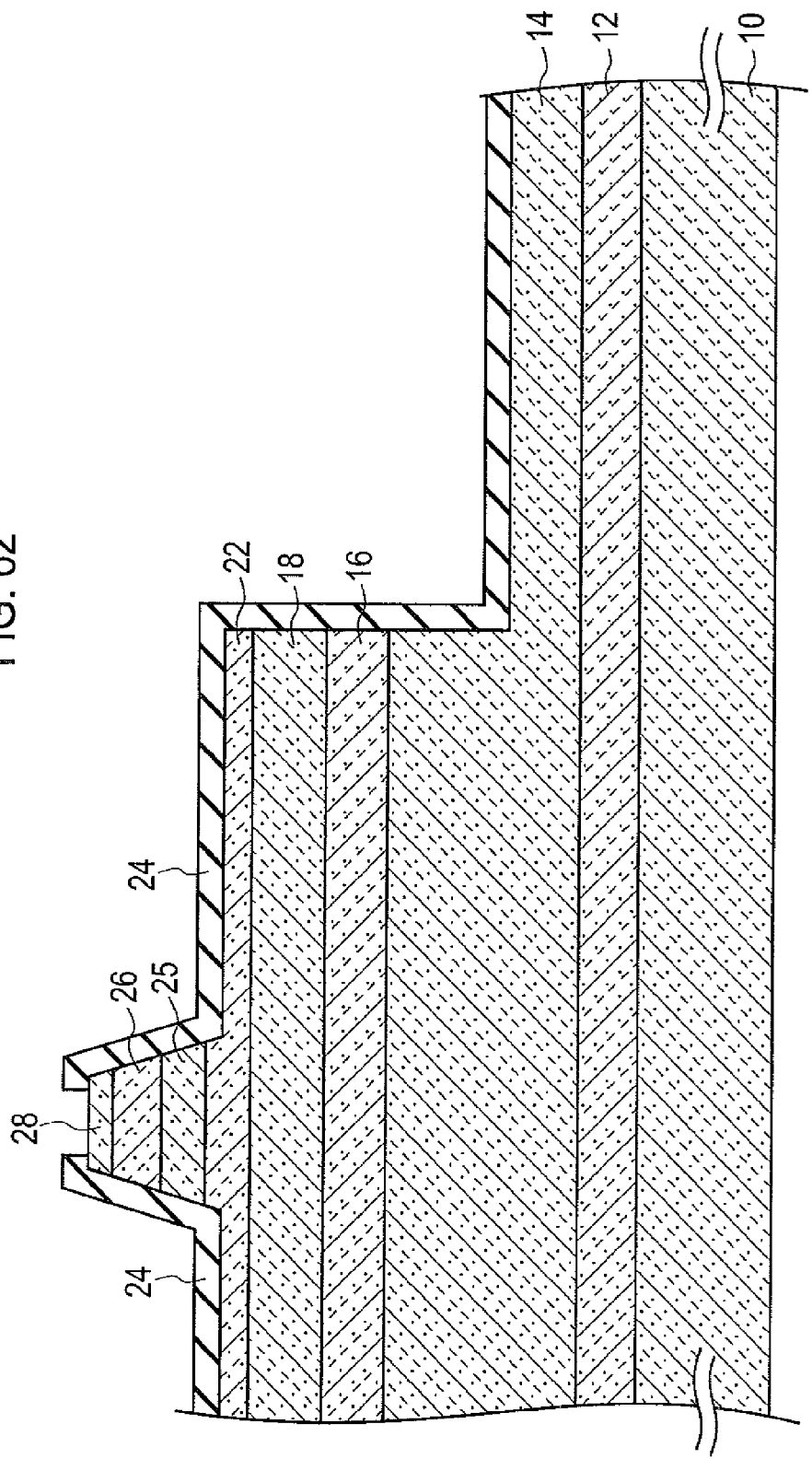
FIG. 62 is a schematic cross-sectional configuration chart for explaining one process step of the fabrication method of the nitride based semiconductor device according to the sixth embodiment of the present invention.

(h) Next, as shown in FIG. 62, removing the insulating film 24 formed on the resist layer 29 and the resist layer 29 by the lift off of the insulating film 24, and performing window opening for the p-type GaN based contact layer 28.

Figure 63:
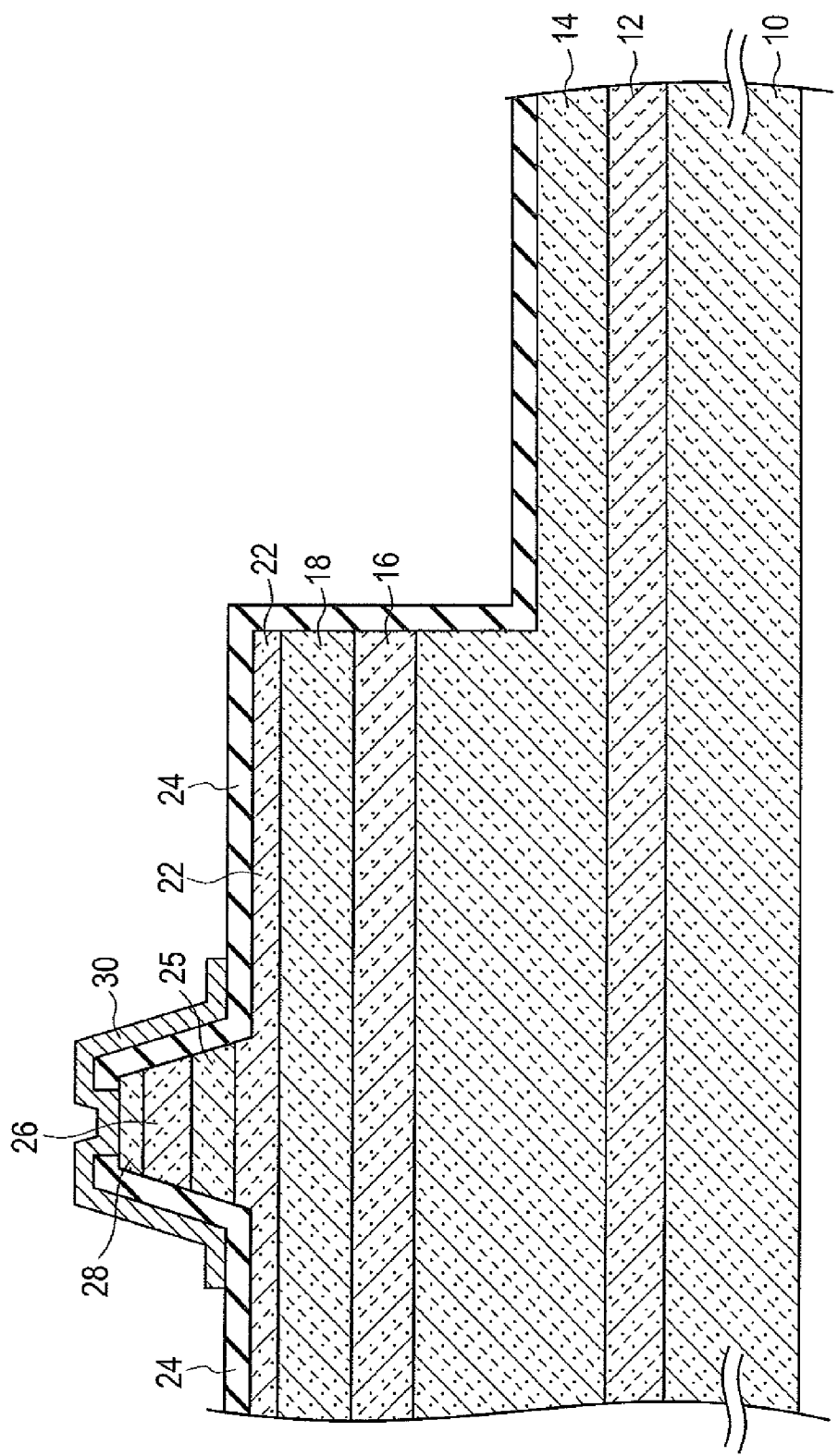
FIG. 63 is a schematic cross-sectional configuration chart for explaining one process step of a fabrication method of the nitride based semiconductor device according to the sixth embodiment of the present invention.

(i) Next, as shown in FIG. 63, patterning after forming the p-side ohmic electrode 30 on the whole semiconductor wafer surface. A vacuum evaporation method, a spattering process, etc. are applicable to the formation of the p-side ohmic electrode 30.

Figure 64:
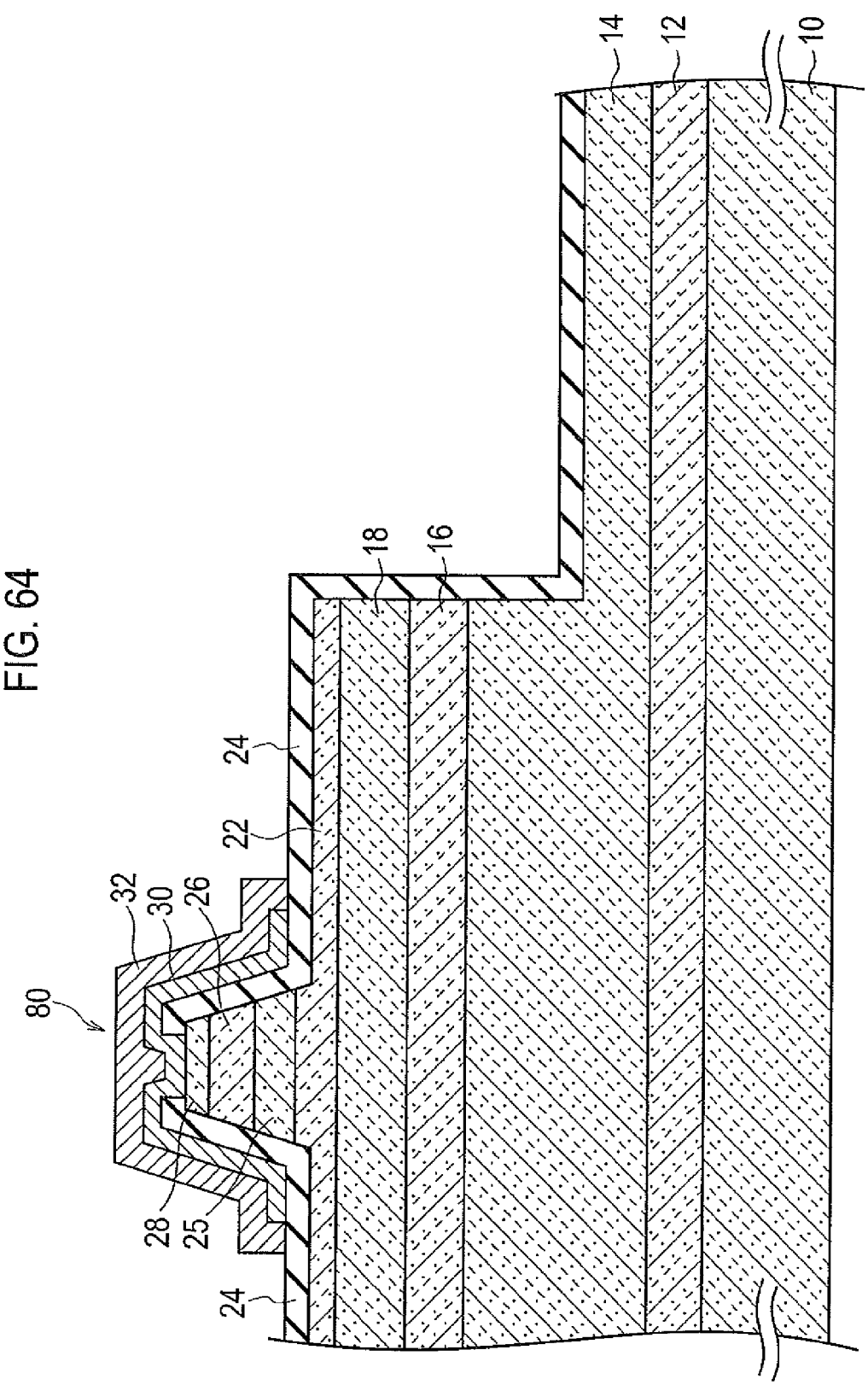
FIG. 64 is a schematic cross-sectional configuration chart for explaining one process step of the fabrication method of the nitride based semiconductor device according to the sixth embodiment of the present invention.

(j) Next, as shown in FIG. 64, patterning after forming the p-side electrode 32 on the whole semiconductor wafer surface. The vacuum evaporation method, the spattering process, etc. are applicable to the formation of the p-side electrode 32.

Although the example removed by etching to the halfway of the n-type GaN based cladding layer 14 is shown in the example shown in FIG. 64, the n-type GaN based cladding layer 14 may be completely removed by etching. The etched depth B of the second step region is about 130 nm to about 1545 nm, for example.

(k) Next, grounding the backside of the GaN based semiconductor substrate 10, applying the GaN based semiconductor substrate 10 into a thin layer, and making the thickness not more than about 100 micrometers.

(l) Next, forming the easily stable cleaved surface by putting in a scribe in the direction vertical to the extension direction of the laser stripe 80 and taking a break.

(m) Next, forming the protection film for the edge face mirror plane formed by the cleavage. The protection film of one side is a protection film of the emission face of the laser beam, for example, is $ZrO_2$, $Al_2O_3$, $SiO_2$, $TiO_2$, $Ta_2O_5$, $Nb_2O_5$, AlN, SiN, AlON, SiON, an $AlN_x$ (where $0<x<1$) film, etc. In this case, $AlN_x$ (where $0<x<1$) shows the case of the composition ratio, which shifts from stoichiometry control of AlN. The protection film of another side is a rear end face protection film, and may form a DBR (Distributed Bragg Reflector) film. The DBR film may be formed with one of $ZrO_2$, $Al_2O_3$, $SiO_2$, TiO$_2$, Ta$_2$O$_5$, Nb$_2$O$_5$, AlN, SiN, AlON, SiON or AlN$_x$ (where 0<x<1), or the multilayer film including these films.

Moreover, the DBR film has high light reflex characteristics, for example, may be provided with the layered structure, which is composed of ZrO$_2$ film and SiO$_2$ film. The thickness d1 of ZrO$_2$ film and the thickness d2 of SiO$_2$ film are formed so as to be set to d1=λ/4n$_1$ and d2=λ/4n$_2$. In this case, n$_1$ is the refractive index 2.12 of ZrO$_2$ film, and n$_2$ is the refractive index 1.46 of SiO$_2$ film. For example, d1 is about 48 nm and d2 is about 69 nm for λ=405 nm.

(n) Next, performing chip making and completing the nitride based semiconductor device 20 according to the sixth embodiment.

According to the sixth embodiment, the nitride based semiconductor device which alleviates the stress concentrated on the step corner of the laser stripe for current concentration and optical confinement and whose reliability of the element improves can be provided by applying the step of stripe shape into two steps.

Seventh Embodiment

Figure 67:
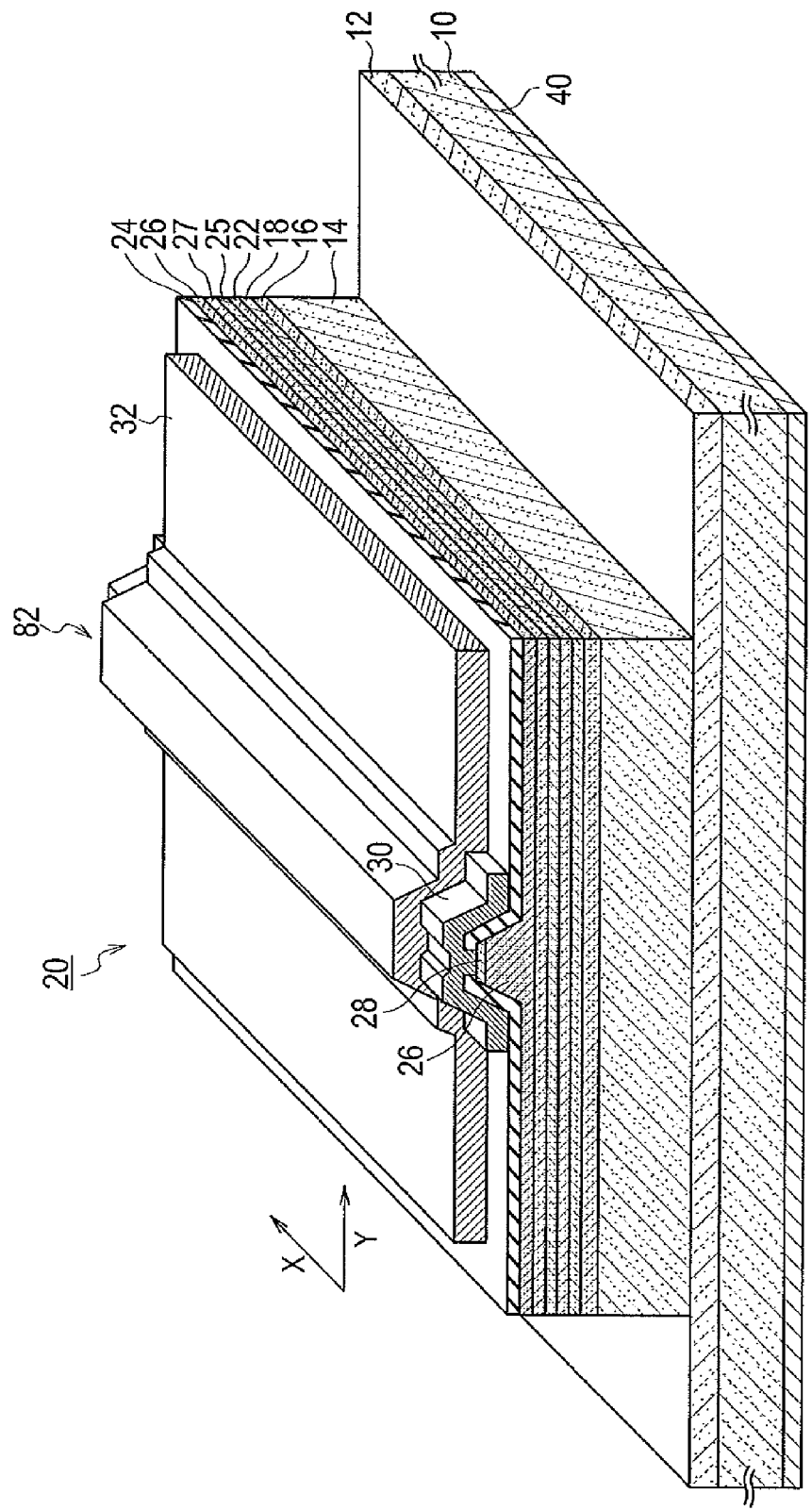
FIG. 67 is a schematic bird's-eye view of a nitride based semiconductor device according to a seventh embodiment of the present invention.

As schematically shown in the bird's-eye view of FIG. 67, a nitride based semiconductor device 20 according to a seventh embodiment includes: a GaN based semiconductor substrate 10; an n-type GaN based buffer layer 12 placed on the GaN based semiconductor substrate 10 and doped of an n-type impurity; an n-type GaN based cladding layer 14 which is placed on the n-type GaN based buffer layer 12, is doped of the n-type impurity, and includes Al; an n-type GaN based guide layer 16 which is placed on the GaN based cladding layer 14, doped of the n-type impurity, and in which the band gap is smaller than the n-type GaN based cladding layer 14; an active layer 18 placed on the n-type GaN based guide layer 16; a p-type GaN based guide layer 22 placed on the active layer 18 and doped of the p-type impurity; an electron block layer 25 placed on the p-type GaN based guide layer 22; a stress relaxation layer 27 placed on the electron block layer 25; and a p-type GaN based cladding layer 26 placed on the stress relaxation layer 27 and doped of the p-type impurity.

All or apart of the p-type GaN based cladding layer 26 composes a laser cavity 82 by centering on the active layer 18 mostly by being placed at stripe shape on the p-type guide layer 22 and forming current concentration structure.

A region, which removes the n-type GaN based cladding layer 14, exists in the direction of X in parallel to the extension direction of the laser cavity 82.

The size of the region which removes the n-type GaN based cladding layer 14 is effective in it being not less than half of a chip area at least, for example.

The active layer 18 may compose MQW structure of an In$_z$Ga$_{1-z}$N layer (where 0<=z<1) as a barrier layer and an In$_u$Ga$_{1-u}$N layer (where 0<=z<u<=1) as a well layer.

The n-type GaN based cladding layer 14 may be provided with superlattice structure including a nitride based semiconductor including Al.

The n-type GaN based guide layer 16 may be composed of Al$_x$In$_y$Ga$_{1-x-y}$N (where 0<=x, 0<=y, x+y<=1).

The stress relaxation layer 27 may be composed of an In$_x$Ga$_{1-x}$N layer (where 0<=x<=1).

The electron block layer 25 may be composed of an Al$_y$Ga$_{1-y}$N layer (where 0<y<=1).

The number of pairs of the MQW structure, which composes the active layer 18, is preferable that it is not more than three in order to raise the recombination efficiency of the injected electron-hole pairs.

In addition, the chip of the nitride based semiconductor device is placed on the laser diode (LD) bar located in a line with array form in the direction vertical of Y to the extension direction X of the laser cavity 82.

The p-type cladding layer 26 is patterned and is removed by etching, and as shown in FIG. 67, a part of patterned p-type cladding layer 26 is placed along the extension direction of the laser cavity 82 at stripe shape. On the p-type cladding layer 26, a p-type GaN based contact layer 28 is further placed along the extension direction of the laser cavity 82.

Moreover, an insulating film 24 placed on the flat part and the sidewall part of the p-type GaN based guide layer 22 and the sidewall part of the p-type GaN based contact layer 28 is provided. In the top surface of the p-type GaN based contact layer 28 placed at stripe shape, window opening of the insulating film 24 is performed. In this apertural area by which the window opening is performed, the p-type GaN based contact layer 28 contacts with the p-side ohmic electrode 30.

The p-side ohmic electrode 30 covers the sidewall part of the p-type cladding layer 26 and the p type GaN based contact layer 28 placed at stripe shape via the insulating film 24, and is placed along the extension direction X of the laser cavity 82 at stripe shape.

On the insulating film 24 and along the extension direction X of the laser cavity 82, a p-side electrode 32 is placed on the p-side ohmic electrode 30 placed at stripe shape, and an n-side electrode 40 is placed on the GaN based semiconductor substrate 10 at the side of the back side which opposes the surface where the p-side electrode 32 is placed.

(N-Type GaN Based Buffer Layer)

The n-type GaN based buffer layer 12 is formed by the GaN layer by which silicon (Si) is doped, for example, as the n-type impurity, and the thickness is not more than about 2000 nm, for example.

(N-Type GaN Based Cladding Layer)

The n-type GaN based cladding layer 14 is formed by the Al$_w$Ga$_{1-w}$N layer (where 0<=w<=1), by which Si is doped as the n-type impurity, for example. The composition ratio w of Al is about 0.05, and the thickness is about 1300 nm, for example. In addition, the n-type GaN based cladding layer 14 may be provided with superlattice structure.

(N-Type GaN Based Guide Layer)

The n-type GaN based guide layer 16 is formed by the GaN layer by which Si is doped, for example, as the n-type impurity, and the thickness is about 60 nm, for example. The band gap is smaller than the n-type GaN based cladding layer 14.

(Active Layer)

The active layer 18 is composed of MQW structure which has an In$_z$Ga$_{1-z}$N layer (where 0<=z<1) as a barrier layer and an In$_u$Ga$_{1-u}$N layer (where 0<=z<u<=1) as a well layer. The composition ratio z of In of the In$_z$Ga$_{1-z}$N layer (where 0<=z<1) which forms the barrier layer is about 0.01, for example, and the thickness is about 7 nm to about 18 nm (preferable about 16.5 nm), for example. On the other hand, the composition ratio u of In of the In$_u$Ga$_{1-u}$N layer (where 0<=z<u<=1) which forms the well layer is about 0.07, for example, and the thickness is about 2 nm to about 3 nm (preferable about 2.8 nm), for example. The number of pairs of the MQW structure which composes the active layer 18 is effective that it is not more than three at the point which heightens the confinement effect of a carrier.

(P-Type GaN Based Guide Layer)

The p-type GaN based guide layer 22 is formed by the GaN layer by which magnesium (Mg) is doped, for example, as the p-type impurity, and the thickness of the p-type GaN based guide layer 22 is about 30 nm to about 90 nm, for example. In addition, the p-type GaN based guide layer 22 should just be provided with the effect as a light guide layer, and may be formed as a undoped $In_\beta Ga_{1-\beta}N$ layer (where $0<=\beta<1$) instead of the p-type GaN based layer, for example. In this case, the composition ratio $\beta$ of In is about 0.02, for example, and the thickness is about 30 nm to about 90 nm similarly, for example. In addition, the thickness of the p-type GaN based guide layer 22 and the thickness of the n-type GaN based guide layer 16 are usually equal. By setting up in this way, the FFP of the laser beam outputted from the output end face can be applied satisfactory.

(Electron Block Layer)

The electron block layer 25 can be formed by the $Al_v Ga_{1-v}N$ layer (where $0<v<=1$), by which Mg is doped as the p-type impurity, for example. The thickness is about 3 nm to about 20 nm, and is about 7 nm to about 10 nm preferable, for example. The composition ratio v of Al is constant value, for example, about 0.2.

(Stress Relaxation Layer)

The stress relaxation layer 27 can be formed by the $In_v Ga_{1-v}N$ layer (where $0<=v<=1$), by which Mg is doped as the p-type impurity, for example. The thickness of the stress relaxation layer 27 is about 30 nm to about 50 nm, for example. The preferable composition ratio v of $1n$ is about 0.02, for example. In addition, the stress relaxation layer 27 may be the p-type GaN layer which corresponds in the case of v=0.

(P-Type Cladding Layer)

The p-type cladding layer 26 is doped of Mg as the p-type impurity, and is composed of MQW structure which has the $Al_w Ga_{1-w}N$ layer (where $0<=w<=1$) as a barrier layer and the GaN layer as a well layer, for example. The composition ratio w of Al of the $Al_w Ga_{1-w}N$ layer (where $0<=w<=1$), which forms the barrier layer, is about 0.1, for example. The number of pairs of the MQW structure, which composes the p-type cladding layer 26, is preferable that it is about 90 in respect of improvement in crystal quality.

(P-Type GaN Based Contact Layer)

The p-type GaN based contact layer 28 is formed by the GaN layer, by which Mg is doped as the p-type impurity, for example, and the thickness is about 60 nm, for example.

(Insulating Film)

The insulating film 24 is formed by $ZrO_2$, for example, and the thickness is about 200 nm, for example.

As the insulating film 24, $Al_2O_3$, $SiO_2$, $TiO_2$, $Ta_2O_5$, $Nb_2O_5$, AlN, SiN, AlON, SiON, AlN, (where $0<\alpha<1$), or these cascade films are applicable to others.

(Electrode Structure)

Moreover, the p-side ohmic electrode 30 is also called a p-type contact metal, for example, and is formed by Pd/Au. The thickness of Pd/Au is about 10 nm/about 50 nm, for example.

Moreover, the p-side electrode 32 is also called a p-type pad metal, for example, and is formed by Ti/Au. The thickness of Ti/Au is about 50 nm/about 500 nm, for example.

Moreover, the n-side electrode 40 is formed by Al/Pt/Au or Al/Ti/Au, for example. The thickness of Al/Pt(Ti)/Au is about 100 nm/about 10 nm/about 200 nm, for example.

In the nitride based semiconductor device 20 according to the seventh embodiment, the stress accompanying the lattice constant mismatching of GaAlN/GaN occurred in the interface between the electron block layer 25 and the p-type GaN based guide layer 22 can also be distributed on both sides of the p-type GaN based guide layer 22 and the stress relaxation layer 27 by forming the stress relaxation layer 27.

(Fabrication Method)

One process step of the fabrication method of the nitride based semiconductor device according to the seventh embodiment is expressed as shown in FIG. 68 to FIG. 76.

The fabrication method of the nitride based semiconductor device according to the seventh embodiment includes: the step for which the GaN based semiconductor substrate 10 is prepared; the step of forming the n-type GaN based cladding layer 14 by which the n-type impurity is doped and which includes Al, on the GaN based semiconductor substrate 10; the step of forming the n-type GaN based guide layer 16 by which the n-type impurity is doped and in which the band gap is smaller than the n-type GaN based cladding layer 14, on the GaN based cladding layer 14; the step of forming the active layer 18 on the n-type GaN based guide layer 16; the step of forming the p-type GaN based guide layer 22 by which the p-type impurity is doped, on the active layer 18; the step of forming the electron block layer 25 on the p-type GaN based guide layer 22; the step of forming the stress relaxation layer 27 on the electron block layer 25; the step of forming the p-type GaN based cladding layer 26 by which the p-type impurity is doped, on the stress relaxation layer 27; the step of etching all or a part of the p-type GaN based cladding layer 26 into stripe shape on the p-type GaN based guide layer 22, and forming the laser cavity 82 of current concentration structure; and the step of removing the n-type GaN based cladding layer 14 by etching in parallel with the extension direction X of the laser cavity 82.

In the fabrication method of the nitride based semiconductor device according to the seventh embodiment, it is effective that the etching area is not less than half of the chip area at least at the point which dissolves the curvature on the GaN based semiconductor substrate 10.

The multiple quantum well structure of an $In_z Ga_{1-z}N$ layer (where $0<=z<1$) as a barrier layer and an $In_u Ga_{1-u}N$ layer (where $0<=z<u<=1$) as a well layer can be formed in the active layer 18.

The superlattice structure including the nitride based semiconductor including Al can also be formed in the n-type GaN based cladding layer 14.

An $Al_X In_Y Ga_{1-X-Y}N$ (where $0<=X$, $0<=Y$, $X+Y<=1$) layer can also be formed in the n-type GaN based guide layer 16.

An $In_x Ga_{1-x}N$ layer (where $0<=x<=1$) is formed in the stress relaxation layer 27.

An $Al_y Ga_{1-y}N$ layer (where $0<y<=1$) is formed in the electron block layer 25.

Figure 79:
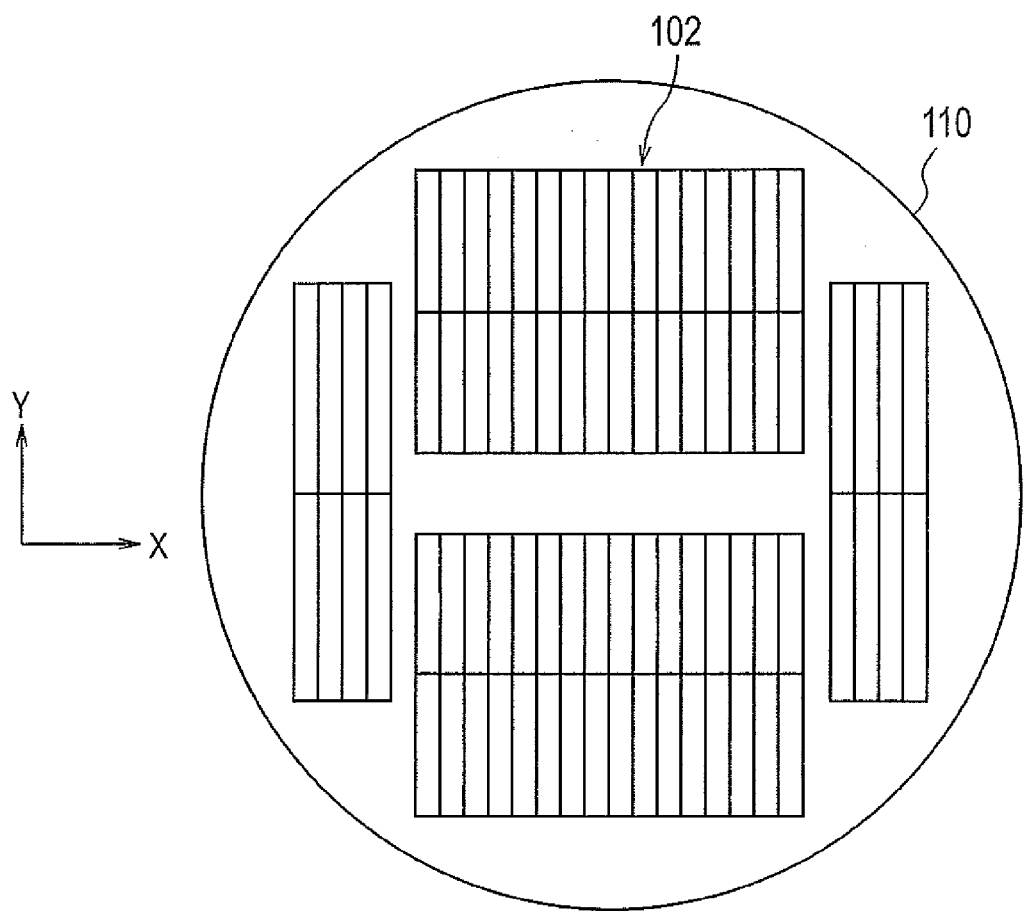
FIG. 79 shows an example of an arrangement configuration on a semiconductor wafer of the LD bar of the nitride based semiconductor device according to the seventh embodiment of the present invention.

As shown in FIG. 78 to FIG. 79 described later, the fabrication method of the nitride based semiconductor device according to the seventh embodiment, on the semiconductor wafer 110, further includes: the step for which a plurality of chips of the nitride based semiconductor device are arrayed to array form at parallel in the direction vertical Y to the extension direction X of the laser cavity 82, and the step of cleaving the end face of the laser cavity 82 of the nitride based semiconductor device, and forming the LD bar 102.

Figure 81A:
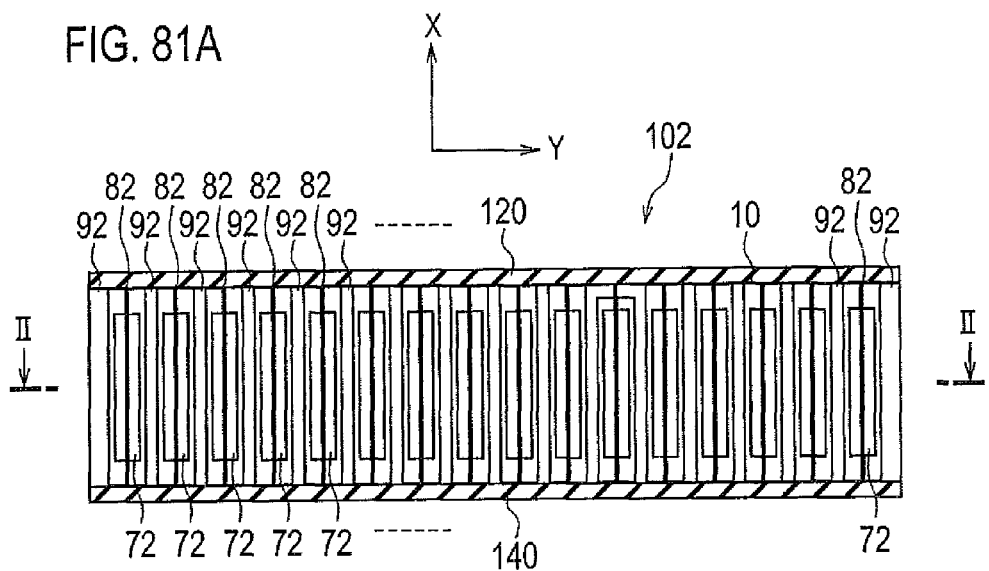
FIG. 81A is a chart for explaining one process step of a fabrication method of the nitride based semiconductor device according to the seventh embodiment of the present invention, and is a plane pattern configuration example in which the protection film is formed to a cleaved surface of the sidewall part of the laminated LD bar.
Figure 81B:
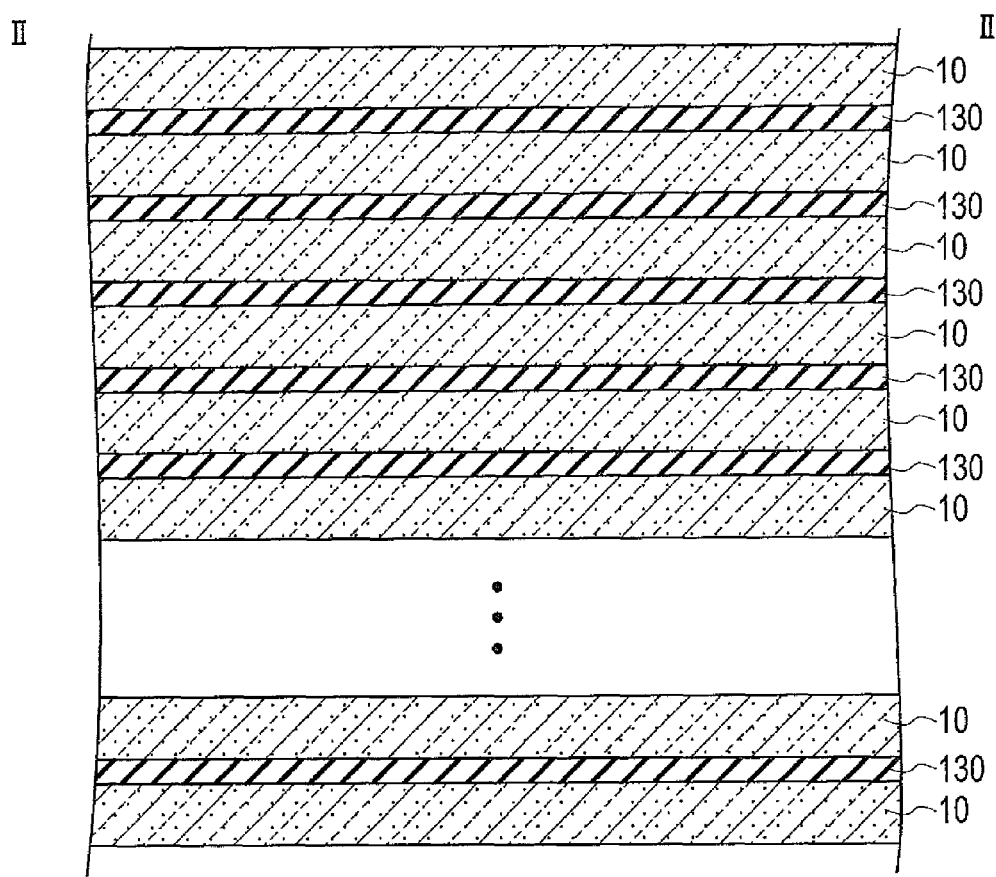
FIG. 81B is a schematic cross-sectional configuration chart taken in the line II-II of FIG. 81A.

Moreover, as shown in FIG. 81 described later, the fabrication method of the nitride based semiconductor device according to the seventh embodiment includes the step of laminating LD bar 102 into a plurality of layers, and the step of forming the protection film 120,140 on the sidewall of the LD bar 102 laminated the plurality of layers.

The protection films 120,140 are formed by sputtering. In addition, the formation process of the protection film 120,140 is not be limited to the sputtering, and can also apply CVD, a vacuum evaporation method, an ALD (Atomic Layer Deposition) method, an MBE (Molecular Beam Epitaxy) method, an MLE (Molecular Layer Epitaxy) method, and an ion beam sputtering method, etc.

Hereinafter, the fabrication method of the nitride based semiconductor device according to the seventh embodiment will be explained with reference to drawings.

Figure 68:
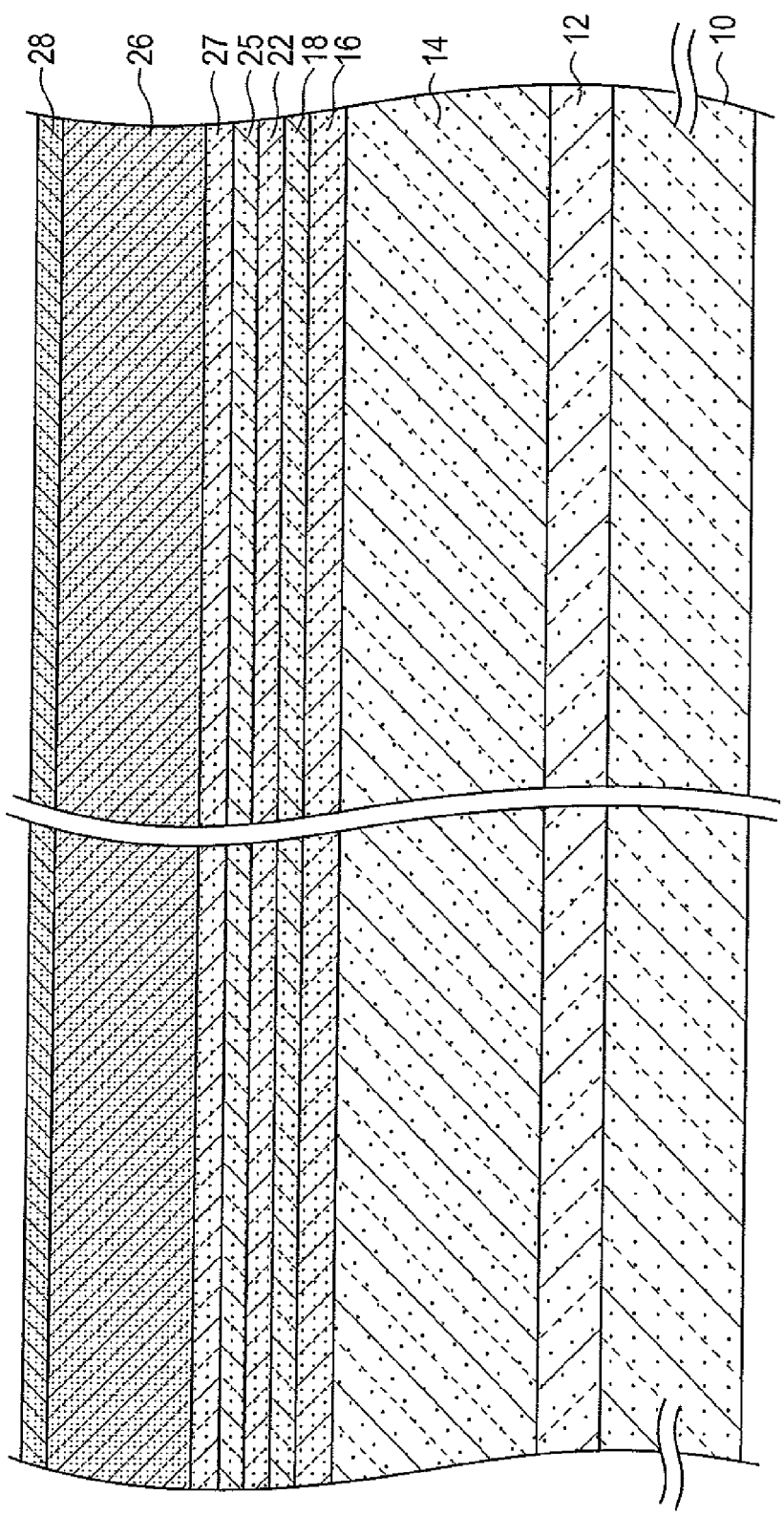
FIG. 68 is a schematic cross-sectional configuration chart for explaining one process step of a fabrication method of the nitride based semiconductor device according to the seventh embodiment of the present invention.

(a) First of all, as shown in FIG. 68, preparing the GaN based semiconductor substrate 10. The thickness of the GaN based semiconductor substrate 10 is about 300 micrometers, for example. A plane direction applies c plane, except c plane, that is, a nonpolar plane, such as a plane and m plane, or a semi-polar plane, to the principal surfaceand. When the light-emitting device, which has a p-type layer and an n-type layer by the GaN based semiconductor substrate 10 which applies the nonpolar plane or the semi-polar plane to the principal surface is fabricated, the light-emitting of a strong polarization condition is possible.

(b) Next, as shown in FIG. 68, forming the n-type GaN based buffer layer 12, the n-type GaN based cladding layer 14, the n-type GaN based guide layer 16, the active layer 18, the p-type GaN based guide layer 22, the electron block layer 25, the stress relaxation layer 27, the p-type cladding layer 26, and the p-type GaN based contact layer 28 one after another on the GaN based semiconductor substrate 10. As the formation method of these layers, the MOCVD method is applicable. Alternatively, the ALD method, the MBE method, the MLE method, the spattering method, etc. are also applicable.

Figure 69:
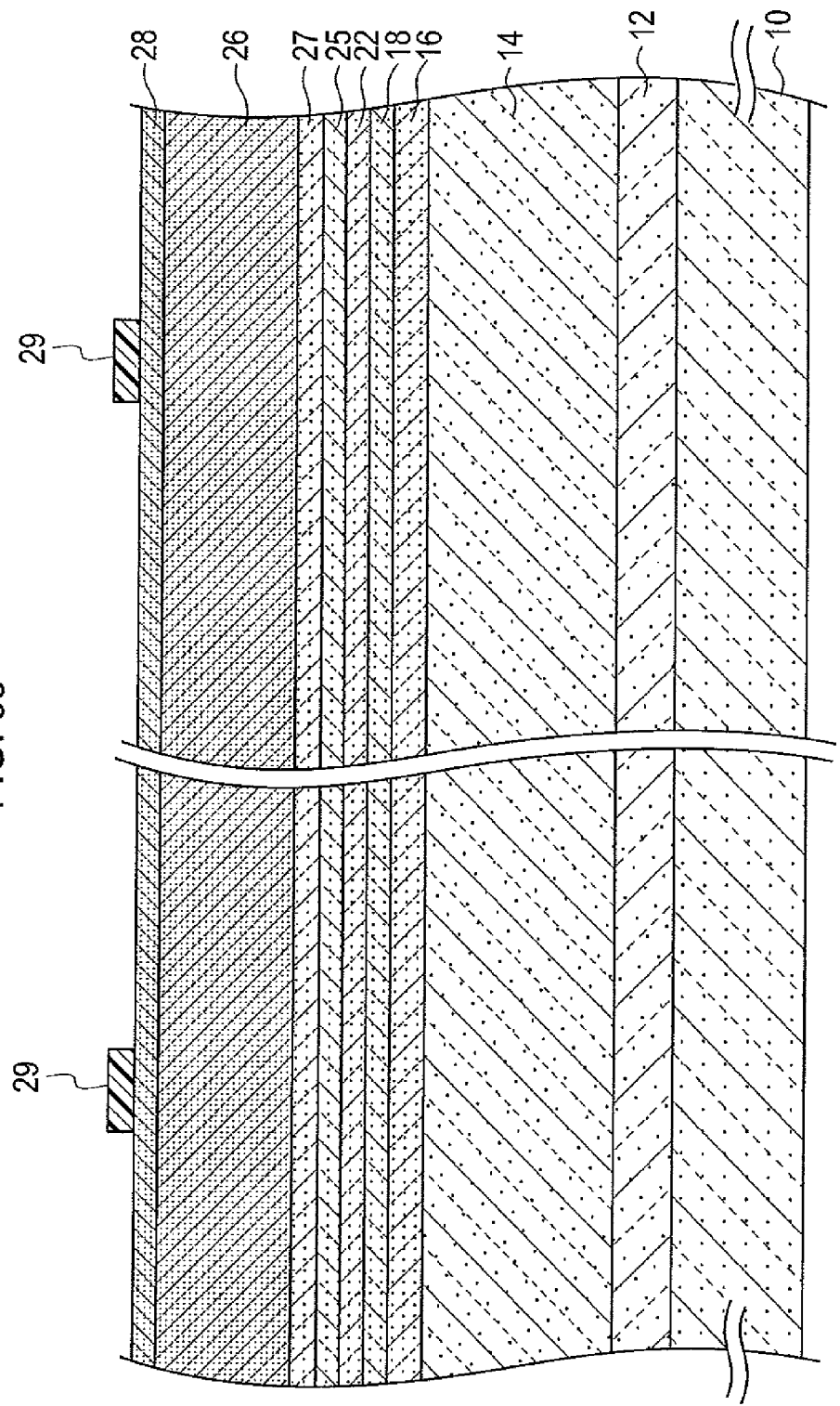
FIG. 69 is a schematic cross-sectional configuration chart for explaining one process step of the fabrication method of the nitride based semiconductor device according to the seventh embodiment of the present invention.

(c) Next, as shown in FIG. 69, performing lithography and patterning after applying the resist layer 29 on the p-type GaN based contact layer 28.

Figure 70:
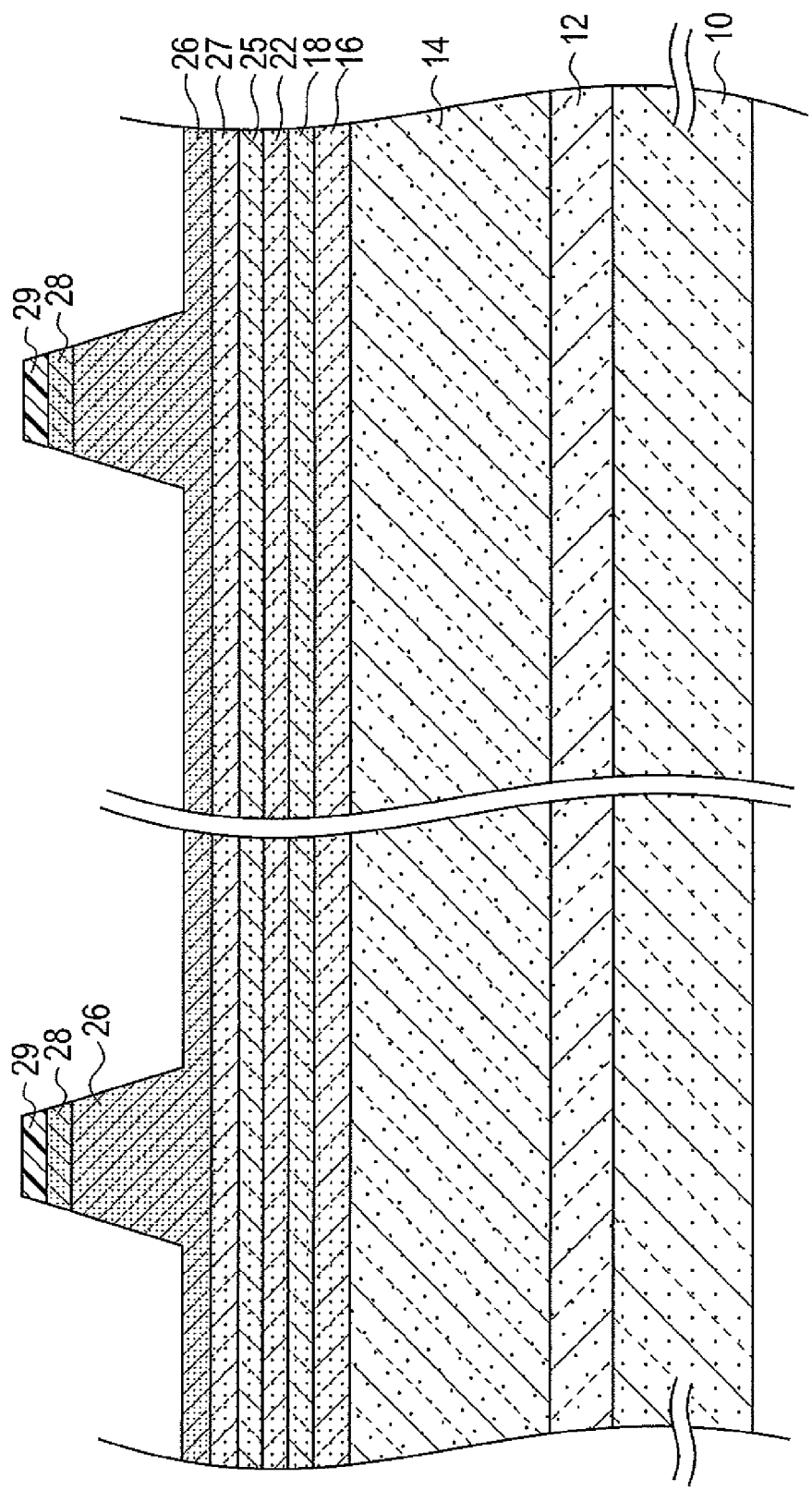
FIG. 70 is a schematic cross-sectional configuration chart for explaining one process step of the fabrication method of the nitride based semiconductor device according to the seventh embodiment of the present invention.

(d) Next, as shown in FIG. 70, removing a part or all of the p-type GaN based contact layers 28 and the p-type cladding layers 26 by etching by applying the resist layer 29 as a mask. As conditions for etching, RIE (Reactive Ion Etching) or the combination of RIE and wet etching may be suitable. By such etching, as shown in FIG. 70, the laser cavity 82, which has current concentration structure, can be formed. The depth of etching is about 0.5 micrometer, for example.

Figure 71:
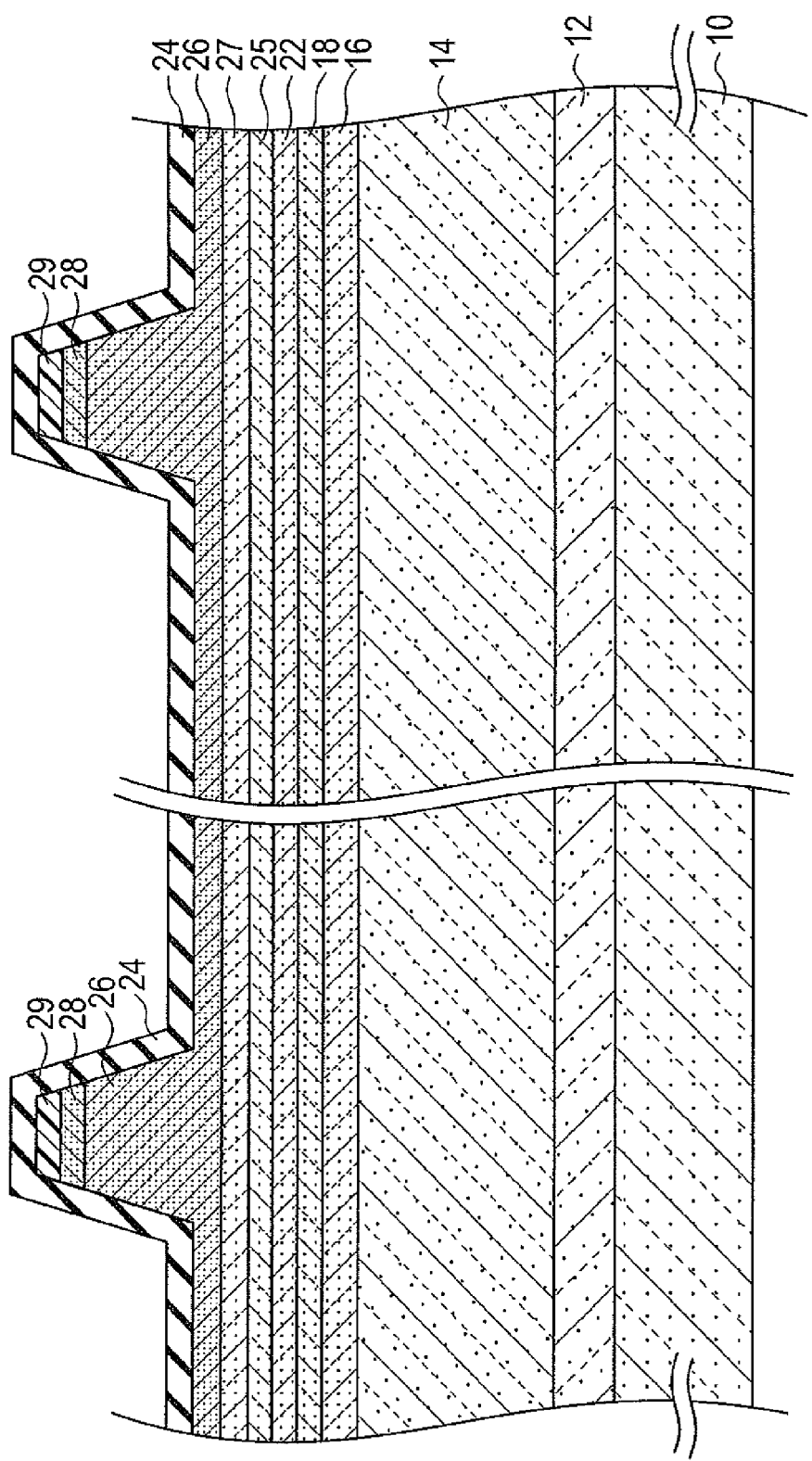
FIG. 71 is a schematic cross-sectional configuration chart for explaining one process step of the fabrication method of the nitride based semiconductor device according to the seventh embodiment of the present invention.

(e) Next, as shown in FIG. 71, forming the insulating film 24 all over the semiconductor wafer.

Figure 72:
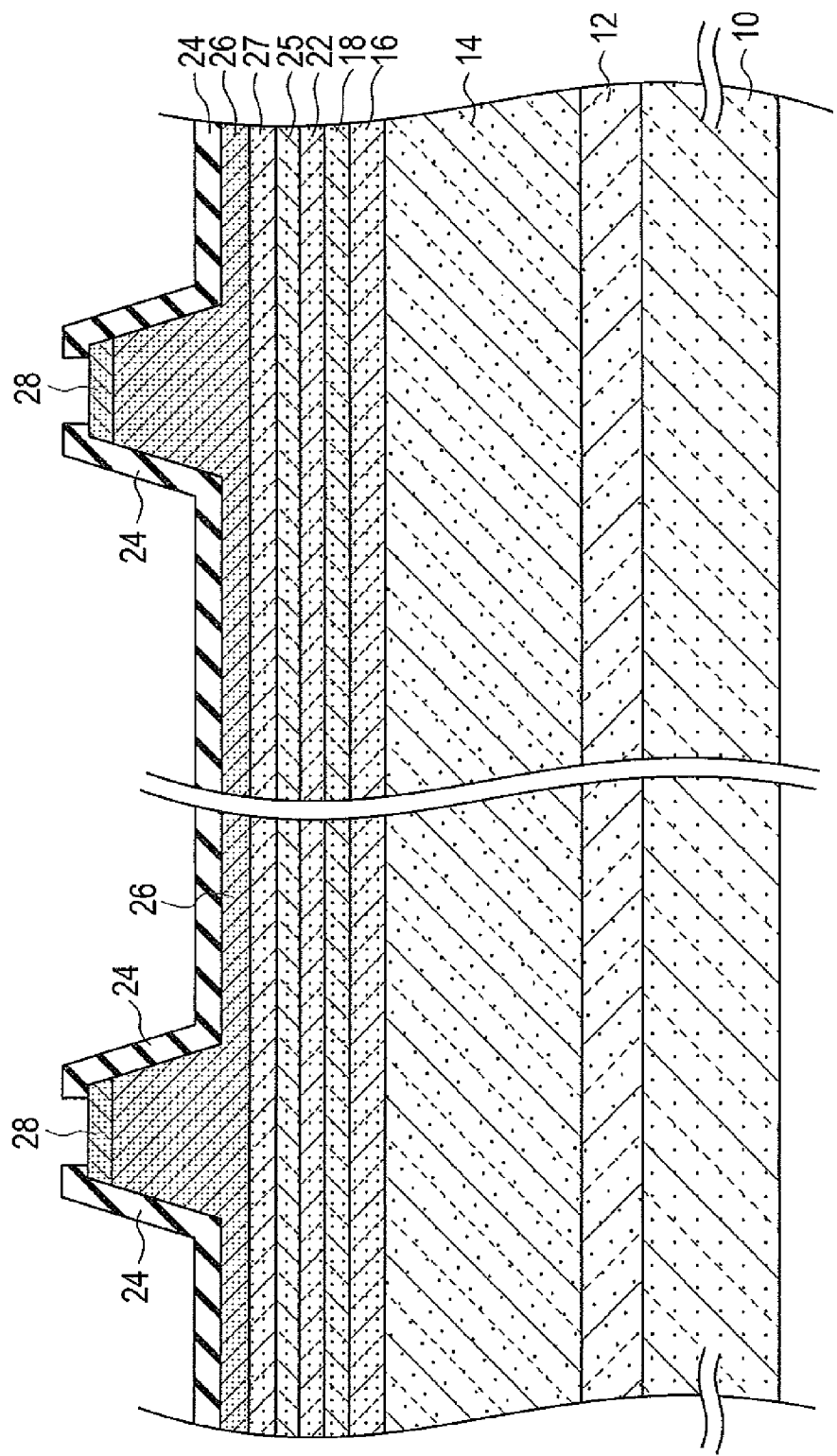
FIG. 72 is a schematic cross-sectional configuration chart for explaining one process step of the fabrication method of the nitride based semiconductor device according to the seventh embodiment of the present invention.

(f) Next, as shown in FIG. 72, removing the insulating film 24 formed on the resist layer 29 and the resist layer 29 by the lift off of the insulating film 24, and performing window opening for the p-type GaN based contact layer 28.

Figure 73:
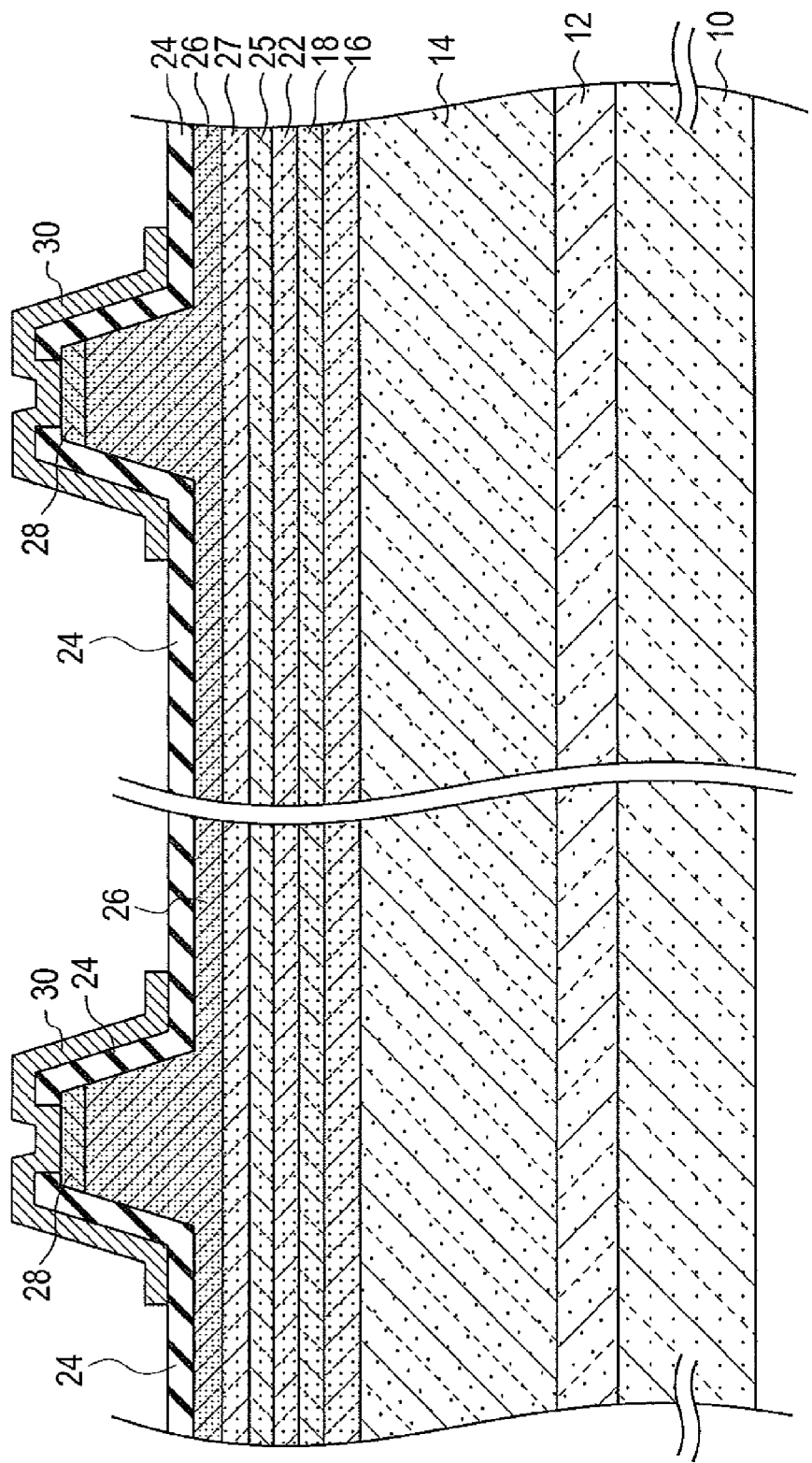
FIG. 73 is a schematic cross-sectional configuration chart for explaining one process step of the fabrication method of the nitride based semiconductor device according to the seventh embodiment of the present invention.

(g) Next, as shown in FIG. 73, patterning after forming the p-side ohmic electrode 30 on the whole semiconductor wafer surface. A vacuum evaporation method, a spattering process, etc. are applicable to the formation of the p-side ohmic electrode 30.

Figure 74:
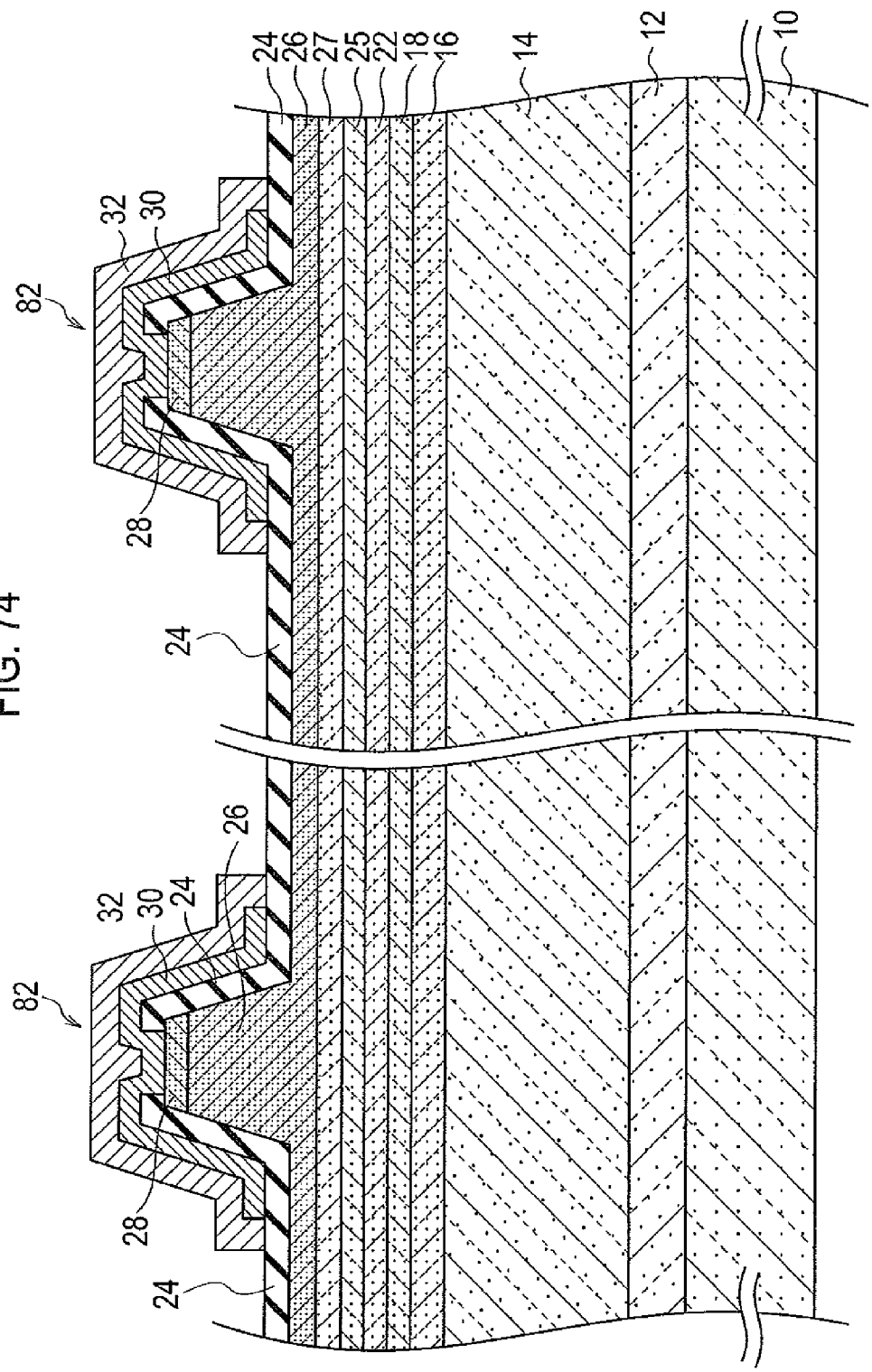
FIG. 74 is a schematic cross-sectional configuration chart for explaining one process step of the fabrication method of the nitride based semiconductor device according to the seventh embodiment of the present invention.

(h) Next, as shown in FIG. 74, patterning after forming the p-side electrode 32 on the whole semiconductor wafer surface. The vacuum evaporation method, the spattering process, etc. are applicable to the formation of the p-side electrode 32.

Figure 75:
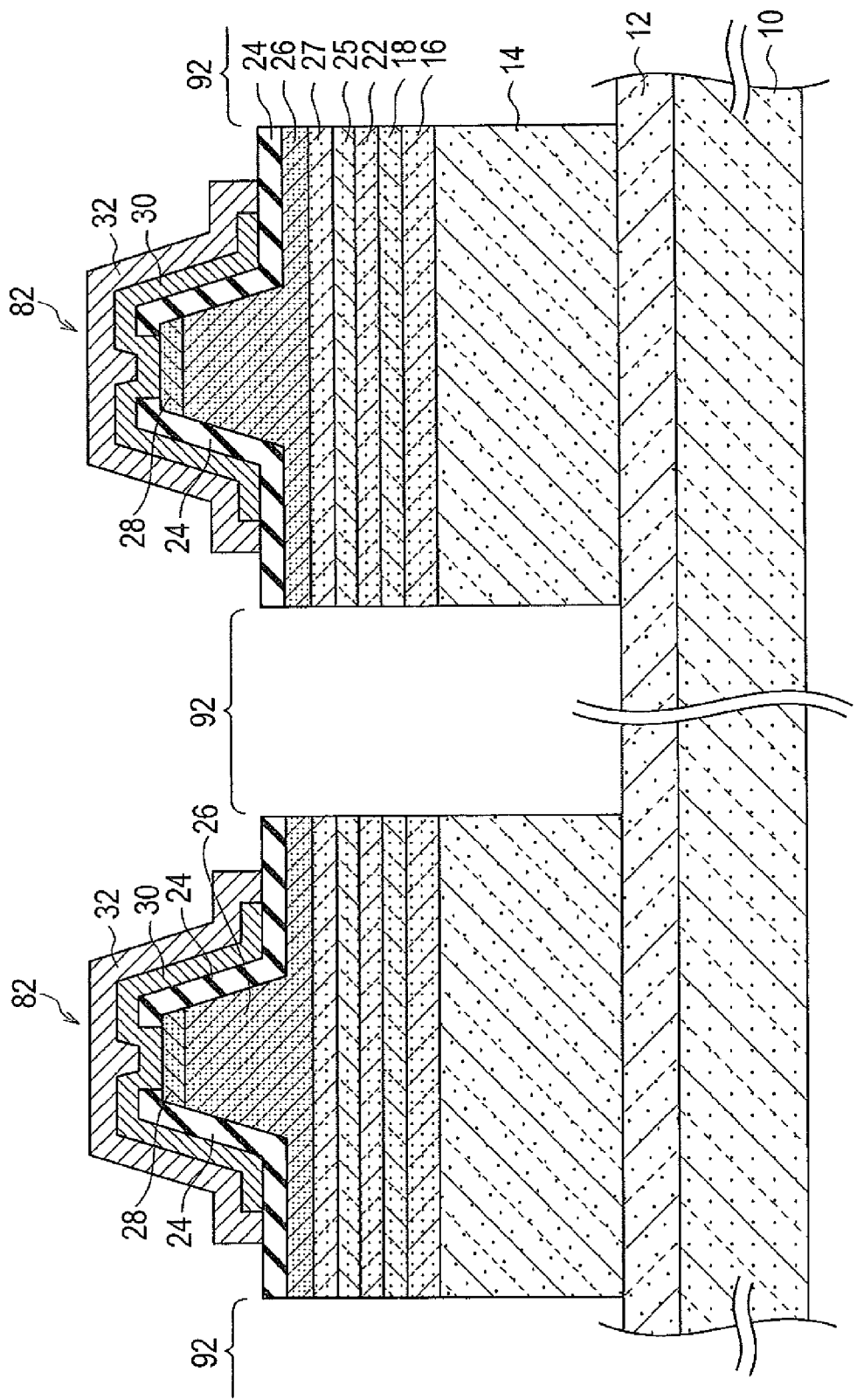
FIG. 75 is a schematic cross-sectional configuration chart for explaining one process step of the fabrication method of the nitride based semiconductor device according to the seventh embodiment of the present invention.

(i) Next, as shown in FIG. 75, removing, by etching, the insulating film 24, the p-type cladding layer 26, the stress relaxation layer 27, the electron block layer 25, the p-type GaN based guide layer 22, the active layer 18, the n-type GaN based guide layer 16, and the n-type GaN based cladding layer 14 by patterning. The part shown with the reference sign 92 indicates the etching region. In the example shown in FIG. 75, the n-type GaN based cladding layer 14 may be removed by etching even in the halfway of the n type GaN based cladding layer 14, although the example completely removed by etching is shown. The etching area is not less than half of the chip area, at least. The depth of the etching region 92 is about 1.5 micrometers, for example.

(j) Next, grounding the backside of the GaN based semiconductor substrate 10, applying the GaN based semiconductor substrate 10 into a thin layer, and making the thickness not more than about 100 micrometers.

(k) Next, forming the easily stable cleaved surface and forming the LD bar by putting in a scribe in the direction vertical to the extension direction of the laser cavity 82 and taking a break.

Figure 76:
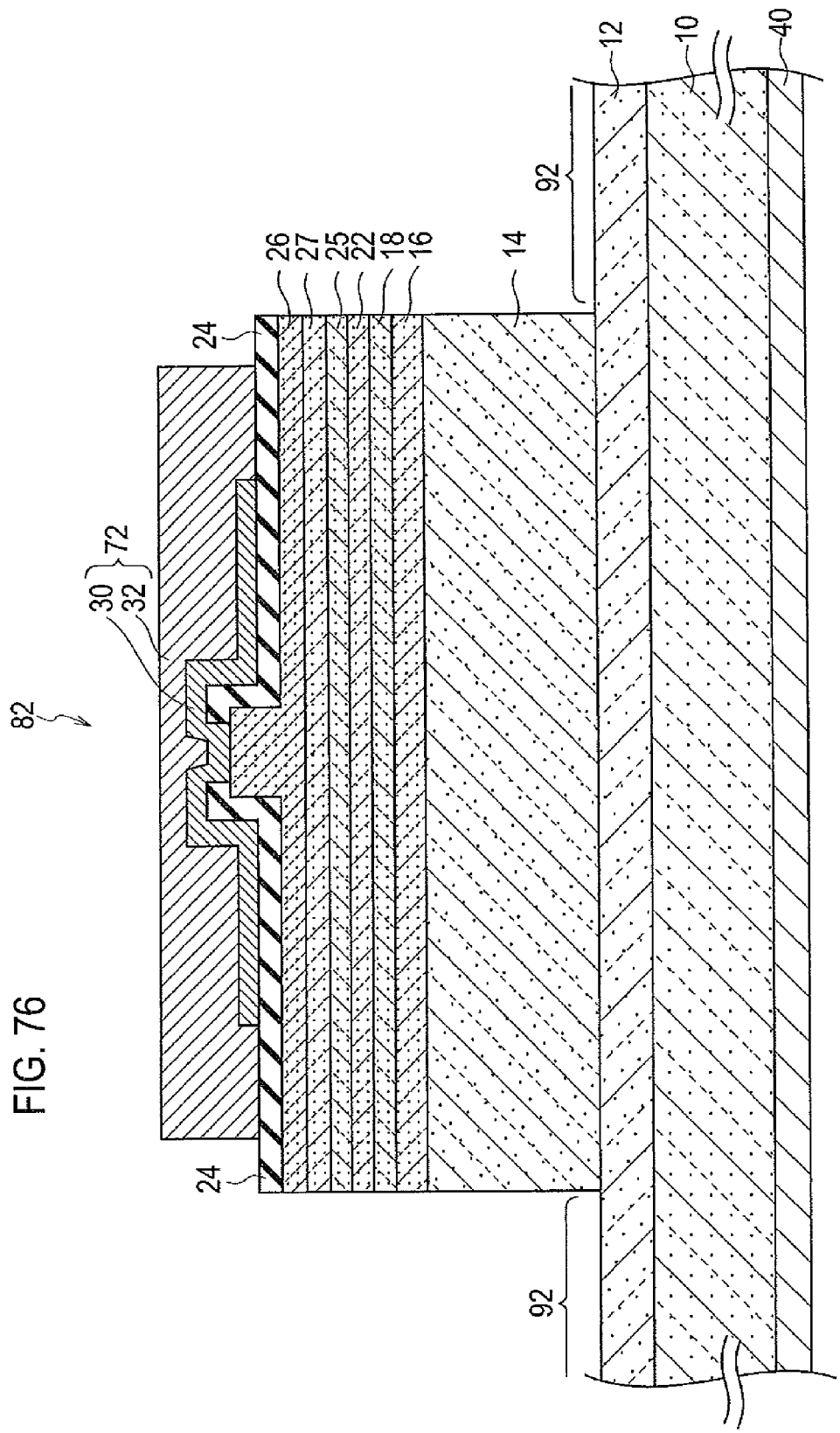
FIG. 76 is a schematic cross-sectional configuration chart to which a laser cavity part of the nitride based semiconductor device according to the seventh embodiment of the present invention is enlarged.

An example of schematic section structure to which the laser cavity 82 of one nitride based semiconductor device in the LD bar which formed the cleaved surface as mentioned above is enlarged is expressed as shown in FIG. 76. In the example of FIG. 76, the p-side common electrode 72 formed by lamination with the p-side ohmic electrode 30 and the p-side electrode 32 is formed on one part of the laser cavity 82 of the nitride based semiconductor device of the electrode structure by which flattening is performed.

(l) Next, as shown in FIG. 81, pasting and laminating the plural pieces of the LD bar 102 having the edge face mirror plane formed of cleavage by the adhesive layer 130, and forming the protection film 120,140 for the edge face mirror plane. The protection film 120 is a protection film of the emission face of the laser beam, for example, is $ZrO_2$, $Al_2O_3$, $SiO_2$, $TiO_2$, $Ta_2O_5$, $Nb_2O_5$, AlN, SiN, AlON, SiON, an $AlN_x$ (where $0<x<1$) film, etc. In this case, $AlN_x$ (where $0<x<1$) shows the case of the composition ratio which shifts from stoichiometry control of AlN. The protection film 140 is a rear end face protection film, and may form a DBR (Distributed Bragg Reflector) film. The DBR film may be formed with one of $ZrO_2$, $Al_2O_3$, $SiO_2$, $TiO_2$, $Ta_2O_5$, $Nb_2O_5$, AlN, SiN, AlON, SiON or $AlN_x$ (where $0<x<1$), or the multilayer film including these films.

Moreover, the DBR film has high light reflex characteristics, for example, may be provided with the layered structure, which is composed of $ZrO_2$ film and $SiO_2$ film. The thickness d1 of $ZrO_2$ film and the thickness d2 of $SiO_2$ film are formed so as to be set to $d1=\lambda/4n_1$ and $d2=\lambda/4n_2$. In this case, $n_1$ is the refractive index about 2.12 of $ZrO_2$ film, and $n_2$ is the refractive index about 1.46 of $SiO_2$ film. For example, d1 is about 48 nm and d2 is about 69 nm for $\lambda=405$ nm.

(m) Next, exfoliating the adhesive layer 130, performing chip making of each the LD bar 102, and then completing the nitride based semiconductor device according to the seventh embodiment. By alleviating curvature, the workability at the time of edge face coating/chip making improves, and the yield improves.

Figure 77A:
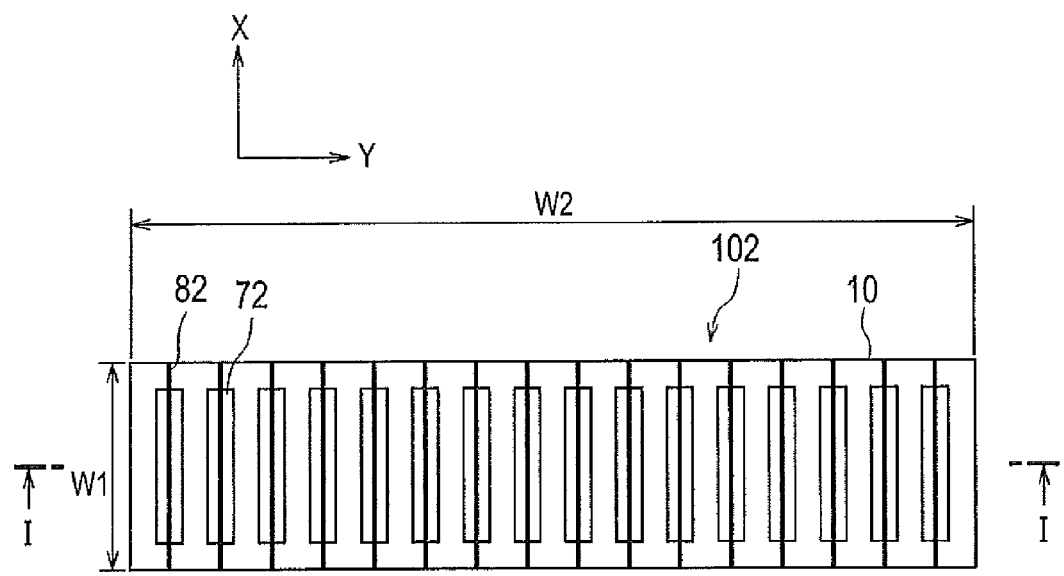
FIG. 77A shows a plane pattern configuration example of an LD bar of the nitride based semiconductor device according to a comparative example of the present invention.
Figure 77B:
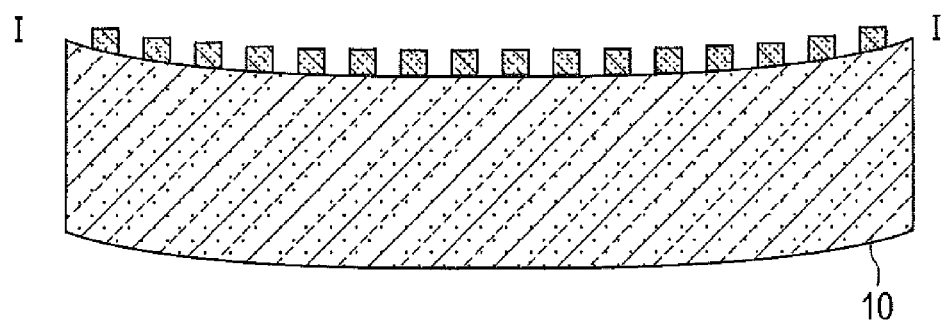
FIG. 77B shows an example of section structure of the LD bar according to the comparative example, when the wafer taken in the line I-I of FIG. 77A curves.

A plane pattern configuration example of the LD bar 102 of the nitride based semiconductor device according to a comparative example of the present invention is expressed as shown in FIG. 77A, and an example of section structure of LD bar 102 according to the comparative example taken in the line I-I of FIG. 77A is expressed by the shape where the GaN based semiconductor substrate 10 curved as shown in FIG. 77B. The laser cavity 82 having the p-side common electrode 72 is extended in the direction of X, and plurality is placed in parallel with the direction of Y, and it is formed as one LD bar 102. The width W1 of LD bar 102 is equivalent to the length of the laser cavity 82, and is about several 10 micrometers to about several 100 micrometers, for example. On the other hand, the length W2 of LD bar 102 is about several 100 micrometers to about several 10 mm.

As for the LD bar 102 of the nitride based semiconductor device according to the comparative example, since a part of the n-type GaN based cladding layer 14 including Al is not removed by etching, the stress based on the lattice mismatching occurs between the GaN based semiconductor substrate 10 and the n-type GaN based cladding layer 14 including Al, and as shown in FIG. 77B, it becomes the shape where the GaN based semiconductor substrate 10 curved.

A plane pattern configuration example of the LD bar 102 of the nitride based semiconductor device according to the seventh embodiment is expressed as shown in FIG. 78A, and another plane pattern configuration example of the LD bar of the nitride based semiconductor device according to the seventh embodiment is expressed as shown in FIG. 78B. The size of LD bar 102 is the same as that of the comparative example. The example shown in FIG. 78B has the large size of the etching region 92 of the n-type GaN based cladding layer 14 including Al.

Moreover, an example of an arrangement configuration on the semiconductor wafer 110 of the LD bar 102 of the nitride based semiconductor device according to the seventh embodiment is expressed as shown in FIG. 79. The size of each LD bar 102 is the same as that of the comparative example. Since the n-type GaN based cladding layer 14 including Al is continuing in the extension direction X of the laser cavity 82, the direction of the curvature of the GaN based semiconductor substrate 10 is limited in the direction of X. Accordingly, in order to make the resonator mirror, the easily stable cleaved surface can be obtained by putting in the scribe and taking a break in the direction of Y in the shape where the laser cavity 82 is avoided, to the surface which made the laser cavity 82 of the GaN based semiconductor substrate 10, as shown in FIG. 79. That is, the stable resonator mirror can be made.

Figure 80A:
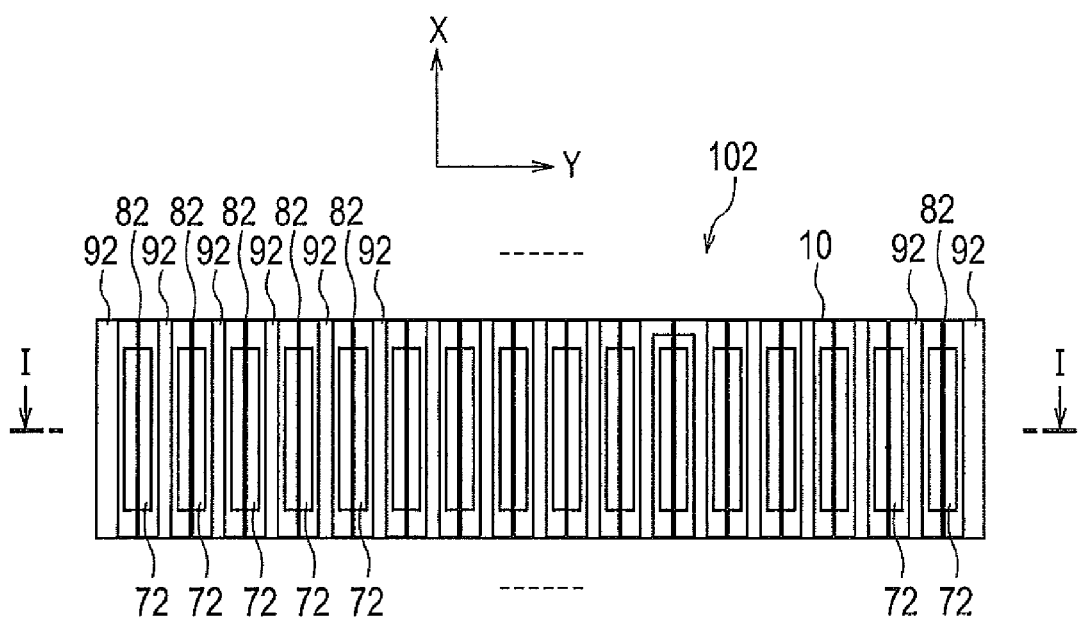
FIG. 80A shows a plane pattern configuration example of the LD bar of the nitride based semiconductor device according to the seventh embodiment of the present invention.
Figure 80B:
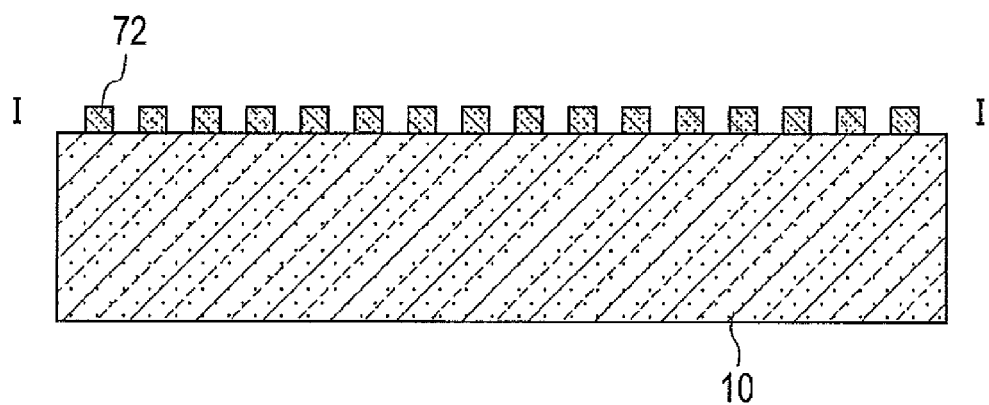
FIG. 80B shows an example of section structure taken in the line I-I of FIG. 80A.

In the plane pattern configuration example of the LD bar 102 of the nitride based semiconductor device according to the seventh embodiment shown in FIG. 80A, an example of section structure taken in the line I-I is expressed as shown in FIG. 80B. The LD bar 102 of the nitride based semiconductor device according to the seventh embodiment forms the etching region 92 which removes the n-type GaN based cladding layer 14 including Al in the direction in parallel of X for the extension direction of the laser cavity 82, on the chip. Accordingly, in the LD bar shape where the chip is located in a line with array form in the direction vertical of Y to the direction of X, since the n-type GaN based cladding layer 14 including Al is not continuing in the direction of Y, as shown in FIG. 80B, the curvature of the LD bar 102 is alleviated.

According to the nitride based semiconductor device according to the seventh embodiment, the curvature by the stress of the nitride based semiconductor device can be alleviated, and the yield can be improved.

Other Embodiments

The present invention has been described by the first through seventh embodiments, as a disclosure including associated description and drawings to be construed as illustrative, not restrictive. With the disclosure, artisan might easily think up alternative embodiments, embodiment examples, or application techniques.

Such being the case, the present invention covers a variety of embodiments, whether described or not.

INDUSTRIAL APPLICABILITY

According to the present invention, a nitride based semiconductor device is applicable to blue-violet laser diodes (LDs), multi-wavelength LDs, and it is applicable to varieties of medical application fields, bio-related engineering appliances, high density storage medium, image processing fields, measuring appliances, and full color displays etc.

REFERENCE SIGNS LIST

2: Sub-mount;
3, 4: Electrically conductive pin;
5, 6: Golden (Au) wire;
7: Heat sink;
10: GaN based semiconductor substrate;
12: N-type GaN based buffer layer;
14: N-type cladding layer;
16: N-type GaN based guide layer (n-type $Al_XIn_YGa_{1-X-Y}N$ (where 0<=X, 0<=Y, X+Y<=1) guide layer);
18: Active layer;
20: Nitride based semiconductor device;
22: P-type GaN based guide layer;
24: Insulating film;
25, 25a: Electron block layer;
26: P-type cladding layer;
26a: First p-type cladding layer;
26b: Second p-type cladding layer;
27: Stress relaxation layer;
28: P-type GaN based contact layer;
29: Resist layer;
30: P-side ohmic electrode;
32: P-side electrode;
40: N-side electrode;
42: Device placing unit;
44: Target;
46: Evacuation unit;
48: Magnet;
50, 52: Oxygen absorption layer;
54: Coating film without consideration for optical absorption;
54: Insulating film deposition apparatus;
56: ECR plasma;
58: Microwave plasma introductory unit;
60: Rear end face protection film;
62: DBR film;
62a: $ZrO_2$ film;
62b: $SiO_2$ film;
70: Nitride based semiconductor laser main unit;
72: P-side common electrode;
80: Laser stripe;
82: Laser cavity;
90: Absorption medium;
92: Etching region;
100: Emitting end surface of laser beam;
102: LD (Laser Diode) bar;
110: Semiconductor wafer;
120, 140: Protection film; and
130: Adhesive layer.

The invention claimed is:

1. A nitride based semiconductor device comprising:
an n-type cladding layer;
an n-type GaN based guide layer placed on the n-type cladding layer;
an active layer placed on the n-type GaN based guide layer;
a p-type GaN based guide layer placed on the active layer;
an electron blocking layer placed on the p-type GaN based guide layer;
a stress relaxation layer placed on the electron blocking layer; and
a p-type cladding layer placed on the stress relaxation layer;
wherein a stress accompanying a lattice constant mismatching of GaAlN/GaN occurring in an interface between the electron blocking layer and the p-type GaN based guide layer is distributed to an inside of the electron blocking layer and both sides of the p-type GaN based guide layer and the stress relaxation layer by forming the stress relaxation layer.

2. The nitride based semiconductor device according to claim 1, wherein the stress relaxation layer is composed of an $In_xGa_{1-x}N$ layer (where $0<=x<=1$).

3. The nitride based semiconductor device according to claim 1, wherein the electron blocking layer is composed of an $Al_yGa_{1-y}N$ layer (where $0<y<=1$).

4. The nitride based semiconductor device according to claim 3, wherein an Al composition ratio y of the electron blocking layer changes continuously as to shift to an interface which contacts the stress relaxation layer from an interface which contacts the p-type GaN based guide layer.

5. The nitride based semiconductor device according to claim 4, wherein the Al composition ratio rises linearly substantially.

6. The nitride based semiconductor device according to claim 1, wherein the Al composition ratio y of the electron blocking layer is substantially constant along a thickness direction thereof.

7. A nitride based semiconductor device, comprising:
an n-type cladding layer;
an n-type GaN based guide layer placed on the n-type cladding layer;
an active layer placed on the n-type GaN based guide layer;
a p-type GaN based guide layer placed on the active layer;
an electron blocking layer placed on the p-type GaN based guide layer; and
a p-type cladding layer placed on the electron blocking layer;
wherein an Al composition ratio y of the electron blocking layer changes continuously to shift to an interface that contacts the p-type cladding layer from an interface that contacts the p-type GaN based guide layer, and thereby a stress accompanying a lattice constant mismatching of GaAlN/GaN occurring in an interface between the electron blocking layer and the p-type GaN based guide layer is absorbable inside the electron blocking layer.

* * * * *